United States Patent
De et al.

(10) Patent No.: US 7,727,705 B2
(45) Date of Patent: Jun. 1, 2010

(54) HIGH ETCH RESISTANT UNDERLAYER COMPOSITIONS FOR MULTILAYER LITHOGRAPHIC PROCESSES

(75) Inventors: Binod B. De, Attleboro, MA (US); Sanjay Malik, Attleboro, MA (US); Raj Sakamuri, Sharon, MA (US); Chisun Hong, Warwick, RI (US)

(73) Assignee: Fujifilm Electronic Materials, U.S.A., Inc., North Kingstown, RI (US)

( * ) Notice: Subject to any disclaimer, the term of this patent is extended or adjusted under 35 U.S.C. 154(b) by 323 days.

(21) Appl. No.: 12/033,915

(22) Filed: Feb. 20, 2008

(65) Prior Publication Data

US 2008/0206667 A1 Aug. 28, 2008

Related U.S. Application Data

(60) Provisional application No. 60/903,223, filed on Feb. 23, 2007.

(51) Int. Cl.
| | |
|---|---|
| G03F 7/09 | (2006.01) |
| G03F 7/20 | (2006.01) |
| G03F 7/30 | (2006.01) |
| G03F 7/36 | (2006.01) |
| G03C 1/76 | (2006.01) |

(52) U.S. Cl. .................. 430/270.1; 430/271.1; 430/313; 430/325; 430/327; 430/330; 430/905

(58) Field of Classification Search .................. None
See application file for complete search history.

(56) References Cited

U.S. PATENT DOCUMENTS

| | | | |
|---|---|---|---|
| 5,488,182 A | 1/1996 | Kobayashi et al. | 568/660 |
| 5,854,349 A | 12/1998 | Abe et al. | |
| 6,265,506 B1 | 7/2001 | Goodall et al. | 526/172 |
| 6,291,131 B1 | 9/2001 | Jung et al. | |
| 6,323,287 B1 | 11/2001 | Foster et al. | |
| 6,610,808 B2 | 8/2003 | De et al. | |
| 6,800,416 B2 * | 10/2004 | Kudo et al. | 430/270.1 |
| 2002/0007018 A1 | 1/2002 | Foster et al. | 525/328.8 |
| 2002/0022196 A1 | 2/2002 | Pavelchek et al. | 430/311 |
| 2002/0052454 A1 | 5/2002 | Lipian et al. | |
| 2002/0058204 A1 | 5/2002 | Khojasteh et al. | 430/270.01 |
| 2002/0128408 A1 | 9/2002 | Goodall et al. | 526/171 |
| 2003/0018153 A1 | 1/2003 | Jayaraman et al. | 526/281 |
| 2003/0180656 A1 | 9/2003 | Matsuzawa | |
| 2004/0034155 A1 | 2/2004 | Sugita et al. | 524/543 |
| 2005/0215713 A1 | 9/2005 | Hessell et al. | 525/162 |
| 2005/0238997 A1 | 10/2005 | De et al. | 430/281.1 |
| 2005/0282091 A1 | 12/2005 | Hatakeyama | 430/323 |

OTHER PUBLICATIONS

International Search Report dated Sep. 15, 2008 to the corresponding National Patent Appl. PCT/US08/54528.

* cited by examiner

Primary Examiner—Sin J. Lee
(74) Attorney, Agent, or Firm—Ohlandt, Greeley, Ruggiero & Perle, L.L.P.

(57) ABSTRACT

An etch resistant thermally curable Underlayer for use in a multplayer liyhographic process to produce a photolithographic bilayer coated substrate, the composition having:

(a) at least one cycloolefin polymer comprising at least one repeating unit of Structure (I), and at least one repeating unit of Structure (II), and optionally at least one repeating unit of Structure (III) with the proviso that neither Structure (I) nor Structure (II) nor Structure (III) contains acid sensitive groups.

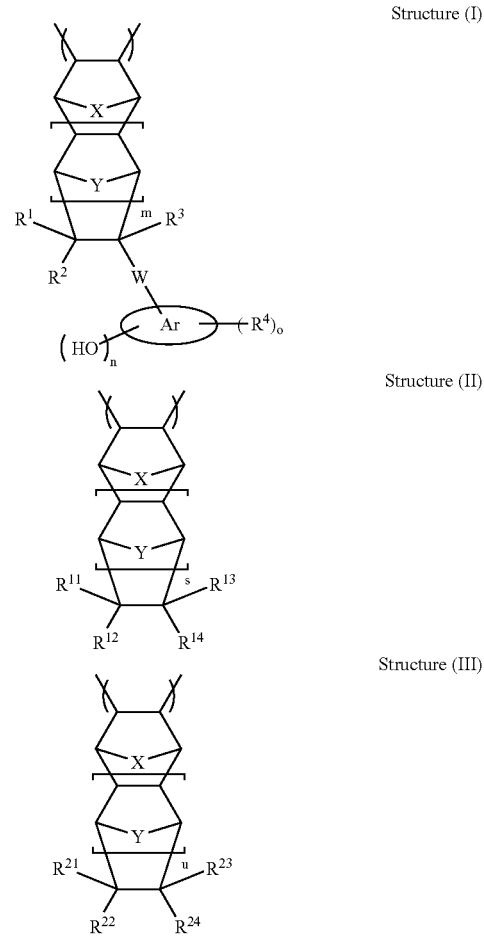

b) at least one cross-linking agent selected from the group consisting of an amino or phenolic cross-linking agent;
c) a least one thermal acid generator (TAG);
d) at lest one solvent; and
e) optionally, at least one surfactant.

18 Claims, No Drawings

HIGH ETCH RESISTANT UNDERLAYER COMPOSITIONS FOR MULTILAYER LITHOGRAPHIC PROCESSES

RELATED APPLICATIONS

This application claims priority from Provisional Patent Application No. 60/903,223 filed Feb. 23, 2007.

FIELD OF THE DISCLOSURE

The present disclosure relates to bilayer lithography used in semiconductor devices and more particularly to high etch resistant underlayer compositions for chemically amplified bilayer resist systems.

BACKGROUND OF THE DISCLOSURE

Microelectronic industries, as well as other related industries are constantly reducing the feature size for constructing microscopic structures. Effective lithographic techniques are essential in this quest and require constantly improved radiation sensitive materials (resists). In order to resolve smaller structures, the wavelength of the exposing light has been reduced into the deep UV regions of 248 nm, 193 nm and 157 nm in addition to exposure to EUV or x-ray radiation. As the patterns and wavelengths become finer, the material properties of the resists used for pattern delineation have become more and more demanding. In particular, requirements of sensitivity, transparency, aesthetics of the image produced, and the selectivity of the resists to etch conditions for pattern transfer become more and more strenuous.

Advanced resists usually employ a technique called chemical amplification in which an acid generated by photolysis catalyzes a solubility switch from alkali insoluble to alkali soluble by removal of an acid sensitive (acid cleavable) group protecting an alkali-solubilizing moiety. The principle of chemical amplification as a basis for resist operation has been known for some years (see U.S. Pat. No. 4,491,628). Most chemically amplified resists have been designed around the use of acid sensitive carboxylic esters or acid sensitive hydroxystyrene derivatives.

However, chemically amplified resist systems have many shortcomings. One problem is standing wave effects, which occur when monochromatic light is reflected off the surface of a reflective substrate during exposure. These standing waves are variations of light intensity in the photoresist film dependent on photoresist film thickness caused by constructive and destructive interference of monochromatic light due to reflection. This in turn reduces resolution and causes line width variations. These line width changes are particularly troublesome for ever shrinking features. For example, standing waves in a positive photoresist have a tendency to result in footing at the photoresist/substrate interface reducing the resolution of the photoresist. CD variations can be controlled by tightly controlling the photoresist thickness variation. However, this is difficult to do when the photoresist has to cover steps in the substrate topography. Patterning over substrate topography can also cause localized reflections, which result in areas of the photoresist to be over or underexposed. This reflective notching results in localized line width variations.

In addition, chemically amplified resist profiles and resolution may change due to substrate poisoning. This effect occurs, particularly, when the substrate has a nitride layer. It is believed that residual N—H bonds in the nitride film deactivate the acid at the nitride/resist interface. For a positive resist, this results in an insoluble area, and either resist scumming, or a foot at the resist/substrate interface.

Furthermore, lithographic aspect ratios require the chemically amplified resist layer be thin, e.g., about 500 nm or lower, to print sub 180 nm features. This in turn requires the resist to have excellent plasma etch resistance such that resist image features can be transferred down into the underlying substrate. However, in order to decrease absorbance of the chemically amplified photoresists, aromatic groups, such as those in novolaks had to be removed, which in turn decreased the etch resistance.

The most common type of resists are called "single layer" resists (SLR). When employing light to expose, these resists utilize highly absorbing thin anti-reflective coatings (ARCs) to minimize standing wave effects. These anti-reflective coatings also mitigate problems with substrate poisoning if they are applied between the substrate and the photoresist.

In SLR systems a resist has the dual function of imaging and plasma etch resistance. Therefore, distinct performance tradeoffs have to be made between lithographic properties of the resist like absorbance, image profiles, resolution and substrate plasma etch resistance. For example in a typical dielectric mask open the resist is required to withstand an oxygen plasma etch to open up the ARC layer and a subsequent substrate etch. A significant amount of photoresist is lost during the ARC etch process as the etch selectivity between resist and ARC is only about 1:1. This requires the ARC to be as thin as possible to retain a sufficient photoresist film thickness for the substrate etch. Therefore, these ARCs must have relatively high absorbance (k-values) at the actinic wavelength in order to be effective in preventing substrate reflection.

Another approach is the utilization of a bilayer resist (BLR) system. A BLR system consists of a substrate coated with a first thick layer of Underlayer (UL) film followed by a second thin layer of dried resist (imaging layer or IL). The Underlayer film is etched in an oxygen rich plasma environment with the IL functioning as an etch mask. The typical imaging layer consists of a dried, chemically amplified, silicon containing resist. The silicon in the IL converts to silicon dioxide during the oxygen plasma etch of the UL, thus giving the IL the needed etch selectivity to the UL. The Underlayer film then acts as a etch resistant mask for substrate etching using non-oxygen or low-oxygen plasma etch chemistries, for removal of the underlying substrate.

Similar to the ARC in SLR, the Underlayer film in BLR should be optimally designed to absorb most of the deep UV light, which attenuates standing wave effects. In addition, the Underlayer film prevents deactivation of the acid catalyst at the resist/substrate interface. However, in the BLR system it is the Underlayer film that is the primarily etch mask for the substrate etch. Hence, Underlayer films incorporate polymers with functional groups to provide etch selectivity. The resist doesn't have the dual function to provide imaging and plasma etch resistance. Thus the resist can be thin compared to the SLR system and its lithographic properties do not have to be compromised. In addition, the Underlayer composition is applied to the substrate to produce an Underlayer film at about 2 to 5 times the thickness of a typical ARC layer. This helps substantially in planarizing the substrate prior to the next imaging step. Therefore the above mentioned reflectivity problems due to substrate topography as well as resist thickness uniformity problems have been improved.

Even though the underlayer film attenuates standing waves and substrate poisoning, it poses other problems. First, some underlayers are soluble to the chemical amplified resist solvent component. If there is intermixing between the resist when applied and the underlayer, the resolution and sensitivity of the imaging layer will be detrimentally affected.

The refractive index (N) is a complex number, N=n−ik, where n is the "real" part of the refractive index, and ik the imaginary part of the refractive index. k is related to the absorption coefficient as a function of wavelength, $\alpha(\lambda)$, by $k=\lambda\alpha/(4\pi)$. If there is a large difference in the index of refraction between the chemically amplified resist and the underlayer film, light will reflect off the underlayer film which causes standing wave effects in the resist. Thus, the real portion "n" of the index of refraction of the two layers must be made to essentially match or to have their differences minimized, and the imaginary portion "k" of the index of refraction of the two layers must be optimized to minimize reflectivity effects. This optimization is important to minimize residual reflectivity from the UL/IL interface. Thus, when selecting the appropriate k-value a trade-off must be made between suppression of substrate reflectivity and reflectivity from the UL/IL interface. k-values in the UL can be low compared to ARCs because ULs are employed at a much higher film thickness. This results in low UL/IL interface reflectivity. ARCs on the other hand need to be thin because of poor etch selectivity to the photoresist and in order to control substrate reflectivity they need to be highly absorbing.

Another problem with underlayers is that they are sometimes too absorbent because of incorporation of aromatic groups. Some semiconductor manufacturing deep UV exposure tools utilize the same wavelength of light to both expose the photoresist and to align the exposure mask to the layer below the resist. If the underlayer is too absorbent, the reflected light needed for alignment is too attenuated to be useful. However, if the underlayer is not absorbent enough, standing waves may occur. A formulator must balance these competing objectives.

In addition, the underlayer film must be compatible with at least one edge bead remover acceptable to the semiconductor industry as well as give excellent compatibility with the resist coated over the underlayer film so that lithographic performance (e.g. photospeed, wall profiles, depth of focus, adhesion, etc.) are not adversely impacted.

Furthermore, some underlayers require UV exposure in order to form cross-links before the radiation sensitive resist can be applied to form the imaging layer. The problem with UV cross-linking underlayers is that they require long exposure times to form sufficient cross-links. The long exposure times severely constrain throughput and add to the cost of producing integrated circuits. The UV tools also do not provide uniform exposure so that some areas of the underlayer may be cross-linked more than other areas of the underlayer. In addition, UV cross-linking exposure tools are very expensive and are not included in most resist coating tools because of expense and space limitations.

Some underlayers are cross-linked by heating. However, the problem with some of these underlayers is that they require high curing temperatures and long curing times before the resist for the imaging layer can be applied. In order to be commercially useful, underlayers should be curable at temperatures below 250° C. and for a time less than 180 seconds. After curing, the underlayer film should have a high glass transition temperature to withstand subsequent high temperature processing and not intermix with the resist layer.

Even at temperatures below 250° C. sublimation of small amounts of the underlayer film components (e.g. TAGs, oligomers from the polymer, etc.) or products (e.g. acids, alcohols, water) from the thermal curing frequently occur. This can result in contamination of the equipment, which requires more frequent cleaning or replacement of equipment to avoid loss of product yield and other measures. This results in increased costs and is undesirable.

In certain applications, it is desirable for the underlayer film to planarize the surface of the substrate. However, this may be difficult to accomplish with underlayer films undergoing thermal crosslinking. As the temperature rises and the number of crosslinks increase, the glass transition temperature of the film increases. This makes it more difficult for the film to flow and planarize the substrate. Thus it is desirable to use as low a molecular weight material as possible to improve the planarization. However, use of lower molecular weight polymers in the underlayer film can adversely impact the lithographic performance of the resist imaging process.

In addition to the requirements for no intermixing, no sublimation, EBR compatibility, good planarization properties, and optical properties appropriately complementing the resist coated over the underlayer film, underlayer films need to have good etch resistance to allow the pattern transfer into the underlying substrate. While novolak or p-hydroxystyrene (PHS) based polymers show good etch resistance to various plasma sources, these materials absorb very strongly at 193 nm and their $k(\lambda=193\text{ nm})$ value is as high as 0.64. (Proc SPIE 2001, 4345, p 50 and EP Patent No. 0542008). Conversely, acrylate-based polymers possess good optical transparency at 193 nm but suffer from poor etch resistance. Solutions for these issues individually frequently adversely impact the performance in other areas. U.S. Pat. No. 6,610,808 (De et al.) describes a polymer for use in an underlayer film in a BLR system incorporating polar groups to improve EBR compatibility. US Patent application 2005/0238997 (De et al.) describes a polymer system with decreased sublimation tendencies and optimized MW ranges for the same use. However, these acrylic based underlayer film materials need improved plasma etch resistance for certain applications.

Cycloolefin polymers offer better transparency at 193 nm compared to novolaks and PHS-based materials. U.S. Pat. No. 6,136,499 discloses that cycloolefin polymer systems exhibit etch resistance superior to even some aromatic systems. However, it is not obvious how to employ these materials as an underlayer film and obtain all of the required properties of an underlayer film at the same time.

SUMMARY OF THE DISCLOSURE

The present disclosure is directed to thermally curable polymer compositions employing cycloolefin polymers with aromatic pendant groups to control optical absorbance and provide excellent etch resistance and film forming properties.

The object of the present disclosure is to provide high etch resistant thermally curable Underlayer compositions with tunable absorbance for multilayer lithographic processes. This is accomplished by providing a cycloolefin polymer with absorbing and non- or low-absorbing structural units as the polymer binder for the Underlayer composition.

Therefore, one aspect of the present disclosure is directed to a novel etch resistant thermally curable Underlayer composition comprising:

(a) at least one cycloolefin polymer comprising at least one repeating unit of Structure (I), and at least one repeating unit of Structure (II), and optionally at least one repeating unit of Structure (III) with the proviso that neither Structure (I) nor Structure (II) nor Structure (III) contains acid sensitive groups

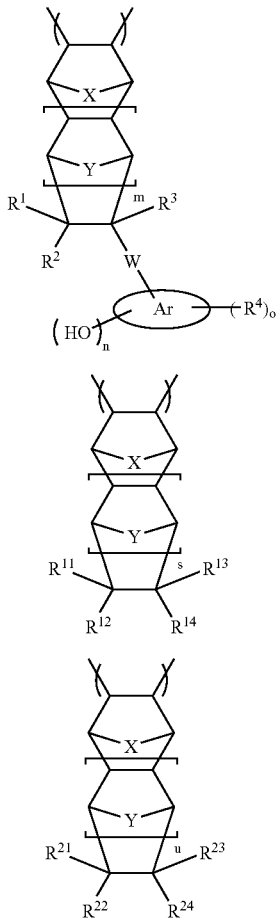

Structure (I)

Structure (II)

Structure (III)

wherein $R^1$, $R^2$ and $R^3$ independently represent a hydrogen atom, a $C_1$-$C_{10}$ linear, branched or cyclic alkyl group, a $C_1$-$C_{10}$ partially or completely halogenated linear, branched or cyclic alkyl group, a $C_6$-$C_{10}$ aryl group, a halogen atom or a polar group; W is a single bond, —O—, —S—, substituted or unsubstituted $C_1$-$C_{10}$ linear or branched alkylene group, substituted or unsubstituted $C_4$-$C_{12}$ cycloalkylene or alicyclic residue, —$(CH_2)_pO$—, —$(CH_2)_pO(CH_2)_q$—, —$(CH_2)_p$ $O(R^5O)_r$—, —$(CH_2)_pC(=O)O$—, —$(CH_2)_pC(=O)O$ $(CH_2)_q$—, —$(CH_2)_pC(=O)O(R^5O)_r$—, —$(CH_2)_pOC$ $(=O)O(CH_2)_p$—, —$(CH_2)_pNR^6C(=O)$—, wherein $R^5$ is a $C_2$-$C_6$ linear, branched or cyclic alkylene group or $C_2$-$C_6$ partially or completely halogenated linear, branched or cyclic alkylene group; $R^6$ is a hydrogen atom, a $C_1$-$C_6$ linear, branched or cyclic alkyl group or a $C_1$-$C_6$ partially or completely halogenated linear, branched or cyclic alkyl group; p is an integer from 0 to about 4; q and r are independently an integer from about 1 to about 4; Ar is a $C_6$-$C_{20}$ arylene group or a B-L-E group, wherein B is a $C_6$-$C_{14}$ arylene group, E is a $C_6$-$C_{14}$ aryl group and L can be a single bond, a $C_1$-$C_4$ linear, branched or cyclic alkylene group, a $C_1$-$C_4$ partially or completely halogenated linear, branched or cyclic alkylene group, —S—, —O—, —C(=O)—, —C(=O)O—, —O—C(=O)—O—, —C($R^7R^8$)—, —C(=C$R^9R^{10}$)— or —C$R^9$=C$R^{10}$—, wherein $R^7$, $R^8$, $R^9$ and $R^{10}$ are independently a hydrogen atom, a halo-gen, a cyano group, a $C_1$-$C_{10}$ linear, branched or cyclic alkyl group or a $C_1$-$C_{10}$ partially or completely halogenated linear, branched or cyclic alkyl group; $R^4$ groups are independently $C_1$-$C_6$ linear, branched or cyclic alkyl groups, $C_1$-$C_6$ partially or completely halogenated linear, branched or cyclic alkyl groups or halogen atoms; n is an integer from about 1 to about 5; o is an integer from 0 to about 6; X and Y are, independently, a —$CH_2$— group, —O— or —S— and m is an integer from 0 to about 3; $R^{11}$, $R^{12}$, $R^{13}$ and $R^{14}$ are independently a hydrogen atom, a $C_1$-$C_{10}$ linear, branched or cyclic alkyl group, a $C_1$-$C_{10}$ partially or completely halogenated linear, branched or cyclic alkyl group, a halogen atom or a polar group selected from the group consisting of —$OR^{15}$, —$R^{16}OR^{15}$, and —$(CH_2)_tOC(O)R^{17}$ with the proviso that at least one of $R^{11}$ to $R^{14}$ is a polar group selected from the group consisting of —$OR^{15}$, —$R^{16}OR^{15}$, and —$(CH_2)_tOC(O)R^{17}$; $R^{15}$ is a hydrogen atom or a linear, branched or cyclic $C_1$-$C_6$ alkyl group, $R^{16}$ is a substituted or unsubstituted $C_1$-$C_6$ linear, branched or cyclic alkylene group or $C_1$-$C_6$ partially or completely halogenated linear, branched or cyclic alkylene group, $R^{17}$ is a hydrogen atom, a linear, branched or cyclic $C_1$-$C_6$ alkyl group, or a $C_7$-$C_{15}$ alicyclic group; t is an integer from 0 to about 4; s is an integer from 0 to about 3; $R^{21}$, $R^{22}$, $R^{23}$ and $R^{24}$ are independently a hydrogen atom, a $C_1$-$C_{10}$ linear, branched or cyclic alkyl group, a $C_1$-$C_{10}$ partially or completely halogenated linear, branched or cyclic alkyl group, a $C_6$-$C_{10}$ aryl group which does not contain a hydroxyl group, a halogen atom or a polar group selected from the group consisting of —$(CH_2)_vC(O)R^{25}$, —$(CH_2)_vC(O)OR^{25}$, —$(CH_2)_vC$ $(O)(OR^{26})_xOR^{25}$ and —$O(R^{26}O)_xR^{25}$; wherein v is an integer from 0 to about 5; x is an integer from about 1 to about 5; $R^{25}$ represents a hydrogen atom, a substituted or unsubstituted $C_1$-$C_6$ linear, branched or cyclic alkyl group or a $C_1$-$C_6$ partially or completely halogenated linear, branched or cyclic alkyl group; $R^{26}$ is a substituted or unsubstituted $C_2$-$C_6$, linear, branched or cyclic alkylene group or a $C_2$-$C_6$ partially or completely halogenated linear, branched or cyclic alkylene group and u is an integer from 0 to about 3;

b) at least one amino or phenolic cross-linking agent;
c) at least one thermal acid generator (TAG);
d) at least one solvent; and
e) optionally, at least one surfactant.

The present disclosure also relates to a photolithographic bilayer coated substrate comprising: a substrate, a thermally cured film of the above described Underlayer composition (Underlayer film) coated on the substrate and a radiation-sensitive chemically amplified resist coated over the Underlayer film.

The disclosure further relates to a process for forming a pattern on a substrate which comprises the following process steps:

(a) providing a substrate;
(b) coating in a first coating step said substrate with a thermally curable Underlayer composition of this disclosure;
(c) curing said Underlayer composition to provide an Underlayer film;
(d) coating in a second coating step a radiation sensitive resist over the Underlayer film to produce a bilayer resist stack;
(e) baking the radiation sensitive resist in a second baking step;
(f) exposing the bilayer resist stack;

(g) developing a portion of the radiation sensitive resist of the bilayer resist stack and uncovering a portion of the underlying Underlayer film;
(h) rinsing the bilayer resist stack; and
(i) etching the uncovered Underlayer film in oxidizing plasma to produce a bilayer relief image.

DETAILED DESCRIPTION AND EMBODIMENTS

It is an object of this disclosure to provide a thermally curable polymer composition to be used to provide an Underlayer film for lithographic processes that has high etch resistant capability with tunable absorbance at 193 nm that is compatible with high performance lithographic imaging with high formulation latitude. In addition this thermally curable polymer composition needs to be compatible with solvents employed in commercial edge bead remover compositions and have a high enough glass transition temperature for improved dimensional stability during processing.

The term "acid sensitive group" is defined to mean a functional group which reacts more than 5 molar % in the presence of a carboxylic or sulfonic acid under bake conditions of up to 160° C. for a duration of up to 10 minutes to yield a new functional group that increases the polymer's solubility in aqueous alkali developer solutions.

The thermally curable polymer composition comprises a cycloolefin polymer, an amino or phenolic cross-linking agent, a thermal acid generator (TAG), and a solvent. When the composition is cast as a film and is heated, the thermal acid generator produces an acid that catalyzes the crosslinking reaction with the crosslinker. After sufficient crosslinking, the Underlayer film will be insoluble in the resist coating solvent.

Thermal acid generators are preferred for this Underlayer composition, although free acids could be used. However, free acids may shorten the shelf life of the Underlayer composition if the polymer crosslinks over time in solution. Conversely thermal acid generators are only activated when the Underlayer film is heated. Even though the Underlayer composition may comprise a cycloolefin polymer and crosslinking agent capable of crosslinking the cycloolefin polymer upon heating without a TAG, the addition of the thermal acid generator is preferred for enhanced crosslinking efficiency.

It is critical to the lithographic performance of the BLR system that the Underlayer film minimize reflective interference effects from both the substrate and the Underlayer film/imaging layer interface. This is accomplished by carefully tuning the optical properties of the Underlayer film to the imaging layer (IL). Both the "real" portion of the refractive index (n) and the "imaginary" portion of the refraction index (ik) are important. k has a positive correlation to the absorption of the material. A polymer needs: sufficiently high optical absorbance to prevent light to reflect back from the substrate into the imaging layer interface. The polymer also needs to have a closely matched refractive index n with the imaging layer in order to prevent light reflection from the Underlayer film/imaging layer. If the UL and IL have a closely matched n, the reflection of light from the Underlayer film is then in approximation proportional to $k^2$ of the Underlayer film. (See Neisser et al. Proc SPIE 2000, 4000, p 942-951 and U.S. Pat. Nos. 6,042,992 and 6,274,295). Thus, reducing k by a factor of two will reduce the reflectivity of the UL/IL interface by a factor of four. Therefore, the "imaginary" portion "k" of the index of refraction of the two layers must be optimized to minimize reflectivity effects from both, a reflecting substrate and the Underlayer film. Generally Underlayer films have relatively lower k-values than ARCs, but still provide low substrate reflectivity simply because they are coated at higher film thicknesses. These lower k values provide better suppression of light reflected from the UL/IL interface back into the IL. In addition, higher coating thicknesses of the Underlayer film compared to ARCs minimize variations in substrate reflectivity due to film thickness non-uniformity of the Underlayer film and also reduces variation in imaging layer thickness non-uniformity due to superior planarization. All of this minimizes the interference effects from the actinic light in the imaging layer and results in more stable lithographic processes.

Plasma and/or reactive ion etch (RIE) resistance is another critical parameter for the Underlayer film in bilayer applications in order to ensure efficient pattern transfer of the resist into the appropriate substrate. The proper absorptivity and substrate etch selectivity of the Underlayer films produced from the Underlayer film compositions of the present disclosure are obtained by carefully balancing the amounts and types of monomeric units, especially those containing aromatic pendent groups, into the cycloolefin polymer.

The Underlayer film compositions of the present disclosure comprise copolymers that comprise cycloolefin repeating units. These cycloolefin repeating units provide relatively high carbon to hydrogen ratios resulting in good plasma etch resistance. In addition, polymers prepared from cycloolefin monomers have good transparency at 193 nm and typically have high glass transition temperatures.

In one embodiment, the present disclosure is directed to a novel etch resistant thermally curable Underlayer composition comprising:

(a) at least one cycloolefin polymer comprising at least one repeating unit of Structure (I), and at least one repeating unit of Structure (II), and optionally at least one repeating unit of Structure (III) with the proviso that neither Structure (I) nor Structure (II) nor Structure (III) contains acid sensitive groups Structure (I)

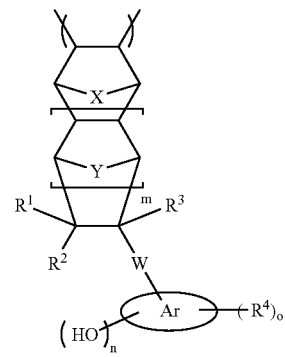

Structure (II)

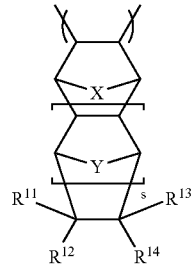

-continued

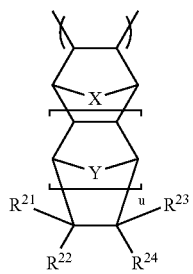

Structure (III)

wherein R¹, R² and R³ independently represent a hydrogen atom, a $C_1$-$C_{10}$ linear, branched or cyclic alkyl group, a $C_1$-$C_{10}$ partially or completely halogenated linear, branched or cyclic alkyl group, a $C_6$-$C_{10}$ aryl group, a halogen atom or a polar group; W is a single bond, —O—, —S—, substituted or unsubstituted $C_1$-$C_{10}$ linear or branched alkylene group, substituted or unsubstituted $C_4$-$C_{12}$ cycloalkylene or alicyclic residue, —$(CH_2)_pO$—, —$(CH_2)_pO(CH_2)_q$—, —$(CH_2)_p$ $O(R^5O)_r$—, —$(CH_2)_pC(=O)O$—, —$(CH_2)_pC(=O)O$ $(CH_2)_q$—, —$(CH_2)_pC(=O)O(R^5O)_r$—, —$(CH_2)_pOC$ $(=O)O(CH_2)_p$—, —$(CH_2)_pNR^6C(=O)$—, wherein R⁵ is a $C_2$-$C_6$ linear, branched or cyclic alkylene group or $C_2$-$C_6$ partially or completely halogenated linear, branched or cyclic alkylene group; R⁶ is a hydrogen atom, a $C_1$-$C_6$ linear, branched or cyclic alkyl group or a $C_1$-$C_6$ partially or completely halogenated linear, branched or cyclic alkyl group; p is an integer from 0 to about 4; q and r are independently an integer from about 1 to about 4; Ar is a $C_6$-$C_{20}$ arylene group or a B-L-E group, wherein B is a $C_6$-$C_{14}$ arylene group, E is a $C_6$-$C_{14}$ aryl group and L can be a single bond, a $C_1$-$C_4$ linear, branched or cyclic alkylene group, a $C_1$-$C_4$ partially or completely halogenated linear, branched or cyclic alkylene group, —S—, —O—, —C(=O)—, —C(=O)O—, —O—C(=O)—O—, —C(R⁷R⁸)—, —C(=CR⁹R¹⁰)— or —CR⁹=CR¹⁰—, wherein R⁷, R⁸, R⁹ and R¹⁰ are independently a hydrogen atom, a halogen, a cyano group, a $C_1$-$C_{10}$ linear, branched or cyclic alkyl group or a $C_1$-$C_{10}$ partially or completely halogenated linear, branched or cyclic alkyl group; R⁴ groups are independently $C_1$-$C_6$ linear, branched or cyclic alkyl groups, $C_1$-$C_6$ partially or completely halogenated linear, branched or cyclic alkyl groups or halogen atoms; n is an integer from about 1 to about 5; o is an integer from 0 to about 6; X and Y are, independently, a —$CH_2$— group, —O— or —S— and m is an integer from 0 to about 3; R¹¹, R¹², R¹³ and R¹⁴ are independently a hydrogen atom, a $C_1$-$C_{10}$ linear, branched or cyclic alkyl group, a $C_1$-$C_{10}$ partially or completely halogenated linear, branched or cyclic alkyl group, a halogen atom or a polar group selected from the group consisting of —OR¹⁵, —R¹⁶OR¹⁵, and —$(CH_2)_tOC(O)R^{17}$ with the proviso that at least one of R¹¹ to R¹⁴ is a polar group selected from the group consisting of —OR¹⁵, —R¹⁶OR¹⁵, and —$(CH_2)_tOC(O)R^{17}$; R¹⁵ is a hydrogen atom or a linear, branched or cyclic $C_1$-$C_6$ alkyl group, R¹⁶ is a substituted or unsubstituted $C_1$-$C_6$ linear, branched or cyclic alkylene group or $C_1$-$C_6$ partially or completely halogenated linear, branched or cyclic alkylene group, R¹⁷ is a hydrogen atom, a linear, branched or cyclic $C_1$-$C_6$ alkyl group, or a $C_7$-$C_{15}$ alicyclic group; t is an integer from 0 to about 4; s is an integer from 0 to about 3; R²¹, R²², R²³ and R²⁴ are independently a hydrogen atom, a $C_1$-$C_{10}$ linear, branched or cyclic alkyl group, a $C_1$-$C_{10}$ partially or completely halogenated linear, branched or cyclic alkyl group, a $C_6$-$C_{10}$ aryl group which does not contain a hydroxyl group, a halogen atom or a polar group selected from the group consisting of —$(CH_2)_vC(O)R^{25}$, —$(CH_2)_vC(O)OR^{25}$, —$(CH_2)_vC$ $(O)(OR^{26})_xOR^{25}$ and —$O(R^{26}O)_xR^{25}$; wherein v is an integer from 0 to about 5; x is an integer from about 1 to about 5; R²⁵ represents a hydrogen atom, a substituted or unsubstituted $C_1$-$C_6$ linear, branched or cyclic alkyl group or a $C_1$-$C_6$ partially or completely halogenated linear, branched or cyclic alkyl group; R²⁶ is a substituted or unsubstituted $C_2$-$C_6$, linear, branched or cyclic alkylene group or a $C_2$-$C_6$ partially or completely halogenated linear, branched or cyclic alkylene group and u is an integer from 0 to about 3;

b) at least one amino or phenolic cross-linking agent;
c) at least one thermal acid generator (TAG);
d) at least one solvent; and
e) optionally, at least one surfactant.

When the composition is heated, the thermal acid generator creates an acid that protonates the polyfunctional amino or phenolic cross-linking agent resulting in a very strong electrophilic group. This group reacts with a hydroxyl group on the cycloolefin polymer and forms a cured cross-linked polymer matrix.

The polymer comprises a repeating unit represented by Structure (I)

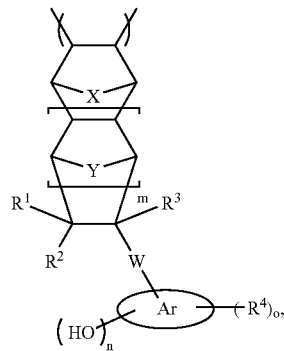

Structure (I)

subject to the proviso that Structure (I) does not contain an acid sensitive group, wherein R¹, R² and R³ independently represent a hydrogen atom, a $C_1$-$C_{10}$ linear, branched or cyclic alkyl group, a $C_1$-$C_{10}$ partially or completely halogenated linear, branched or cyclic alkyl group, a $C_6$-$C_{10}$ aryl group, a halogen atom or a polar group; W is a single bond, —O—, —S—, substituted or unsubstituted $C_1$-$C_{10}$ linear or branched alkylene group, substituted or unsubstituted $C_4$-$C_{12}$ cycloalkylene or alicyclic residue, —$(CH_2)_pO$—, —$(CH_2)_pO$ $(CH_2)_q$—, —$(CH_2)_pO(R^5O)_r$—, —$(CH_2)_pC(=O)O$—, —$(CH_2)_pC(=O)O(CH_2)_q$—, —$(CH_2)_pC(=O)O(R^5O)_r$—, —$(CH_2)_pOC(=O)O(CH_2)_p$—, $(CH_2)_pNR^6C(=O)$—, wherein R⁵ is a $C_2$-$C_6$ linear, branched or cyclic alkylene group or $C_2$-$C_6$ partially or completely halogenated linear, branched or cyclic alkylene group; R⁶ is a hydrogen atom, a $C_1$-$C_6$ linear, branched or cyclic alkyl group or a $C_1$-$C_6$ partially or completely halogenated linear, branched or cyclic alkyl group; p is an integer from 0 to about 4; q and r are independently an integer from about 1 to about 4; Ar is a $C_6$-$C_{20}$ arylene group or a B-L-E group, wherein B is a $C_6$-$C_{14}$ arylene group, E is a $C_6$-$C_{14}$ aryl group and L can be a single bond, a $C_1$-$C_4$ linear, branched or cyclic alkylene group, a $C_1$-$C_4$ partially or completely halogenated linear, branched or cyclic alkylene group, —S—, —O—, —C(=O)—, —C(=O)O—, —O—C(=O)—O—, —C($R^7R^8$)—, —C(=$CR^9R^{10}$)— or —$CR^9$=$CR^{10}$—, wherein $R^7$, $R^8$, $R^9$ and $R^{10}$ are independently a hydrogen atom, a halogen, a cyano group, a $C_1$-$C_{10}$ linear, branched or cyclic alkyl group or a $C_1$-$C_{10}$ partially or completely halogenated linear, branched or cyclic alkyl group; $R^4$ groups are independently $C_1$-$C_6$ linear, branched or cyclic alkyl groups, $C_1$-$C_6$ partially or completely halogenated linear, branched or cyclic alkyl groups or halogen atoms; n is an integer from about 1 to about 5; o is an integer from 0 to about 6; X and Y are, independently, a —$CH_2$— group, —O— or —S— and m is an integer from 0 to about 3. Methylene is the preferred X and Y bridging group.

Preferred $R^1$, $R^2$ and $R^3$ groups include hydrogen atoms, halogen atoms, $C_1$-$C_2$ alkyl groups or $C_1$-$C_2$ partially or completely halogenated alkyl groups. More preferred $R^1$, $R^2$ and $R^3$ groups include hydrogen atoms, halogen atoms or ethyl groups. Most preferred $R^1$, $R^2$ and $R^3$ groups are hydrogen atoms. Suitable examples of $R^1$, $R^2$ and $R^3$ include, but are not limited to, a hydrogen atom, methyl, ethyl, propyl, butyl, hexyl, cyclohexyl, nonyl, chloro, fluoro, trifluoromethyl, pentafluoroethyl, cyano and phenyl. The preferred examples of $R^1$, $R^2$ and $R^3$ include, but are not limited to, a hydrogen atom, methyl, chloro and fluoro.

Preferred W connecting groups are a single bond, —O—, —S—, $C_1$-$C_6$ linear, branched or cyclic alkylene groups, —($CH_2$)$_p$O—, —($CH_2$)$_p$O($CH_2$)$_q$—, —($CH_2$)$_p$C(=O)O—, —($CH_2$)$_p$C(=O)O($CH_2$)$_q$— and —($CH_2$)$_p$$NR^6$C(=O)—. More preferred W connecting groups are single bonds, —O—, $C_1$-$C_4$ linear, branched or cyclic alkylene groups, —($CH_2$)$_p$O— groups, —($CH_2$)$_p$O($CH_2$)$_q$— groups and —($CH_2$)$_p$C(=O)O— groups. The most preferred connecting groups W are single bonds and $C_1$-$C_4$ linear, branched or cyclic alkylene groups. Suitable examples of W include, but are not limited to, a single bond, —O— or —S— atom, methylene, ethylene, propylene, butylene, cyclohexylene, adamantylene, —$CH_2$O—, —$CH_2OCH_2$—, —$CH_2OCH_2CH_2$—, —$CH_2OCH_2CH_2O$—, —$CH_2O$($CH_2CH_2$)$_2$O—, —$CH_2$C(=O)O—, —$CH_2$C(=O)$OCH_2$—, —$CH_2$C(=O)O($CH_2CH_2$O)—, —$CH_2$C(=O)$OCH_2$—, —$CH_2$NHC(=O)—, —$CH_2$$NCH_3$C(=O)— and the like. Preferred examples for W include, but are not limited to, a single bond, —O—, methylene, ethylene, propylene, butylene, cyclohexylene, —$CH_2$O—, —$CH_2OCH_2$—, —$CH_2$NHC(=O)—, $CH_2$C(=O)$OCH_2$—, and —$CH_2$C(=O)O—. The more preferred examples of W include, but are not limited to, a single bond, —O—, methylene, ethylene, propylene, butylene —$CH_2$O—, —($CH_2$)O($CH_2$)— and —$CH_2$C(=O)O—. The most preferred examples of W include, but are not limited to, a single bond and methylene.

$R^5$ is preferably a $C_2$-$C_6$ linear or branched alkylene group. Suitable examples of $R^5$ groups include, but are not limited to, ethylene, propylene, isopropylene, butylene, pentylene, hexylene, cyclohexylene, tetrafluoroethylene and the like. Preferred examples of $R^5$ include, but are not limited to, ethylene and isopropylene.

$R^6$ is preferably a hydrogen atom or a $C_1$-$C_6$ alkyl group. Suitable examples of $R^6$ groups include, but are not limited to, a hydrogen atom, methyl, ethyl, propyl, butyl, pentyl, hexyl, cyclohexyl, trifluoromethyl and the like.

Suitable Ar groups are $C_6$-$C_{20}$ arylene groups and B-L-E groups. Preferred Ar groups are $C_6$-$C_{14}$ arylene groups and B-L-E groups. More preferred Ar groups are $C_6$-$C_{10}$ arylene groups. If a B-L-E group is employed the preferred B groups are substituted or unsubstituted $C_6$-$C_{10}$ arylene groups and preferred E groups are substituted or unsubstituted $C_6$-$C_{10}$ aryl groups. More preferred B groups are substituted or unsubstituted $C_6$-$C_{10}$ arylene groups and more preferred E groups are substituted or unsubstituted $C_6$-$C_{10}$ aryl groups. The most preferred B groups are substituted or unsubstituted phenylene groups and the most preferred E groups are substituted or unsubstituted phenyl groups. Suitable examples of B include, but are not limited to, substituted or unsubstituted phenylene and naphthylene groups. Suitable examples of E include, but are not limited to, substituted or unsubstituted phenyl and naphthyl groups.

Preferred connecting groups L include single bonds, —O—, $C_1$-$C_2$ alkylene groups, $C_1$-$C_2$ partially or completely halogenated alkylene groups, —C(=O)—, —C(=O)O—, —C($R^7R^8$)—, —C(=$CR^9R^{10}$)— or —$CR^9$=$CR^{10}$— groups. More preferred connecting groups L are a single bond, —O—, a $C_1$-$C_2$ alkylene group, a $C_1$-$C_2$ partially or completely halogenated alkylene group, and —C($R^7R^8$)—, —C(=$CR^9R^{10}$)— or —$CR^9$=$CR^{10}$— groups. The most preferred connecting groups L are a single bond or methylene. Preferred $R^7$, $R^8$, $R^9$ and $R^{10}$ groups are independently hydrogen atoms, $C_1$-$C_6$ linear, branched or cyclic alkyl groups, partially or completely halogenated $C_1$-$C_6$ linear, branched or cyclic alkyl groups or cyano groups. More preferred $R^7$, $R^8$, $R^9$ and $R^{10}$ groups include hydrogen atoms, $C_1$-$C_2$ alkyl groups or $C_1$-$C_2$ partially or completely halogenated alkyl groups. Suitable examples of $R^7$, $R^8$, $R^9$ and $R^{10}$ include, but are not limited to, a hydrogen atom, methyl, ethyl, propyl, butyl, hexyl, nonyl, cyclohexyl, chloro, fluoro, trifluoromethyl, pentafluoroethyl, cyano and the like. Preferred examples of $R^7$, $R^8$, $R^9$ and $R^{10}$ include, but are not limited to, a hydrogen atom, methyl, trifluoromethyl and cyano. Suitable examples of connecting group L include, but are not limited to, a single bond, —S—, —O—, —C(=O)—, —C(=O)O—, —O—C(=O)—O—, —$CH_2$—, —C($CF_3$)$_2$—, —C($CH_3$)$_2$—, —C(=$CH_2$)— or —CH=CH— and the like.

Suitable examples of Ar include, but are not limited to, phenylene, naphthylene, anthracenylene, phenanthracenylene, indenylene, biphenylene, 4-benzylphenylene, 4-phenoxyphenylene, 4-phenacylphenylene, 4-phenylisopropylidenephenylene, 4-phenyl-(1,1,1,3,3,3)-hexafluoroisopropylidenephenylene, 4-phenylcarbonylphenylene, and the like. Preferred Ar examples include phenylene, biphenylene, benzylphenylene and 4-phenoxyphenylene.

Preferred $R^4$ groups are independently hydrogen atoms, $C_1$-$C_4$ linear, branched or cyclic alkyl groups or $C_1$-$C_4$ partially or completely halogenated alkyl groups. More preferred $R^4$ groups are independently hydrogen atoms, methyl or tert-butyl or fluorinated $C_1$-$C_2$ alkyl groups. Most preferred $R^4$ groups are independently hydrogen atoms. Suitable examples of $R^4$ groups include, but are not limited to, a hydrogen atom, methyl, ethyl, propyl, isopropyl, n-butyl, tert-butyl, hexyl, cyclohexyl, cyclopentyl, chloro, fluoro, bromo, trifluoromethyl and the like. Preferred examples of $R^4$ are a hydrogen atom, methyl, tert-butyl and trifluoromethyl.

When Ar is phenyl, n is an integer from 1 to 3, o is an integer from 0 to 4 with the proviso that the sum of n and o is no greater than 5. A more preferred n is the integer 1 or 2 and a more preferred o is an integer from 0 to 3. The most preferred n is 1 and the most preferred o is 0.

When Ar is naphthyl, n is an integer from 1 to 5, o is an integer from 0 to 6 with the proviso that the sum of n and o is no greater than 7. A more preferred n is an integer from 1 to 3 and a more preferred o an integer from 0 to 3. The most preferred n is 1 and the most preferred o is 0. m is preferably 0 or 1. The most preferred m is 0.

Suitable examples of Ar(OH)$_n$(R$^4$)$_o$ include, but are not limited to,

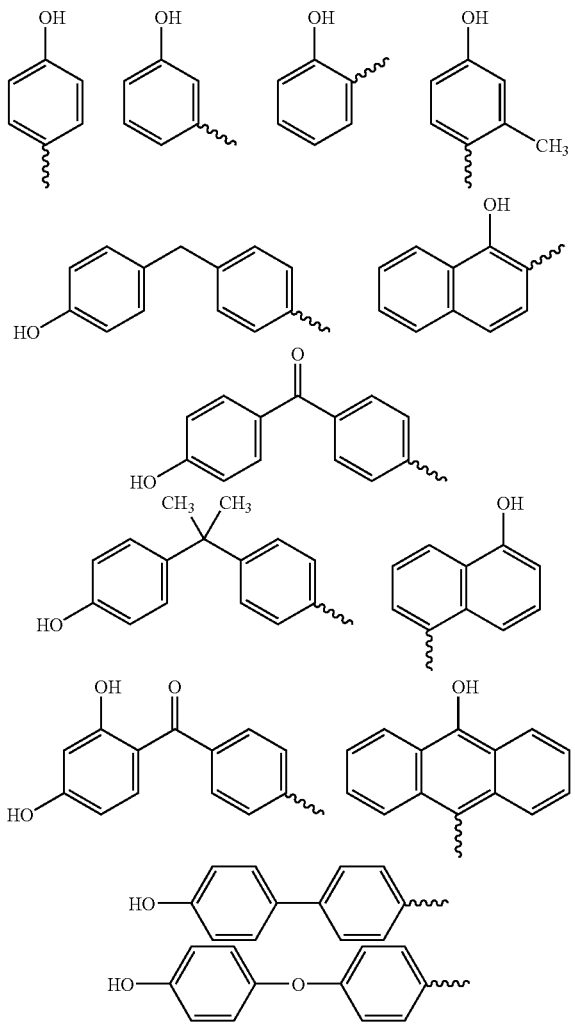

wherein ～～ indicates the bond between Ar(OH)$_n$(R$^4$)$_o$ and W or the polymer backbone.

Illustrative examples of Structure (I) generating monomers include, but are not limited to, 4'-bicyclo[2.2.1]hept-5-en-2-ylphenyl acetate, 3'-bicyclo[2.2.1]hept-5-en-2-ylphenyl acetate, 4'-bicyclo[2.2.1]hept-5-en-2-ylnaphthyl acetate, 4'-bicyclo[2.2.1]hept-5-en-2-yl-(2'-anthracenyl)acetate, 2'-bicyclo[2.2.1]hept-5-en-2-yl-(9'-anthracenyl)acetate, 4'-(3-methylbicyclo[2.2.1]hept-5-en-2-yl)phenyl acetate, 4'-(3-chlorobicyclo[2.2.1]hept-5-en-2-yl)phenyl acetate, 4'-(3-methylbicyclo[2.2.1]hept-5-en-2-yl)-1',2'-phenylene diacetate, 4'-bicyclo[2.2.1]hept-5-en-2-yl-1',2'-phenylene diacetate, 4'-(3-chlorobicyclo[2.2.1]hept-5-en-2-yl)-1',2'-phenylene diacetate, 2'-methyl-5'-(3-methylbicyclo[2.2.1]hept-5-en-2-yl)phenyl acetate, 2'-chloro-5'-(3-methylbicyclo[2.2.1]hept-5-en-2-yl)phenyl acetate, 4'-(4''-bicyclo[2.2.1]hept-5-en-2-ylcyclohexyl)phenyl acetate, 4'-bicyclo[2.2.1]hept-5-en-2-ylbiphenyl-4-yl acetate, 4'-(bicyclo[2.2.1]hept-5-en-2-ylmethyl)phenyl acetate, 4'-4'-tetracyclo[4.4.0.1$^{2,5}$.1$^{7,10}$]dodecyl-8-ene-phenyl acetate, 4-(acetyloxy)benzyl bicyclo[2.2.1]hept-5-ene-2-carboxylate, 4-{[(bicyclo[2.2.1]hept-5-en-2-ylcarbonyl)oxy]amino}phenyl acetate, 4-[1-(4-bicyclo[2.2.1]hept-5-en-2-ylphenyl)-1-methylethyl]phenyl acetate, 4-(4-bicyclo[2.2.1]hept-5-en-2-ylbenzoyl)phenyl acetate, 4-[(4-bicyclo[2.2.1]hept-5-en-2-ylphenyl)thio]phenyl acetate, 4-bicyclo[2.2.1]hept-5-en-2-ylphenyl 4-(acetyloxy)benzoate, 4-(4-bicyclo[2.2.1]hept-5-en-2-yl-benzyl)phenyl acetate, 4-[1-(4-bicyclo[2.2.1]hept-5-en-2-ylphenyl)-2,2,2-trichloro-1-(trichloromethyl)ethyl]phenyl acetate, 4-[1-(4-bicyclo[2.2.1]hept-5-en-2-ylphenyl)-2,2,2-trifluoro-1-(trifluoromethyl)ethyl]phenyl acetate, 4'-bicyclo[2.2.1]hept-5-en-2-yl-trimethylsiloxybenzene, 3'-bicyclo[2.2.1]hept-5-en-2-yl-trimethylsiloxybenzene, 4'-bicyclo[2.2.1]hept-5-en-2-yl-triethylsiloxybenzene and the like. The preferred monomer generating Structure (I) are 4'-bicyclo[2.2.1]hept-5-en-2-ylphenyl acetate, 3'-bicyclo[2.2.1]hept-5-en-2-ylphenyl acetate, 4'-bicyclo[2.2.1]hept-5-en-2-ylnaphthyl acetate, 4'-tetracyclo[4.4.0.1$^{2,5}$.1$^{7,10}$]dodecyl-8-ene-phenyl acetate, 4-(acetyloxy)benzyl bicyclo[2.2.1]hept-5-ene-2-carboxylate, 4'-bicyclo[2.2.1]hept-5-en-2-yl-trimethylsiloxybenzene, 3'-bicyclo[2.2.1]hept-5-en-2-yl-trimethylsiloxybenzene and 4'-bicyclo[2.2.1]hept-5-en-2-yl-triethylsiloxybenzene. The most preferred monomers generating Structure (I) are 4'-bicyclo[2.2.1]hept-5-en-2-ylphenyl acetate, 3'-bicyclo[2.2.1]hept-5-en-2-ylphenyl acetate, 4'-tetracyclo[4.4.0.1$^{2,5}$.1$^{7,10}$]dodecyl-8-ene-phenyl acetate and 4'-bicyclo[2.2.1]hept-5-en-2-yl-trimethylsiloxybenzene.

The hydroxylic groups in the monomeric unit described by Structure (I) interfere with the polymerization process. In practice the monomer employed for the polymerization contains a readily removable protecting group for the hydroxyl functionality. Examples of such protecting groups include, but are not limited to, acetoxy and trialkylsiloxy groups. Subsequent to the polymerization, the protecting groups are removed.

The monomeric unit of Structure (I) includes an aryl group containing a hydroxyl group which acts as a chromophore for absorbance at 193 nm and also provides increased etch selectivity. The hydroxyl group provides an opportunity for crosslinking and also increases the polarity of the cycloolefin polymer for increased compatibility with common EBR solvents.

In one embodiment of Structure (I) W is a single bond

Structure (Ia)

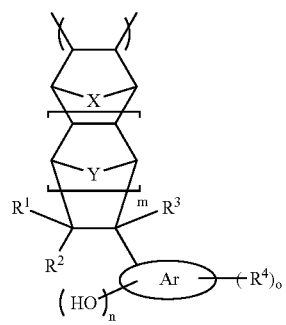

wherein R$^1$, R$^2$, R$^3$, R$^4$, Ar, X, Y, m, n, and o are defined as in Structure (I). Preferred values for R$^1$, R$^2$, R$^3$, R$^4$, Ar, X, Y, m, n and o are also as defined in Structure (I). Illustrative examples of Structure (Ia) generating monomers include, but are not limited to, 4'-bicyclo[2.2.1]hept-5-en-2-ylphenyl acetate, 3'-bicyclo[2.2.1]hept-5-en-2-ylphenyl acetate, 4'-bicyclo[2.2.1]hept-5-en-2-ylnaphthyl acetate, 4'-bicyclo[2.2.1]hept-5-en-2-yl-(2'-anthracenyl)acetate, 2'-bicyclo[2.2.1]hept-5-en-2-yl-(9'-anthracenyl)acetate, 4'-(3-methylbicyclo[2.2.1]hept-5-en-2-yl)phenyl acetate, 4'-(3-chlorobicyclo[2.2.1]hept-5-en-2-yl)phenyl acetate, 4'-(3-methylbicyclo[2.2.1]hept-5-en-2-yl)-1',2'-phenylene diacetate, 4'-bicyclo[2.2.1]hept-5-en-2-yl-1',2'-phenylene diacetate, 4'-(3-chlorobicyclo[2.2.1]hept-5-en-2-yl)-1',2'-phenylene diacetate, 2'-methyl-5'-(3-methylbicyclo[2.2.1]hept-5-en-2-yl)phenyl acetate, 2-chloro-5-(3-methylbicyclo[2.2.1]hept-5-en-2-yl)phenyl acetate, 4'-bicyclo[2.2.1]hept-5-en-2-ylbiphenyl-4-yl acetate, 4'-tetracyclo[4.4.0.1$^{2,5}$.1$^{7,10}$]dodecyl-8-ene-phenyl acetate and the like.

In one embodiment of Structure (Ia) Ar is a phenyl group or derivative:

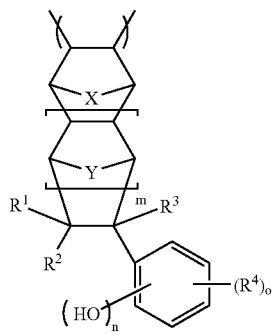

Structure (Ia-1)

wherein $R^1$, $R^2$, $R^3$, $R^4$, X, Y, and m are defined as in Structure (Ia); Preferred values for $R^1$, $R^2$, $R^3$, $R^4$, X, Y, and m are also as defined in Structure (Ia). n is an integer from 1 to 3, o is an integer from 0 to 4 with the proviso that the sum of n and o is no greater than 5. A more preferred n is the integer 1 or 2 and a more preferred o an integer from 0 to 3. The most preferred n is 1 and the most preferred o is 0. Illustrative examples of Structure (Ia-1) generating monomers include, but are not limited to, 4'-bicyclo[2.2.1]hept-5-en-2-ylphenyl acetate, 3'-bicyclo[2.2.1]hept-5-en-2-ylphenyl acetate, 4'-bicyclo[2.2.1]hept-5-en-2-yl-1',2'-phenylene diacetate, 4'-tetracyclo[4.4.0.1$^{2,5}$.1$^{7,10}$]dodecyl-8-ene-phenyl acetate and the like.

In another embodiment of Structure (Ia) Ar is a naphthyl group or derivative:

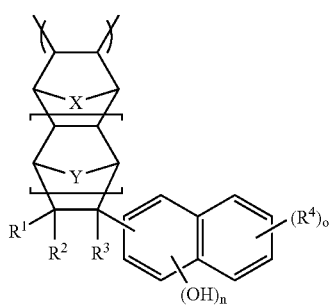

Structure (Ia-2)

wherein $R^1$, $R^2$, $R^3$, $R^4$, X, Y, and m are defined as in Structure (Ia); Preferred values for $R^1$, $R^2$, $R^3$, $R^4$, X, Y, and m are also as defined in Structure (Ia). n is an integer from 1 to 5, o is an integer from 0 to 6 with the proviso that the sum of n and o is no greater than 7. A more preferred n is an integer from 1 to 3 and a more preferred o an integer from 0 to 3. The most preferred n is 1 and the most preferred o is 0. Illustrative examples of Structure (Ia-2) generating monomers include, but are not limited to, 4'-bicyclo[2.2.1]hept-5-en-2-yl(1'-naphthyl acetate), 4'-bicyclo[2.2.1]hept-5-en-2-yl(2'-naphthyl acetate), 4'-tetracyclo[4.4.0.1$^{2,5}$.1$^{7,10}$]dodecyl-8-ene-(2'-naphthyl acetate), 4'-bicyclo[2.2.1]hept-5-en-2-yl-trimethylsiloxy(2'-naphthylene) and the like.

In another embodiment of Structure (Ia) Ar is a B-L-E group or derivative:

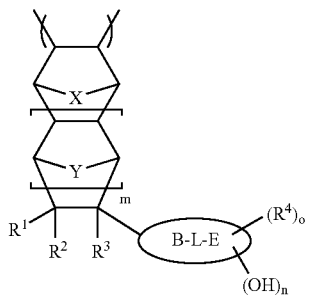

Structure (Ia-3)

wherein $R^1$, $R^2$, $R^3$, $R^4$, X, Y, and m are defined as in Structure (Ia) and B, L, and E are defined as in Structure (I); Preferred values for $R^1$, $R^2$, $R^3$, $R^4$, X, Y, and m are also as defined in Structure (Ia) and preferred values for B, L, and E as defined in Structure (I). n is an integer from 1 to 5, o is an integer from 0 to 6 with the proviso that the sum of n and o is no greater than 7. A more preferred n is an integer from 1 to 3 and a more preferred o an integer from 0 to 3. The most preferred n is 1 and the most preferred o is 0. Illustrative examples of Structure (Ia-3) generating monomer include, but are not limited to, 4'-bicyclo[2.2.1]hept-5-en-2-ylbiphenyl-4-yl acetate, 4-(acetyloxy)benzyl bicyclo[2.2.1]hept-5-ene-2-carboxylate, 4-(4-bicyclo[2.2.1]hept-5-en-2-ylbenzoyl)phenyl acetate, 4-bicyclo[2.2.1]hept-5-en-2-ylphenyl 4-(acetyloxy)benzoate, 4-(4-bicyclo[2.2.1]hept-5-en-2-ylbenzyl)phenyl acetate, 4-[1-(4-bicyclo[2.2.1]hept-5-en-2-ylphenyl)-2,2,2-trichloro-1-(trichloromethyl)ethyl]phenyl acetate, 4-[1-(4-bicyclo[2.2.1]hept-5-en-2-ylphenyl)-2,2,2-trifluoro-1-(trifluoromethyl)ethyl]phenyl acetate and the like.

In another embodiment of Structure (I) W is an oxygen or sulfur atom:

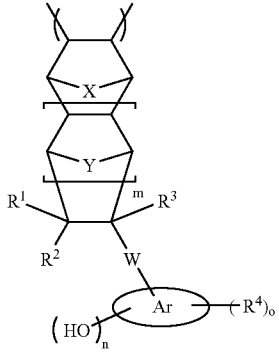

Structure (Ib)

wherein $R^1$, $R^2$, $R^3$, $R^4$, Ar, X, Y, m, n, and o are defined as in Structure (I). Preferred values for $R^1$, $R^2$, $R^3$, $R^4$, X, Y, m, n and o are also as defined in Structure (I). Illustrative examples of Structure (Ib) generating monomer include, but are not limited to, 4-(bicyclo[2.2.1]hept-5-en-2-yloxy)phenyl acetate, 4-(bicyclo[2.2.1]hept-5-en-2-ylthio)phenyl acetate, 4'-tetracyclo[$4.4.0.1^{2,5}.1^{7,10}$]dodecyl-8-en-yloxy)phenyl acetate, 4'-tetracyclo[$4.4.0.1^{2,5}.1^{7,10}$]dodecyl-8-en-ylthio)phenyl acetate, 4-[4-(bicyclo[2.2.1]hept-5-en-2-yloxy)benzyl]phenyl acetate, 4-[4-(bicyclo[2.2.1]hept-5-en-2-ylthio)benzyl]phenyl acetate, 4-(bicyclo[2.2.1]hept-5-en-2-yloxy-1',2'-phenylene diacetate, 4-(bicyclo[2.2.1]hept-5-en-2-ylthio)-1',2'-phenylene diacetate, 4-(bicyclo[2.2.1]hept-5-en-2-yloxy)-1'-naphthyl acetate, 4-(bicyclo[2.2.1]hept-5-en-2-ylthio)-1'-naphthyl acetate, 4-(bicyclo[2.2.1]hept-5-en-2-yloxy)-2'-naphthyl acetate, 4-(bicyclo[2.2.1]hept-5-en-2-ylthio)-2'-naphthyl acetate, 4'-tetracyclo[$4.4.0.1^{2,5}.1^{7,10}$]dodecyl-8-en-yloxy)phenyl acetate, 4'-tetracyclo[$4.4.0.1^{2,5}.1^{7,10}$]dodecyl-8-en-ylthio)phenyl acetate, 4'-tetracyclo[$4.4.0.1^{2,5}.1^{7,10}$]dodecyl-8-en-yloxy)-1'-naphthyl acetate, 4'-tetracyclo[$4.4.0.1^{2,5}.1^{7,10}$]dodecyl-8-en-ylthio)-1'-naphthyl acetate, 4-[4-(bicyclo[2.2.1]hept-5-en-2-yloxy)phenoxy]phenyl acetate, 4-[4-(bicyclo[2.2.1]hept-5-en-2-yloxy)benzoyl]phenyl acetate and the like.

In one embodiment of Structure (Ib) Ar is a phenyl group or derivative:

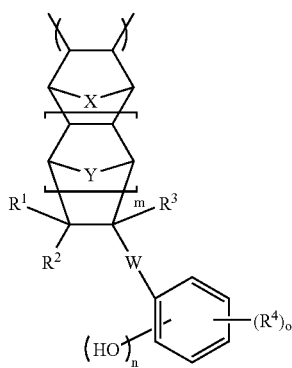

Structure (Ib-1)

wherein W, $R^1$, $R^2$, $R^3$, $R^4$, X, Y, and m are defined as in Structure (Ib). Preferred values for, $R^1$, $R^2$, $R^3$, $R^4$, X, Y, and m are also as defined in Structure (Ib). n is an integer from 1 to 3, o is an integer from 0 to 4 with the proviso that the sum of n and o is no greater than 5. A more preferred n is the integer 1 or 2 and a more preferred an integer from 0 to 3. The most preferred n is 1 and the most preferred o is 0. Illustrative examples of Structure (Ib-1) generating monomers include, but are not limited to, 4-(bicyclo[2.2.1]hept-5-en-2-yloxy)phenyl acetate, 4-(bicyclo[2.2.1]hept-5-en-2-ylthio)phenyl acetate, 4'-tetracyclo[$4.4.0.1^{2,5}.1^{7,10}$]dodecyl-8-en-yloxy)phenyl acetate, 4'-tetracyclo[$4.4.0.1^{2,5}.1^{7,10}$]dodecyl-8-en-ylthio)phenyl acetate, 4-(bicyclo[2.2.1]hept-5-en-2-yloxy-1',2'-phenylene diacetate, 4-(bicyclo[2.2.1]hept-5-en-2-ylthio)-1',2'-phenylene diacetate, 4'-tetracyclo[$4.4.0.1^{2,5}.1^{7,10}$]dodecyl-8-en-yloxy)phenyl acetate, 4'-tetracyclo[$4.4.0.1^{2,5}.1^{7,10}$]dodecyl-8-en-ylthio)phenyl acetate and the like.

In another embodiment of Structure (Ib) Ar is a naphthyl group or derivative:

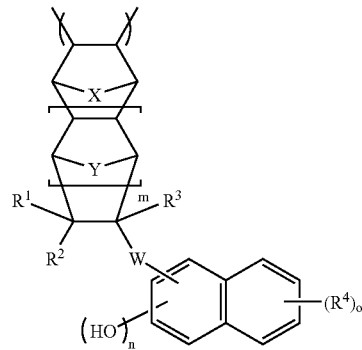

Structure (Ib-2)

wherein W, $R^1$, $R^2$, $R^3$, $R^4$, X, Y, and m are defined as in Structure (Ib). Preferred values for $R^1$, $R^2$, $R^3$, $R^4$, X, Y, and m are also as defined in Structure (Ib). n is an integer from 1 to 5, o is an integer from 0 to 6 with the proviso that the sum of n and o is no greater than 7. A more preferred n is an integer from 1 to 3 and a more preferred o an integer from 0 to 3. The most preferred n is 1 and the most preferred o is 0. Illustrative examples of Structure (Ib-2) generating monomers include, but are not limited to, 4-(bicyclo[2.2.1]hept-5-en-2-yloxy)-1'-naphthyl acetate, 4-(bicyclo[2.2.1]hept-5-en-2-ylthio)-1'-naphthyl acetate, 4-(bicyclo[2.2.1]hept-5-en-2-yloxy)-2'-naphthyl acetate, 4-(bicyclo[2.2.1]hept-5-en-2-ylthio)-2'-naphthyl acetate, 4'-tetracyclo[$4.4.0.1^{2,5}.1^{7,10}$]dodecyl-8-en-yloxy)-1'-naphthyl acetate, 4'-tetracyclo[$4.4.0.1^{2,5}.1^{7,10}$]dodecyl-8-en-ylthio)-1'-naphthyl acetate and the like.

In another embodiment of Structure (Ib) Ar is a B-L-E group or derivative:

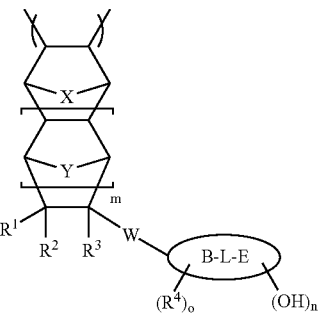

Structure (Ib-3)

wherein W, $R^1$, $R^2$, $R^3$, $R^4$, X, Y, and m are defined as in Structure (Ib) and values for B, L, and E as defined in Structure (1). Preferred values for W, $R^1$, $R^2$, $R^3$, $R^4$, X, Y, and m are also as defined in Structure (Ib) and preferred values for B, L, and E as defined in Structure (1). n is an integer from 1 to 5, o is an integer from 0 to 6 with the proviso that the sum of n and o is no greater than 7. A more preferred n is an integer from 1 to 3 and a more preferred o an integer from 0 to 3. The most preferred n is 1 and the most preferred o is 0. Illustrative examples of Structure (Ic-3) generating monomer include, but are not limited to, 4-[4-(bicyclo[2.2.1]hept-5-en-2-yloxy)benzyl]phenyl acetate, 4-[4-(bicyclo[2.2.1]hept-5-en-2-ylthio)benzyl]phenyl acetate, 4-[4-(bicyclo[2.2.1]hept-5-en-2-yloxy)phenoxy]phenyl acetate, 4-[4-(bicyclo[2.2.1]hept-5-en-2-yloxy)benzoyl]phenyl acetate, 4-[4-(bicyclo[2.2.1]hept-5-en-2-ylthio)phenoxy]phenyl acetate, 4-[4-(bicyclo[2.2.1]hept-5-en-2-ylthio)benzoyl]phenyl acetate and the like.

In another embodiment of Structure (I) W is a hydrocarbon group, such as $C_1$-$C_{10}$ alkylene, $C_6$-$C_{12}$ cycloalkylene or alicyclic residue:

Structure (Ic)

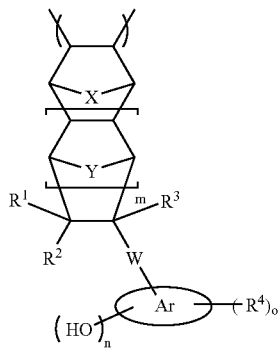

wherein $R^1$, $R^2$, $R^3$, $R^4$, Ar, X, Y, m, n, and o are defined as in Structure (I). Preferred values for $R^1$, $R^2$, $R^3$, $R^4$, Ar, X, Y, m, n, and o are also defined as in Structure (I). Illustrative examples of Structure (Ic) generating monomer include, but are not limited to, 4-(bicyclo[2.2.1]hept-5-en-2-ylmethyl) phenyl acetate, 4-(4-bicyclo[2.2.1]hept-5-en-2-ylcyclohexyl)phenyl acetate, 4'-tetracyclo[4.4.0.1$^{2,5}$.1$^{7,10}$]dodecyl-8-en-ylmethyl)phenyl acetate, 4'-tetracyclo[4.4.0.1$^{2,5}$.1$^{7,10}$]dodecyl-8-en-ylcyclohexyl)phenyl acetate, 4'-(bicyclo[2.2.1]hept-5-en-2-ylmethyl)-1',2'-phenylene diacetate, 4-(4-bicyclo[2.2.1]hept-5-en-2-ylcyclohexyl)-1',2'-phenylene diacetate, 4-(bicyclo[2.2.1]hept-5-en-2-ylmethyl)-1'-naphthyl acetate, 4-(4-bicyclo[2.2.1]hept-5-en-2-ylcyclohexyl)-1'-naphthyl acetate, 4-(bicyclo[2.2.1]hept-5-en-2-ylmethyl)-2'-naphthyl acetate, 4-(4-bicyclo[2.2.1]hept-5-en-2-ylcyclohexyl)-2'-naphthyl acetate, 4'-(bicyclo[2.2.1]hept-5-en-2-ylmethyl)biphenyl-4-yl acetate, 4-[4-(bicyclo[2.2.1]hept-5-en-2-ylmethyl)benzyl]phenyl acetate, 4-[4-(bicyclo[2.2.1]hept-5-en-2-ylmethyl)benzoyl]phenyl acetate, 4-[4-(bicyclo[2.2.1]hept-5-en-2-ylcyclohexy)benzyl]phenyl acetate, 4-[4-(bicyclo[2.2.1]hept-5-en-2-ylcyclohexy)benzoyl]phenyl acetate, 4'-(bicyclo[2.2.1]hept-5-en-2-ylcyclohexy)biphenyl-4-yl acetate, 4'-tetracyclo[4.4.0.1$^{2,5}$.1$^{7,10}$]dodecyl-8-en-ylmethyl)-1'-naphthyl acetate, 4'-tetracyclo[4.4.0.1$^{2,5}$.1$^{7,10}$]dodecyl-8-en-ylcyclohexyl)-1'-naphthyl acetate and the like.

In one embodiment of Structure (Ic) Ar is a phenyl group or derivative:

Structure (Ic-1)

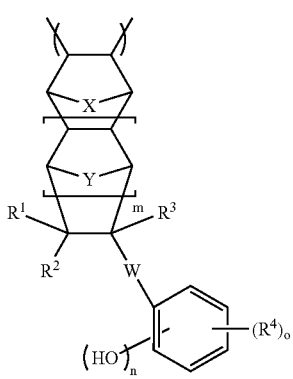

wherein W, $R^1$, $R^2$, $R^3$, $R^4$, X, Y, and m are defined as in Structure (Ic). Preferred values for, $R^1$, $R^2$, $R^3$, $R^4$, X, Y, and m are also as defined in Structure (Ic). n is an integer from 1 to 3, o is an integer from 0 to 4 with the proviso that the sum of n and o is no greater than 5. A more preferred n is the integer 1 or 2 and a more preferred an integer from 0 to 3. The most preferred n is 1 and the most preferred o is 0. Illustrative examples of Structure (Ic-1) generating monomers include, but are not limited to, 4-(bicyclo[2.2.1]hept-5-en-2-ylmethyl)phenyl acetate, 4-(4-bicyclo[2.2.1]hept-5-en-2-ylcyclohexyl)phenyl acetate, 4'-tetracyclo[4.4.0.1$^{2,5}$.1$^{7,10}$]dodecyl-8-en-ylmethyl)phenyl acetate, 4'-tetracyclo[4.4.0.1$^{2,5}$.1$^{7,10}$]dodecyl-8-en-ylcyclohexyl)phenyl acetate, 4-(bicyclo[2.2.1]hept-5-en-2-ylmethyl)-1',2'-phenylene diacetate, 4-(4-bicyclo[2.2.1]hept-5-en-2-ylcyclohexyl)-1',2'-phenylene diacetate and the like.

In another embodiment of Structure (Ic) Ar is a naphthyl group or derivative:

Structure (Ic-2)

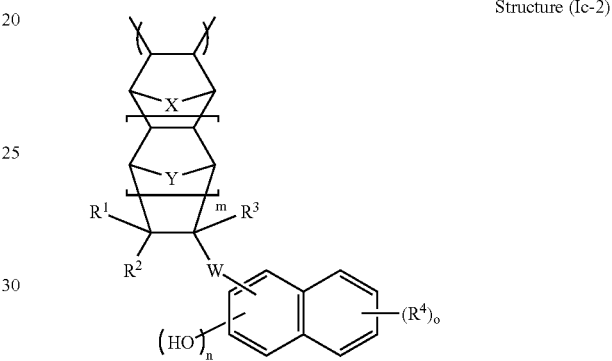

wherein W, $R^1$, $R^2$, $R^3$, $R^4$, X, Y, and m are defined as in Structure (Ic). Preferred values for, $R^1$, $R^2$, $R^3$, $R^4$, X, Y, and m are also as defined in Structure (Ic). n is an integer from 1 to 5, o is an integer from 0 to 6 with the proviso that the sum of n and o is no greater than 7. A more preferred n is an integer from 1 to 3 and a more preferred o an integer from 0 to 3. The most preferred n is 1 and the most preferred o is 0. Illustrative examples of Structure (Ic-2) generating monomers include, but are not limited to, 4-(bicyclo[2.2.1]hept-5-en-2-ylmethyl)-1'-naphthyl acetate, 4-(4-bicyclo[2.2.1]hept-5-en-2-ylcyclohexyl)-1'-naphthyl acetate, 4-(bicyclo[2.2.1]hept-5-en-2-ylmethyl)-2'-naphthyl acetate, 4-(4-bicyclo[2.2.1]hept-5-en-2-ylcyclohexyl)-2'-naphthyl acetate, 4'-tetracyclo[4.4.0.1$^{2,5}$.1$^{7,10}$]dodecyl-8-en-ylmethyl)-1'-naphthyl acetate, 4'-tetracyclo[4.4.0.1$^{2,5}$.1$^{7,10}$]dodecyl-8-en-ylcyclohexyl)-1'-naphthyl acetate and the like.

In another embodiment of Structure (Ic) Ar is a B-L-E group or derivative:

Structure (Ic-3)

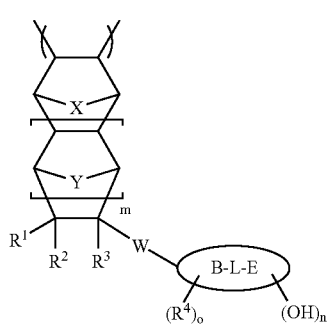

wherein W, $R^1$, $R^2$, $R^3$, $R^4$, X, Y, and m are defined as in Structure (Ic) and values for B, L, and E as defined in Structure (I). Preferred values for $R^1$, $R^2$, $R^3$, $R^4$, X, Y, and m are also as defined in Structure (Ic) and preferred values for B, L, and E as defined in Structure (I). n is an integer form 1 to 5, o is an integer from 0 to 6 with the proviso that the sum of n and o is no greater than 7. A more preferred n is an integer from 1 to 3 and a more preferred o an integer from 0 to 3. The most preferred n is 1 and the most preferred o is 0. Illustrative examples of Structure (Ic-3) generating monomer include, but are not limited to, 4'-(bicyclo[2.2.1]hept-5-en-2-ylmethyl)biphenyl-4-yl acetate, 4-[4-(bicyclo[2.2.1]hept-5-en-2-ylmethyl)benzyl]phenyl acetate, 4-[4-(bicyclo[2.2.1]hept-5-en-2-ylmethyl)benzoyl]phenyl acetate, 4-[4-(bicyclo[2.2.1]hept-5-en-2-ylcyclohexy)benzyl]phenyl acetate, 4-[4-(bicyclo[2.2.1]hept-5-en-2-ylcyclohexy)benzoyl]phenyl acetate, 4'-(bicyclo[2.2.1]hept-5-en-2-ylcyclohexy)biphenyl-4-yl acetate and the like.

In another embodiment of Structure (I) W is a polar group selected from the group consisting of $-(CH_2)_pO-$, $-(CH_2)_pO(CH_2)_q-$, $-(CH_2)_pO(R^5O)_r-$, $(CH_2)_pC(=O)O-$, $-(CH_2)_pC(=O)O(CH_2)_q-$, $-(CH_2)_pC(=O)O(R^5O)r-$, $-(CH_2)_pOC(=O)O(CH_2)_p-$ and $-(CH_2)_pNR^6C(=O)-$:

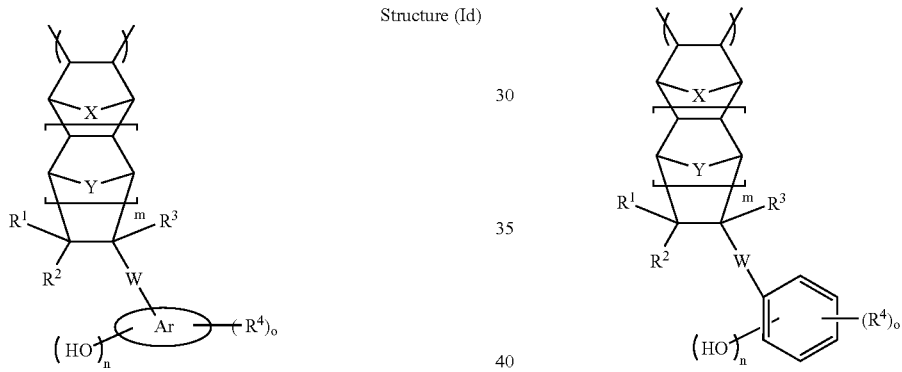

Structure (Id)

Structure (Id-1)

wherein $R^1$, $R^2$, $R^3$, $R^4$, $R^5$, $R^6$, Ar, X, Y, m, n, o, p, q and r are defined as in Structure (I). Preferred values for $R^1$, $R^2$, $R^1$, $R^4$, $R^5$, $R^6$, Ar, X, Y, m, n, and o are also as defined in Structure (I). Illustrative examples of Structure (Id) generating monomers include, but are not limited to, 4-(acetyloxy)benzyl bicyclo[2.2.1]hept-5-ene-2-carboxylate, 4-{[(bicyclo[2.2.1]hept-5-en-2-ylcarbonyl)oxy]amino}phenyl acetate, 4-[(bicyclo[2.2.1]hept-5-en-2-yloxy)methyl]phenyl acetate, 4-(bicyclo[2.2.1]hept-5-en-2-ylmethoxy)phenyl acetate, 4-[2-(bicyclo[2.2.1]hept-5-en-2-ylmethoxy)ethoxy]phenyl acetate, 4-[2-(bicyclo[2.2.1]hept-5-en-2-yloxy)ethoxy]phenyl acetate, 4-[4-(acetyloxy)phenoxy]benzyl bicyclo[2.2.1]hept-5-ene-2-carboxylate, 4-(4-hydroxybenzyl)benzyl bicyclo[2.2.1]hept-5-ene-2-carboxylate, 4-[1-(4-hydroxyphenyl)-1-methylethyl]benzyl bicyclo[2.2.1]hept-5-ene-2-carboxylate, 4-[1-(4-hydroxyphenyl)-2,2,2-trifluoro-1-(trifluoromethyl)ethyl]benzyl bicyclo[2.2.1]hept-5-ene-2-carboxylate, 4-(4-hydroxybenzoyl)benzyl bicyclo[2.2.1]hept-5-ene-2-carboxylate, 4-(acetyloxy)(1'-naphthyl) bicyclo[2.2.1]hept-5-ene-2-carboxylate, 4-{[(bicyclo[2.2.1]hept-5-en-2-ylcarbonyl)oxy]amino}(1'-naphthyl acetate), 4-[(bicyclo[2.2.1]hept-5-en-2-yloxy)methyl](1'-naphthyl acetate), 4-(bicyclo[2.2.1]hept-5-en-2-ylmethoxy)(1'-naphthyl acetate), 4-[2-(bicyclo[2.2.1]hept-5-en-2-ylmethoxy)ethoxy](1'-naphthyl acetate), 4-[2-(bicyclo[2.2.1]hept-5-en-2-yloxy)ethoxy](1'-naphthyl acetate), 4-{[(bicyclo[2.2.1]hept-5-en-2-ylcarbonyl)oxy]amino}-1',2'-phenylene diacetate, 4-[(bicyclo[2.2.1]hept-5-en-2-yloxy)methyl]-1',2'-phenylene diacetate, 4-(bicyclo[2.2.1]hept-5-en-2-ylmethoxy)-1',2'-phenylene diacetate, 4-[2-(bicyclo[2.2.1]hept-5-en-2-ylmethoxy)ethoxy]-1',2'-phenylene diacetate, 4-[2-(bicyclo[2.2.1]hept-5-en-2-yloxy)ethoxy]-1',2'-phenylene diacetate, 4-(acetyloxy)benzyl 4'-tetracyclo[4.4.0.1$^{2,5}$.1$^{7,10}$]dodecyl-8-en-carboxylate, 4'-{[(tetracyclo[4.4.0.1$^{2,5}$.1$^{7,10}$]dodecyl-8-en-ylcarbonyl)oxy]amino}phenyl acetate, 4'-[(tetracyclo[4.4.0.1$^{2,5}$.1$^{7,10}$]dodecyl-8-en-yloxy)methyl]phenyl acetate, 4'-tetracyclo[4.4.0.1$^{2,5}$.1$^{7,10}$]dodecyl-8-en-ylmethoxy)phenyl acetate, 4-[4'-tetracyclo[4.4.0.1$^{2,5}$.1$^{7,10}$]dodecyl-8-en-ylmethoxy)ethoxy]phenyl acetate, 4"-[4'-tetracyclo[4.4.0.1$^{2,5}$.1$^{7,10}$]dodecyl-8-en-yloxy)ethoxy]phenyl acetate, 4'-[4-(acetyloxy)phenoxy]benzyl tetracyclo[4.4.0.1$^{2,5}$.1$^{7,10}$]dodecyl-8-en-2-carboxylate, 4'-(4-hydroxybenzyl)benzyl tetracyclo[4.4.0.1$^{2,5}$.1$^{7,10}$]dodecyl-8-en-carboxylate, 4"-[1-(4'-hydroxyphenyl)-1-methylethyl]benzyl tetracyclo[4.4.0.1$^{2,5}$.1$^{7,10}$]dodecyl-8-en-carboxylate and the like.

In one embodiment of Structure (Id) Ar is a phenyl group or derivative:

wherein W, $R^1$, $R^2$, $R^3$, $R^4$, X, Y, and m are defined as in Structure (Id). Preferred values for $R^1$, $R^2$, $R^3$, $R^4$, X, Y, and m are also as defined in Structure (Id). n is an integer from 1 to 3, o is an integer from 0 to 4 with the proviso that the sum of n and o is no greater than 5. A more preferred n is the integer 1 or 2 and a more preferred an integer from 0 to 3. The most preferred n is 1 and the most preferred o is 0. Illustrative examples of Structure (Id-1) generating monomers include, but are not limited to, 4-(acetyloxy)benzyl bicyclo[2.2.1]hept-5-ene-2-carboxylate, 4-{[(bicyclo[2.2.1]hept-5-en-2-ylcarbonyl)oxy]amino}phenyl acetate, 4-[(bicyclo[2.2.1]hept-5-en-2-yloxy)methyl]phenyl acetate, 4-(bicyclo[2.2.1]hept-5-en-2-ylmethoxy)phenyl acetate, 4-[2-(bicyclo[2.2.1]hept-5-en-2-ylmethoxy)ethoxy]phenyl acetate, 4-[2-(bicyclo[2.2.1]hept-5-en-2-yloxy)ethoxy]phenyl acetate, 4-{[(bicyclo[2.2.1]hept-5-en-2-ylcarbonyl)oxy]amino}-1',2'-phenylene diacetate, 4-[(bicyclo[2.2.1]hept-5-en-2-yloxy)methyl]-1',2'-phenylene diacetate, 4-(bicyclo[2.2.1]hept-5-en-2-ylmethoxy)-1',2'-phenylene diacetate, 4-[2-(bicyclo[2.2.1]hept-5-en-2-ylmethoxy)ethoxy]-1',2'-phenylene diacetate, 4-[2-(bicyclo[2.2.1]hept-5-en-2-yloxy)ethoxy]-1',2'-phenylene diacetate, 4-(acetyloxy)benzyl 4'-tetracyclo[4.4.0.1$^{2,5}$.1$^{7,10}$]dodecyl-8-en-carboxylate, 4'-{[(tetracyclo[4.4.0.1$^{2,5}$.1$^{7,10}$]dodecyl-8-en-ylcarbonyl)oxy]amino}phenyl acetate, 4'-[(tetracyclo[4.4.0.1$^{2,5}$.1$^{7,10}$]

dodecyl-8-en-yloxy)methyl]phenyl acetate, 4'-tetracyclo[4.4.0.1$^{2,5}$.1$^{7,10}$]dodecyl-8-en-ylmethoxy)phenyl acetate, 4"-[4'-tetracyclo[4.4.0.1$^{2,5}$.1$^{7,10}$]dodecyl-8-en-ylmethoxy) ethoxy]phenyl acetate, 4"-[4'-tetracyclo[4.4.0.1$^{2,5}$.1$^{7,10}$]dodecyl-8-en-yloxy)ethoxy]phenyl acetate and the like.

In another embodiment of Structure (Id) Ar is a naphthyl group or derivative:

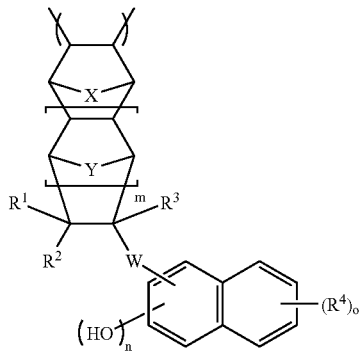

Structure (Id-2)

wherein W, $R^1$, $R^2$, $R^3$, $R^4$, X, Y, and m are defined as in Structure (Id). Preferred values for $R^1$, $R^2$, $R^3$, $R^4$, X, Y, and m are also as defined in Structure (Id). n is an integer from 1 to 5, o is an integer from 0 to 6 with the proviso that the sum of n and o is no greater than 7. A more preferred n is an integer from 1 to 3 and a more preferred o an integer from 0 to 3. The most preferred n is 1 and the most preferred o is 0. Illustrative examples of Structure (Id-2) generating monomers include, but are not limited to, 4-(acetyloxy)(1-naphthyl) bicyclo[2.2.1]hept-5-ene-2-carboxylate, 4-{[(bicyclo[2.2.1]hept-5-en-2-ylcarbonyl)oxy]amino}(1-naphthyl acetate), 4-[(bicyclo[2.2.1]hept-5-en-2-yloxy)methyl](1-naphthyl acetate), 4-(bicyclo[2.2.1]hept-5-en-2-ylmethoxy)(1-naphthyl acetate), 4-[2-(bicyclo[2.2.1]hept-5-en-2-ylmethoxy)ethoxy](1-naphthyl acetate), 4-[2-(bicyclo[2.2.1]hept-5-en-2-yloxy)ethoxy](1-naphthyl acetate) and the like.

In another embodiment of Structure (Id) Ar is a B-L-E group as defined in Structure (I) or derivative:

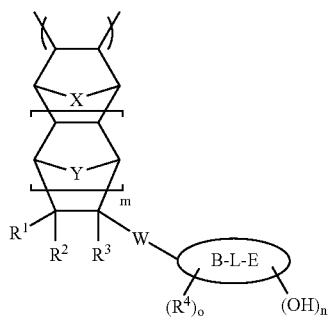

Structure (Id-3)

wherein W, $R^1$, $R^2$, $R^3$, $R^4$, X, Y, and m are defined as in Structure (Id) and values for B, L, and E as defined in Structure (I). Preferred values for $R^1$, $R^2$, $R^3$, $R^4$, X, Y, and m are also as defined in Structure (Id) and preferred values for B, L, and E as defined in Structure (I). n is an integer from 1 to 5, o is an integer from 0 to 6 with the proviso that the sum of n and o is no greater than 7. A more preferred n is an integer from 1 to 3 and a more preferred o an integer from 0 to 3. The most preferred n is 1 and the most preferred o is 0. Illustrative examples of Structure (Id-3) generating monomer include, but are not limited to 4-[1-(4-hydroxyphenyl)-1-methylethyl] benzyl bicyclo[2.2.1]hept-5-ene-2-carboxylate, 4-[1-(4-hydroxyphenyl)-2,2,2-trifluoro-1-(trifluoromethyl)ethyl]benzyl bicyclo[2.2.1]hept-5-ene-2-carboxylate, 4-(4-hydroxybenzoyl)benzyl bicyclo[2.2.1]hept-5-ene-2-carboxylate, 4-[1-(4-hydroxyphenyl)-1-methylethyl]benzyl tetracyclo[4.4.0.1$^{2,5}$.1$^{7,10}$]dodecyl-8-ene-2-carboxylate, 4-[1-(4-hydroxyphenyl)-2,2,2-trifluoro-1-(trifluoromethyl)ethyl]benzyl tetracyclo[4.4.0.1$^{2,5}$.1$^{7,10}$]dodecyl-8-ene-2-carboxylate, 4-(4-hydroxybenzoyl) tetracyclo[4.4.0.1$^{2,5}$.1$^{7,10}$]dodecyl-8-ene-2-carboxylate and the like.

The cycloolefin polymer of the present disclosure further comprises another cycloolefin repeating unit represented by Structure (II)

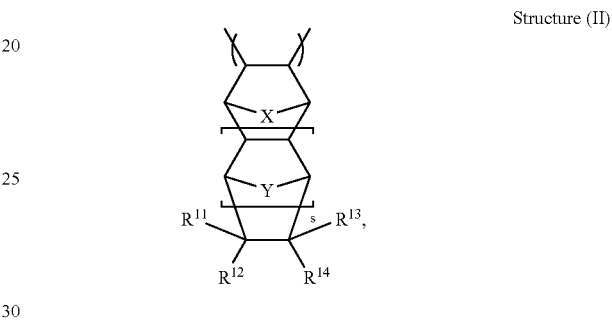

Structure (II)

subject to the proviso that Structure (II) does not contain an acid sensitive group, wherein $R^{11}$, $R^{12}$, $R^{13}$ and $R^{14}$ independently represent a hydrogen atom, a $C_1$-$C_{10}$ linear, branched or cyclic alkyl group, a $C_1$-$C_{10}$ partially or completely halogenated linear, branched or cyclic alkyl group, a halogen atom or a polar group selected from the group consisting of —$OR^{15}$, —$R^{16}OR^{15}$, and —$(CH_2)_tOC(O)R^{17}$ with the proviso that at least one of $R^{11}$ to $R^{14}$ is a polar group selected from the group consisting of —$OR^{15}$, —$R^{16}OR^{15}$, and —$(CH_2)_tOC(O)R^{17}$. $R^{15}$ is a hydrogen atom or a linear, branched or cyclic $C_1$-$C_6$ alkyl group, $R^{16}$ is a substituted or unsubstituted $C_1$-$C_6$ linear, branched or cyclic alkylene group or $C_1$-$C_6$ partially or completely halogenated linear, branched or cyclic alkylene group, $R^{17}$ is a hydrogen atom, a linear, branched or cyclic $C_1$-$C_6$ alkyl group, or a $C_7$-$C_{15}$ alicyclic group; t is an integer from 0 to about 4; s is an integer from 0 to about 3 and X and Y have the same meaning as defined in Structure (1).

Preferred $R^{11}$, $R^{12}$, $R^{13}$ and $R^{14}$ groups include hydrogen atoms, $C_1$-$C_6$ linear, branched or cyclic alkyl groups, $C_1$-$C_6$ partially or completely halogenated linear, branched or cyclic alkyl groups or halogen atoms with the proviso that at least one of $R^{11}$ to $R^{14}$ is a polar group as described above wherein $R^{15}$ is a hydrogen atom or a linear, branched or cyclic $C_1$-$C_6$ alkyl group, $R^{16}$ is a substituted or unsubstituted $C_1$-$C_4$ linear, branched or cyclic alkylene group or a $C_1$-$C_4$ partially or completely halogenated linear, branched or cyclic alkylene group, $R^{17}$ is a hydrogen atom, a linear, branched or cyclic $C_1$-$C_3$ alkyl group, or a $C_7$-$C_{15}$ alicyclic group and t is an integer from 0 to about 3.

More preferred $R^{11}$, $R^{12}$, $R^{13}$ and $R^{14}$ groups are independently hydrogen atoms, $C_1$-$C_2$ alkyl or halogenated alkyl groups or halogen atoms with the proviso that at least one of $R^{11}$ to $R^{14}$ is a polar group as described above wherein $R^{15}$ is a hydrogen atom or a methyl or ethyl group, $R^{16}$ is a substituted or unsubstituted $C_1$-$C_4$ linear, branched or cyclic alkylene group, $R^{17}$ is a hydrogen atom, or a linear, branched or cyclic $C_1$-$C_3$ alkyl group and t is an integer from 0 to about 2;

Most preferred $R^{11}$, $R^{12}$, $R^{13}$ and $R^{14}$ groups are hydrogen atoms or methyl groups with the proviso that at least one of $R^{11}$ to $R^{14}$ is a polar group as described above wherein $R^{15}$ is a hydrogen atom, $R^{16}$ is a methylene or ethylene group, $R^{17}$ is a methyl group, and t is 0 or 1.

Suitable examples of $R^{15}$ groups include, but are not limited to, hydrogen, methyl, ethyl, propyl, butyl, hexyl, cyclopropyl, cyclobutyl, cyclopentyl, cyclohexyl and the like. Suitable examples of $R^{16}$ groups include, but are not limited to, ethylene, propylene, hexylene, cyclohexylene, tetrafluoroethylene and the like. Preferred examples of $R^{16}$ are methylene, ethylene, isopropylene, and tetrafluoroethylene. Suitable examples of $R^{17}$ include, but are not limited to, hydrogen, methyl, ethyl, propyl, butyl, hexyl, cyclopropyl, cyclobutyl, cyclopentyl, cyclohexyl, cycloheptyl, (bicyclo[2.2.1]hept-2-yl, (bicyclo[2.2.1]hept-2-methyl, cis-bicyclo[3.3.0]oct-2-yl or octahydropentyl, 1-adamantyl, 3-methyl-1-adamantyl, 3,5-dimethyl-1-adamantyl, 1-adamantylmethyl, 3-methyl-1-adamantylmethyl, tricyclo[3.3.1.0$^{3,7}$]non-3-yl and like.

Suitable examples of $R^{11}$, $R^{12}$, $R^{13}$ and $R^{14}$ include, but are not limited to, hydrogen, methyl, ethyl, propyl, isopropyl, butyl, hexyl, 2-methylbutyl, nonyl, cyclopropyl, cyclobutyl, cyclopentyl, cyclohexyl, cycloheptyl, trifluoromethyl, pentafluoroethyl, fluoro, chloro, hydroxyl, methoxy, ethoxy, cyclohexyloxy, hydroxymethyl, hydroxyethyl, methoxymethyl, methoxyethyl, ethoxyethyl, ethoxymethyl, cyclohexyloxymethyl, methoxycyclohexyl, —CH$_2$C(=O)CH$_3$, —CH$_2$C(=O)H, —CH$_2$CH$_2$C(=O)CH$_3$, —CH$_2$C(=O)-cyclohexyl, —OC(=O)H, —OC(=O)CH$_3$, —OC(=O)C$_2$H$_5$, —CH$_2$C(=O)C$_2$H$_5$ bicyclo[2.2.1]hept-2-ylcarboxylate, bicyclo[2.2.1]hept-2-acetate, cis-bicyclo[3.3.0]oct-2-ylcarboxylate or octahydropentalene-1-carboxylate, 1-adamantanecarboxylate, 3-methyl-1-adamantanecarboxylate, 3,5-dimethyl-1-adamantanecarboxylate, 1-adamantylacetate, 3-methyl-1-adamantylacetate, tricyclo[3.3.1.0$^{3,7}$]nonane-3-carboxylate, methyl(bicyclo[2.2.1]hept-2-ylcarboxylate, methyl(bicyclo[2.2.1]hept-2-acetate, methylcis-bicyclo[3.3.0]oct-2-ylcarboxylate or methyloctahydropentalene-1-carboxylate, methyl-1-adamantanecarboxylate, methyl-3-methyl-1-adamantanecarboxylate, methyl-3,5-dimethyl-1-adamantanecarboxylate, methyl-1-adamantylacetate, methyl-3-methyl-1-adamantylacetate, methyltricyclo[3.3.1.0$^{3,7}$]nonane-3-carboxylate and like. The preferred polar group is a hydroxyl or a hydroxyl containing group.

Illustrative examples of Structure (II) generating monomers include bicyclo[2.2.1]hept-5-en-2-ol, bicyclo[2.2.1]hept-5-en-2-yl acetate, bicyclo[2.2.1]hept-5-en-2-ylmethanol, bicyclo[2.2.1]hept-5-en-2-yl methyl acetate, bicyclo[2.2.1]hept-5-en-2-yl ethanol, bicyclo[2.2.1]hept-5-ene-2,3-diyl diacetate, bicyclo[2.2.1]hept-5-ene-2,3-diol, bicyclo[2.2.1]hept-5-ene-2,3-diyldimethanol, bicyclo[2.2.1]hept-5-en-2-yl ethyl acetate, bicyclo[2.2.1]hept-5-en-2,3-diyl methyl acetate, 3-chlorobicyclo[2.2.1]hept-5-en-2-yl acetate, 3-methylbicyclo[2.2.1]hept-5-en-2-yl acetate, (3-methylbicyclo[2.2.1]hept-5-en-2-yl)methyl acetate, (3-chlorobicyclo[2.2.1]hept-5-en-2-yl)methyl acetate, [3-(trichloromethyl)bicyclo[2.2.1]hept-5-en-2-yl]methyl acetate, [3-(trifluoromethyl)bicyclo[2.2.1]hept-5-en-2-yl] methyl acetate, 5-(methoxymethyl)bicyclo[2.2.1]hept-2-ene, tetracyclo[4.4.0.1$^{2,5}$.1$^{7,10}$]dodec-8-ene-3-yl-acetate, tetracyclo[4.4.0.1$^{2,5}$.1$^{7,10}$]dodec-8-ene-3-ylmethanol, tetracyclo[4.4.0.1$^{2,5}$.1$^{7,10}$]dodec-8-ene-3-ylethanol, tetracyclo[4.4.0.1$^{2,5}$.1$^{7,10}$]dodec-8-ene-3-ol, bicyclo[2.2.1]hept-5-en-2-yl bicyclo[2.2.1]heptane-2-carboxylate, bicyclo[2.2.1]hept-5-en-2-ylmethyl bicyclo[2.2.1]heptane-2-carboxylate, bicyclo[2.2.1]hept-5-en-2-yl bicyclo[2.2.1]hept-2-ylacetate, bicyclo[2.2.1]hept-5-en-2-ylmethyl bicyclo[2.2.1]hept-2-ylacetate, bicyclo[2.2.1]hept-5-en-2-yl 1-adamantylacetate, bicyclo[2.2.1]hept-5-en-2-yl adamantane-1-carboxylate, bicyclo[2.2.1]hept-5-en-2-ylmethyl 1-adamantylacetate, bicyclo[2.2.1]hept-5-en-2-ylmethyl adamantane-1-carboxylate and like. Additional monomers generating Structure II can be found in later paragraphs discussing subgeneric Structures IIa, IIb, and IIc. A functional group on the monomer unit (i.e. $R^{17}$) may be partially or completely removed after polymerization to improve polarity or assist in cross-linking for further densification of film.

The preferred monomers generating Structure (II) are bicyclo[2.2.1]hept-5-en-2-ol, bicyclo[2.2.1]hept-5-en-2-yl acetate, bicyclo[2.2.1]hept-5-en-2-ylmethanol, bicyclo[2.2.1]hept-5-en-2-ylmethylacetate, bicyclo[2.2.1]hept-5-ene-2,3-diyldimethanol, bicyclo[2.2.1]hept-5-en-2,3-diyl methyl acetate, [3-(trifluoromethyl)bicyclo[2.2.1]hept-5-en-2-yl]methyl acetate, bicyclo[2.2.1]hept-5-en-2-yl adamantane-1-carboxylate, tetracyclo[4.4.0.1$^{2,5}$.1$^{7,10}$]dodec-8-ene-3-yl-acetate, tetracyclo[4.4.0.1$^{2,5}$.1$^{7,10}$]dodec-8-ene-3-ylmethanol, tetracyclo[4.4.0.1$^{2,5}$.1$^{7,10}$]dodec-8-ene-3-ol, and 2-(tetracyclo-[4.4.0.1$^{2,5}$.1$^{7,10}$]dodec-8-ene-3-yloxy) ethanol.

The more preferred monomers generating Structure (II) are bicyclo[2.2.1]hept-5-en-2-ol, bicyclo[2.2.1]hept-5-en-2-yl acetate, bicyclo[2.2.1]hept-5-en-2-ylmethanol, bicyclo[2.2.1]hept-5-en-2-yl methyl acetate, bicyclo[2.2.1]hept-5-ene-2,3-diyldimethanol, tetracyclo[4.4.0.1$^{2,5}$.1$^{7,10}$]dodec-8-ene-3-yl-acetate and tetracyclo[4.4.0.1$^{2,5}$.1$^{7,10}$]dodec-8-ene-3-ol.

The most preferred monomers generating Structure (II) are bicyclo[2.2.1]hept-5-en-2-ol, bicyclo[2.2.1]hept-5-en-2-yl acetate, bicyclo[2.2.1]hept-5-en-2-ylmethanol, bicyclo[2.2.1]hept-5-en-2-yl methyl acetate, tetracyclo[4.4.0.1$^{2,5}$.1$^{7,10}$]dodec-8-ene-3-yl-acetate and tetracyclo[4.4.0.1$^{2,5}$.1$^{7,10}$]dodec-8-ene-3-ol.

The monomeric unit of Structure (II) increases the transparency of the cycloolefin polymer while maintaining good plasma etch resistance. In addition the polar functional group included in this monomeric unit increases compatibility with common EBR solvents. Preferred polar groups further assist in the crosslinkability of the cycloolefin polymer.

In one embodiment of Structure (II) X and Y are methylene groups as illustrated in Structure (IIa):

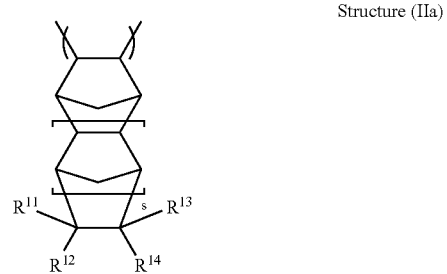

Structure (IIa)

wherein $R^{11}$, $R^{12}$, $R^{13}$, $R^{14}$, and s are defined as in Structure (II). Preferred values for $R^{11}$, $R^{12}$, $R^{13}$, $R^{14}$, and s are also as defined in Structure (II). Illustrative examples of Structure (IIa) generating monomer include, but are not limited to, bicyclo[2.2.1]hept-5-en-2-yl acetate, bicyclo[2.2.1]hept-5-en-2-ylmethanol, bicyclo[2.2.1]hept-5-en-2-yl methyl acetate, bicyclo[2.2.1]hept-5-en-2-yl ethanol, bicyclo[2.2.1]hept-5-ene-2,3-diyl diacetate, bicyclo[2.2.1]hept-5-ene-2,3-diol, bicyclo[2.2.1]hept-5-ene-2,3-diyldimethanol, [3-(trichloromethyl)bicyclo[2.2.1]hept-5-en-2-yl]methyl acetate, [3-(trifluoromethyl)bicyclo[2.2.1]hept-5-en-2-yl] methyl acetate, 5-(methoxymethyl)bicyclo[2.2.1]hept-2-ene, tetracyclo[4.4.0.1$^{2,5}$.1$^{7,10}$]dodec-8-ene-3-yl-acetate, tetracyclo[4.4.0.1$^{2,5}$.1$^{7,10}$]dodec-8-ene-3-ylmethanol, tetracyclo[4.4.0.1$^{2,5}$.1$^{7,10}$]dodec-8-ene-3-ylethanol, tetracyclo[4.4.0.1$^{2,5}$.1$^{7,10}$]dodec-8-ene-3-ol and like.

In one embodiment of Structure (IIa) s is defined as 0:

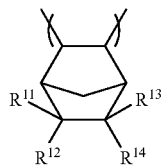

Structure (IIa-1)

wherein $R^{11}$, $R^{12}$, $R^{13}$, and $R^{14}$, are defined as in Structure (IIa). Preferred values for $R^{11}$, $R^{12}$, $R^{13}$ and $R^{14}$ are also as defined in Structure (IIa). Illustrative examples of Structure (IIa-1) generating monomer include, but are not limited to, bicyclo[2.2.1]hept-5-en-2-ol, bicyclo[2.2.1]hept-5-en-2-yl acetate, bicyclo[2.2.1]hept-5-en-2-ylmethanol, bicyclo[2.2.1]hept-5-en-2-yl methyl acetate, bicyclo[2.2.1]hept-5-en-2-yl ethanol, bicyclo[2.2.1]hept-5-ene-2,3-diyl diacetate, bicyclo[2.2.1]hept-5-ene-2,3-diol, bicyclo[2.2.1]hept-5-ene-2,3-diyldimethanol, bicyclo[2.2.1]hept-5-en-2-yl ethyl acetate, bicyclo[2.2.1]hept-5-en-2,3-diyl methyl acetate, 3-chlorobicyclo[2.2.1]hept-5-en-2-yl acetate, 3-methylbicyclo[2.2.1]hept-5-en-2-yl acetate, (3-methylbicyclo[2.2.1]hept-5-en-2-yl)methyl acetate, (3-chlorobicyclo[2.2.1]hept-5-en-2-yl)methyl acetate, [3-(trichloromethyl)bicyclo[2.2.1]hept-5-en-2-yl]methyl acetate, [3-(trifluoromethyl)bicyclo[2.2.1]hept-5-en-2-yl]methyl acetate, 5-(methoxymethyl)bicyclo[2.2.1]hept-2-ene and like.

In another embodiment of Structure (IIa) s is defined as 1:

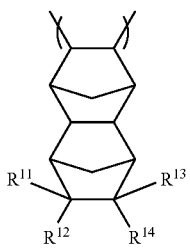

Structure (IIa-2)

wherein $R^{11}$, $R^{12}$, $R^{13}$, and $R^{14}$, are defined as in Structure (IIa). Preferred values for $R^{11}$, $R^{12}$, $R^{13}$ and $R^{14}$ are also as defined in Structure (IIa). Illustrative examples of Structure (IIa-2) generating monomer include, but are not limited to, tetracyclo[4.4.0.1$^{2,5}$.1$^{7,10}$]dodec-8-ene-3-yl-acetate, tetracyclo[4.4.0.1$^{2,5}$.1$^{7,10}$]dodec-8-ene-3-ylmethanol, tetracyclo[4.4.0.1$^{2,5}$.1$^{7,10}$]dodec-8-ene-3-ylethanol, tetracyclo[4.4.0.1$^{2,5}$.1$^{7,10}$]dodec-8-ene-3-ol and like.

In yet another embodiment of Structure (IIa) s is defined as 2:

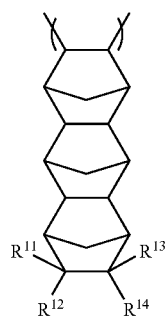

Structure (IIa-3)

wherein $R^{11}$, $R^{12}$, $R^{13}$ and $R^{14}$, are defined as in Structure (IIa). Preferred values for $R^{11}$, $R^{12}$, $R^{13}$ and $R^{14}$ are also as defined in Structure (IIa). Illustrative examples of Structure (Ia-3) generating monomer include, but are not limited to, hexacyclo[8,4,1$^{2,5}$,1$^{7,14}$,1$^{9,12}$,0$^{1,6}$,0$^{8,13}$]tetradeca-10-ene-3-ol, hexacyclo[8,4,1$^{2,5}$,1$^{7,14}$,1$^{9,12}$,0$^{1,6}$,0$^{8,13}$]tetradeca-10-ene-3-ylacetate, hexacyclo[8,4,1$^{2,5}$,1$^{7,14}$,1$^{9,12}$,0$^{1,6}$,0$^{8,13}$]tetradeca-10-ene-3-ylmethanol, hexacyclo[8,4,1$^{2,5}$,1$^{7,14}$,1$^{9,12}$, 0$^{1,6}$,0$^{8,13}$]tetradeca-10-ene-3-ylethanol, 10-methylhexacyclo[8,4,1$^{2,5}$,1$^{7,14}$,1$^{9,12}$,0$^{1,6}$,0$^{8,13}$]tetradeca-10-ene-3-ylacetatel and the like.

In another embodiment of Structure (II) X and Y are a sulfur atom as illustrated in Structure (IIb):

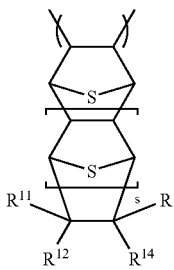

Structure (IIb)

wherein $R^{11}$, $R^{12}$, $R^{13}$, $R^{14}$, and s are defined as in Structure (II). Preferred values for $R^{11}$, $R^{12}$, $R^{13}$, $R^{14}$, and s are also as defined in Structure (II). Illustrative examples of Structure (IIb) generating monomer include, but are not limited to, 7-thiabicyclo[2.2.1]hept-5-en-2-ylmethanol, 2-(7-thiabicyclo[2.2.1]hept-5-en-2-yl)ethanol, 7-thiabicyclo[2.2.1]hept-5-en-2-ol and the like.

In yet another embodiment of Structure (II) X and Y are an oxygen atom as illustrated in Structure (IIc):

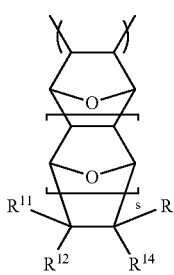

Structure (IIc)

wherein $R^{11}$, $R^{12}$, $R^{13}$, $R^{14}$, and s are defined as in Structure (II). Preferred values for $R^{11}$, $R^{12}$, $R^{13}$, $R^{14}$, and s are also as defined in Structure (II). Illustrative examples of Structure (IIc) generating monomer include, but are not limited to, 7-oxabicyclo[2.2.1]hept-5-en-2-ylmethanol, 2-(7-oxabicyclo[2.2.1]hept-5-en-2-yl)ethanol, 7-oxabicyclo[2.2.1]hept-5-en-2-ol and the like Optionally, another property enhancing repeating unit of Structure (III) can be incorporated into the cycloolefin polymer, providing further optimization of the cycloolefin polymer properties:

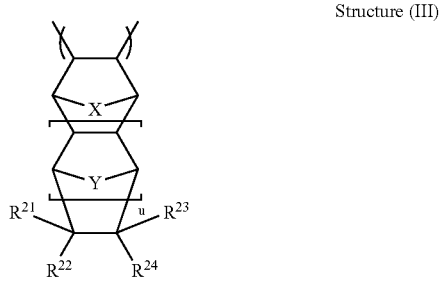

Structure (III)

subject to the proviso that Structure (III) does not contain an acid sensitive group, wherein $R^{21}$, $R^{22}$, $R^{23}$ and $R^{24}$ independently represent a hydrogen atom, a $C_1$-$C_{10}$ linear, branched or cyclic alkyl group, a $C_1$-$C_{10}$ partially or completely halogenated linear, branched or cyclic alkyl group, a $C_6$-$C_{10}$ aryl group which does not contain a hydroxyl group, a halogen atom or a polar group selected from the group consisting of —$(CH_2)_vC(O)R^{25}$, —$(CH_2)_vC(O)OR^{25}$, —$(CH_2)_vC(O)(OR^{26})_xOR^{25}$ and —$O(R^{26}O)_xR^{25}$; wherein v is an integer from 0 to about 5; x is an integer from about 1 to about 5; $R^{25}$ represents a hydrogen atom, a substituted or unsubstituted $C_1$-$C_6$ linear, branched or cyclic alkyl group or a $C_1$-$C_6$ partially or completely halogenated linear, branched or cyclic alkyl group; $R^{26}$ is a substituted or unsubstituted $C_2$-$C_6$, linear, branched or cyclic alkylene group or a $C_2$-$C_6$ partially or completely halogenated linear, branched or cyclic alkylene group, u is an integer from 0 to about 3; and X and Y have the same meaning as defined in Structure (I).

Preferred $R^{21}$, $R^{22}$, $R^{23}$ and $R^{24}$ groups include hydrogen atoms, $C_1$-$C_6$ linear, branched or cyclic alkyl groups, halogenated $C_1$-$C_6$ linear, branched or cyclic alkyl groups, halogen atoms or polar groups selected from the group consisting of —$(CH_2)_vC(O)R^{25}$, —$(CH_2)_vC(O)OR^{25}$, —$(CH_2)_vC(O)(OR^{26})_xOR^{25}$; —$O(R^{26}O)_xR^{25}$. The preferred range for x is from about 1 to about 3. The preferred range for v is from 0 to about 3.

More preferred $R^{21}$, $R^{22}$, $R^{23}$ and $R^{24}$ groups include hydrogen atoms, $C_1$-$C_2$ linear, branched or cyclic alkyl groups, halogenated $C_1$-$C_2$ linear, branched or cyclic alkyl groups, halogen atoms or polar groups selected from the group consisting of —$(CH_2)_vC(O)R^{25}$, —$(CH_2)_vC(O)OR^{25}$, —$(CH_2)_vC(O)(OR^{26})_xOR^{25}$; —$O(R^{26}O)_xR^{25}$. A more preferred value for x is 1. A more preferred v is 0 or 1.

Most preferred $R^{21}$, $R^{22}$, $R^{23}$ and $R^{24}$ groups are independently hydrogen atoms, methyl groups or polar groups selected from the group consisting of —$(CH_2)_vC(O)OR^{25}$, —$(CH_2)_vC(O)(OR^{26})_xOR^{25}$; —$O(R^{26}O)_xR^{25}$.

Suitable examples of $R^{25}$ groups include, but are not limited to, hydrogen, methyl, ethyl, propyl, butyl, hexyl, cyclopropyl, cyclobutyl, cyclopentyl, cyclohexyl, and the like. Preferably $R^{25}$ is a hydrogen atom or $C_1$-$C_4$ linear, branched or cyclic alkyl group such as methyl or ethyl. More preferably $R^{25}$ is a hydrogen atom.

Suitable examples of $R^{26}$ groups include, but are not limited to, ethylene, isopropylene, propylene, hexylene, cyclohexylene, terafluoroethylene and the like. Preferably $R^{25}$ is a $C_2$-$C_4$ substituted or unsubstituted linear, branched or cyclic alkylene group such as ethylene and isopropylene.

Suitable examples of $R^{21}$, $R^{22}$, $R^{23}$ and $R^{24}$ include, but are not limited to, hydrogen, methyl, ethyl, propyl, isopropyl, butyl, 2-methylbutyl, hexyl, nonyl, cyclopropyl, cyclobutyl, cyclopentyl, cyclohexyl, cycloheptyl, phenyl, naphthyl, —CHO, —C(O)CH$_3$, —CH$_2$C(O)H, CH$_2$C(O)CH$_3$, —COOH, —CH$_2$COOH, —CH$_2$C(O)OCH$_2$CH$_2$OH, trifluoromethyl, pentafluoroethyl, oxyethanol, —O(CH$_2$CH$_2$)$_2$OH, —C(O)OCH$_2$CH$_2$OH, fluoro-, bromo-, chloro-, and the like. The preferred examples of $R^{21}$, $R^{22}$, $R^{23}$ and $R^{24}$ are hydrogen atoms, methyl, hexyl, —CHO, —C(O)CH$_3$, COOH, oxyethanol, —C(O)OCH$_2$CH$_2$OH and —CH$_2$C(O)OCH$_2$CH$_2$OH.

Illustrative examples of Structure (III) generating monomers include but are not limited to bicyclo[2.2.1]hept-2-ene, 5-phenyl bicyclo[2.2.1]hept-2-ene, 5-(1-naphthyl) bicyclo[2.2.1]hept-2-ene, 3-methyl bicyclo[2.2.1]hept-2-ene, 3-chloro bicyclo[2.2.1]hept-2-ene, bicyclo[2.2.1]hept-5-ene-2-carboxylic acid, methyl bicyclo[2.2.1]hept-5-ene-2-carboxylate, 1-bicyclo[2.2.1]hept-5-en-2-ylethanone, 2-hydroxyethyl bicyclo[2.2.1]hept-5-ene-2-carboxylate, 2-hydroxyethyl 3-methylbicyclo[2.2.1]hept-5-ene-2-carboxylate, 2-hydroxyethyl 3-ethylbicyclo[2.2.1]hept-5-ene-2-carboxylate, 2-hydroxyethyl 3-chlorobicyclo[2.2.1]hept-5-ene-2-carboxylate, 2-hydroxyethyl 3-fluorobicyclo[2.2.1]hept-5-ene-2-carboxylate, 2-(bicyclo[2.2.1]hept-5-en-2-yloxy)ethanol, 2-[(3-chlorobicyclo[2.2.1]hept-5-en-2-yl)oxy]ethanol, 2-[(3-methylbicyclo[2.2.1]hept-5-en-2-yl)oxy]ethanol, 2-[(3-fluorobicyclo[2.2.1]hept-5-en-2-yl)oxy]ethanol, 2-(bicyclo[2.2.1]hept-5-en-2-yloxy)ethanol, 2-[(3-methylbicyclo[2.2.1]hept-5-en-2-yl)oxy]ethanol, 2-[(3-fluorolbicyclo[2.2.1]hept-5-en-2-yl)oxy]ethanol, 2-(bicyclo[2.2.1]hept-5-en-2-yloxy)ethyl acetate, 2-[(3-fluorobicyclo[2.2.1]hept-5-en-2-yl)oxy]ethyl acetate, 2-[(3-methylbicyclo[2.2.1]hept-5-en-2-yl)oxy]ethyl acetate, (tetracyclo[4.4.0.1$^{2,5}$.1$^{7,10}$]dodec-8-ene-3-yloxy)ethanol, 1-(3-methylbicyclo[2.2.1]hept-5-en-2-yl)acetone, 1-(3-chlorobicyclo[2.2.1]hept-5-en-2-yl)acetone, 1-(3-trifluoromethylbicyclo[2.2.1]hept-5-en-2-yl)acetone, 3-methylbicyclo[2.2.1]hept-5-ene-2-carboxylic acid, 3-chlorobicyclo[2.2.1]hept-5-ene-2-carboxylic acid, 3-trifluoromethylbicyclo[2.2.1]hept-5-ene-2-carboxylic acid, 3-cyanobicyclo[2.2.1]hept-5-ene-2-carboxylic acid, bicyclo[2.2.1]hept-5-ene-2,3-dicarboxylic acid, bicyclo[2.2.1]hept-5-en-2-ylacetic acid, (3-methylbicyclo[2.2.1]hept-5-en-2-yl)acetic acid, (3-chlorobicyclo[2.2.1]hept-5-en-2-yl)acetic acid, (3-trifluoromethylbicyclo[2.2.1]hept-5-en-2-yl)acetic acid and the like. The preferred monomers generating Structure (III) are bicyclo[2.2.1]hept-2-ene, bicyclo[2.2.1]hept-5-ene-2-carboxylic acid, 2-hydroxyethyl bicyclo[2.2.1]hept-5-ene-2-carboxylate, 2-(bicyclo[2.2.1]hept-5-en-2-yloxy)ethanol, 2-(bicyclo[2.2.1]hept-5-en-2-yloxy)ethyl acetate, (tetracyclo[4.4.0.1$^{2,5}$.1$^{7,10}$]dodec-8-ene-3-yloxy)ethanol and tetracyclo[4.4.0.1$^{2,5}$.1$^{7,10}$]dodec-8-ene.

In one embodiment of Structure (III) X and Y are a methylene groups as illustrated in Structure (IIIa):

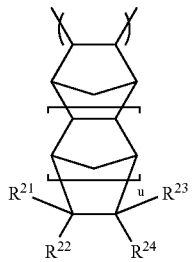

Structure (IIIa)

wherein $R^{21}$, $R^{22}$, $R^{23}$, $R^{24}$, and u are defined as in Structure (III). Preferred values for $R^{21}$, $R^{22}$, $R^{23}$, $R^{24}$, and u are also as defined in Structure (III). Illustrative examples of Structure (IIIa) generating monomer include, but are not limited to, bicyclo[2.2.1]hept-2-ene, bicyclo[2.2.1]hept-5-ene-2-carboxylic acid, methyl bicyclo[2.2.1]hept-5-ene-2-carboxylate, 1-bicyclo[2.2.1]hept-5-en-2-ylethanone, 2-hydroxyethyl bicyclo[2.2.1]hept-5-ene-2-carboxylate, 2-hydroxyethyl 3-fluorobicyclo[2.2.1]hept-5-ene-2-carboxylate, 2-(bicyclo[2.2.1]hept-5-en-2-yloxy)ethanol, 2-[(3-chlorobicyclo[2.2.1]hept-5-en-2-yl)oxy]ethanol, 2-(bicyclo[2.2.1]hept-5-en-2-yloxy)ethyl acetate, 2-[(3-fluorobicyclo[2.2.1]hept-5-en-2-yl)oxy]ethyl acetate, 2-[(3-methylbicyclo[2.2.1]hept-5-en-2-yl)oxy]ethylacetate, (tetracyclo[4.4.0.1$^{2,5}$.1$^{7,10}$]dodec-8-ene-3-yloxy)ethanol, 1-(3-methylbicyclo[2.2.1]hept-5-en-2-yl)acetone, and the like.

In one embodiment of Structure (IIIa), u is defined as 0:

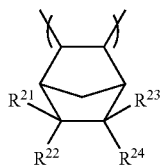

Structure (IIIa-1)

wherein $R^{21}$, $R^{22}$, $R^{23}$ and $R^{24}$ are defined as in Structure (IIIa). Preferred values for $R^{21}$, $R^{22}$, $R^{23}$ and $R^{24}$ are also as defined in Structure (IIIa). Illustrative examples of Structure (IIIa-1) generating monomer include, but are not limited to, bicyclo[2.2.1]hept-2-ene, bicyclo[2.2.1]hept-5-ene-2-carboxylic acid, methyl bicyclo[2.2.1]hept-5-ene-2-carboxylate, 1-bicyclo[2.2.1]hept-5-en-2-ylethanone, 2-hydroxyethyl bicyclo[2.2.1]hept-5-ene-2-carboxylate, 2-hydroxyethyl 3-fluorobicyclo[2.2.1]hept-5-ene-2-carboxylate, 2-(bicyclo[2.2.1]hept-5-en-2-yloxy)ethanol, 2-[(3-chlorobicyclo[2.2.1]hept-5-en-2-yl)oxy]ethanol, 2-(bicyclo[2.2.1]hept-5-en-2-yloxy)ethyl acetate, 2-[(3-fluorobicyclo[2.2.1]hept-5-en-2-yl)oxy]ethyl acetate, 2-[(3-methylbicyclo[2.2.1]hept-5-en-2-yl)oxy]ethylacetate and the like.

In another embodiment of Structure (IIIa), u is defined as 1:

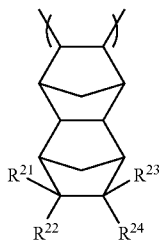

Structure (IIIa-2)

wherein $R^{21}$, $R^{22}$, $R^{23}$ and $R^{24}$ are defined as in Structure (IIIa). Preferred values for $R^{21}$, $R^{22}$, $R^{23}$ and $R^{24}$ are also as defined in Structure (IIIa). Illustrative examples of Structure (IIIa-2) generating monomer include, but are not limited to, tetracyclo[4.4.0.1$^{2,5}$.1$^{7,10}$]dodec-8-ene-3-ene, tetracyclo[4.4.0.1$^{2,5}$.1$^{7,10}$]dodec-8-ene-3-carboxylic acid, methyl tetracyclo[4.4.0.1$^{2,5}$.1$^{7,10}$]dodec-8-ene-3-carboxylate, 1'-(tetracyclo[4.4.0.1$^{2,5}$.1$^{7,10}$]dodec-8-ene-3-ylethanone, 2'-hydroxyethyl (tetracyclo[4.4.0.1$^{2,5}$.1$^{7,10}$]dodec-8-ene-3-carboxylate), 2'-hydroxyethyl 4-fluoro-(tetracyclo[4.4.0.1$^{2,5}$.1$^{7,10}$]dodec-8-ene-3-carboxylate), 2'-(tetracyclo[4.4.0.1$^{2,5}$.1$^{7,10}$]dodec-8-ene-3-yloxy)ethanol, 2'-(tetracyclo[4.4.0.1$^{2,5}$.1$^{7,10}$]dodec-8-ene-3-yloxy)ethyl acetate and the like.

In yet another embodiment of Structure (IIIa), u is defined as 2:

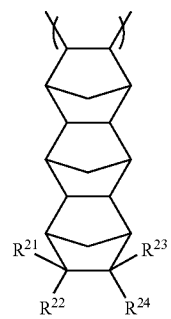

Structure IIIa-3 wherein $R^{21}$, $R^{22}$, $R^{23}$ and $R^{24}$ are defined as in Structure (IIIa). Preferred values for $R^{21}$, $R^{22}$, $R^{23}$ and $R^{24}$ are also as defined in Structure (IIIa). Illustrative examples of Structure (IIIa-3) generating monomer include, but are not limited to, hexacyclo[8,4,1$^{2,5}$,1$^{7,14}$,1$^{9,12}$,0$^{1,6}$,0$^{8,13}$]tetradeca-10-ene-3-ene, hexacyclo[8,4,1$^{2,5}$,1$^{7,14}$,1$^{9,12}$,0$^{1,6}$,0$^{8,13}$]tetradeca-10-ene-3-carboxylic acid, methyl hexacyclo[8,4,1$^{2,5}$,1$^{7,14}$,1$^{9,12}$,0$^{1,6}$,0$^{8,13}$]tetradeca-10-ene-3-carboxylate, 1'-hexacyclo[8,4,1$^{2,5}$,1$^{7,14}$,1$^{9,12}$,0$^{1,6}$,0$^{8,13}$]tetradeca-10-ene-3-ylethanone, 2'-hydroxyethyl hexacyclo[8,4,1$^{2,5}$,1$^{7,14}$,1$^{9,12}$,0$^{1,6}$,0$^{8,13}$]tetradeca-10-ene-3-carboxylate, 2'-hydroxyethyl 10-chloro hexacyclo[8,4,1$^{2,5}$,1$^{7,14}$,1$^{9,12}$,0$^{1,6}$,0$^{8,13}$]tetradeca-10-ene-3-carboxylate, 2'-(hexacyclo[8,4,1$^{2,5}$,1$^{7,14}$,1$^{9,12}$,0$^{1,6}$,0$^{8,13}$]tetradeca-10-ene-3-yloxy)ethanol, 2'-(hexacyclo[8,4,1$^{2,5}$,1$^{7,14}$,1$^{9,12}$,0$^{1,6}$,0$^{8,13}$]tetradeca-10-ene-3-yloxy)ethyl acetate, 1'-(10-methyl hexacyclo[8,4,1$^{2,5}$,1$^{7,14}$,1$^{9,12}$,0$^{1,6}$,0$^{8,13}$]tetradeca-10-ene-3-yl)acetone, hexacyclo[8,4,1$^{2,5}$,1$^{7,14}$,1$^{9,12}$,0$^{1,6}$,0$^{8,13}$]tetradeca-10-ene-3,4-dicarboxylic acid, hexacyclo[8,4,1$^{2,5}$,1$^{7,14}$,1$^{9,12}$,0$^{1,6}$,0$^{8,13}$]tetradeca-10-ene-3-ylacetic acid and the like.

In another embodiment of Structure (III) X and Y are a sulfur atom as illustrated in Structure (IIIb):

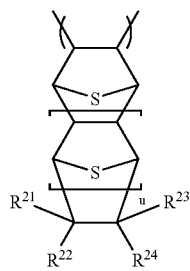

Structure (IIIb)

wherein $R^{21}$, $R^{22}$, $R^{23}$, $R^{24}$ and u are defined as in Structure (III). Preferred values for $R^{21}$, $R^{22}$, $R^{23}$, $R^{24}$, and u are also as defined in Structure (III). Illustrative examples of Structure (IIIb) generating monomer include, but are not limited to, 2-hydroxyethyl 7-thiabicyclo[2.2.1]hept-5-ene-2-carboxylate, 7-thiabicyclo[2.2.1]hept-5-ene-2-carboxylic acid, 7-thiabicyclo[2.2.1]hept-5-ene-2,3-dicarboxylic acid, 1-(3-methyl-7-thiabicyclo[2.2.1]hept-5-en-2-yl)acetone, 3-methyl-7-thiabicyclo[2.2.1]hept-5-ene-2-carboxylic acid, 3-cyano-7-thiabicyclo[2.2.1]hept-5-ene-2-carboxylic acid, 7-thiabicyclo[2.2.1]hept-5-en-2-ylacetic acid and the like.

In yet another embodiment of Structure (III) X and Y are an oxygen atom as illustrated in Structure (IIIc):

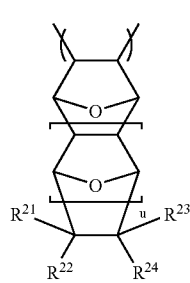

Structure (IIIc)

wherein $R^{21}$, $R^{22}$, $R^{23}$, $R^{24}$, and u are defined as in Structure (III). Preferred values for $R^{21}$, $R^{22}$, $R^{23}$, $R^{24}$, and u are also as defined in Structure (III). Examples of Structure (IIIc) include, but are not limited to, 2-hydroxyethyl 7-oxabicyclo [2.2.1]hept-5-ene-2-carboxylate, 7-oxabicyclo[2.2.1]hept-5-ene-2-carboxylic acid, 7-oxabicyclo[2.2.1]hept-5-ene-2,3-dicarboxylic acid, 1-(3-methyl-7-oxabicyclo[2.2.1]hept-5-en-2-yl)acetone, 3-methyl-7-oxabicyclo[2.2.1]hept-5-ene-2-carboxylic acid, 3-cyano-7-oxabicyclo[2.2.1]hept-5-ene-2-carboxylic acid, 7-oxabicyclo[2.2.1]hept-5-en-2-ylacetic acid and the like.

The absorbance of the cycloolefin polymer is tuned by adjusting the concentration of the individual monomeric units I, II, and III in the cycloolefin polymer, which may contain more than one example of each type of monomeric unit by the use of multiple monomers providing monomeric units of the specified structure after polymerization. It should be noted that the absorbance of a given cycloolefin polymer may be different at different wavelengths, requiring the optimization of a cycloolefin polymer for a particular wavelength of interest. Additionally, the monomeric unit choice and concentration is optimized for high etch selectivity, and compatibility with solvents.

The concentration of repeating units in the cycloolefin polymer is determined by the desired lithographic and etch properties of the Underlayer film. Typically, Structure I is incorporated into the cycloolefin polymer at about 5 to about 60 mole %. A preferred concentration of Structure I in the cycloolefin polymer is from about 10 to about 50 mole %. More preferred is a molar content of Structure I of about 10 to about 45 mole % in the cycloolefin polymer of the present disclosure. The most preferred concentration of Structure I in the cycloolefin polymer is from about 15 to about 40 mole %. The concentration of repeating units in the cycloolefin polymer having Structure II ranges from about 40 to about 95 mole %. A preferred concentration of Structure II in the cycloolefin polymer is from about 50 to about 90 mole %. More preferred is a molar content of Structure II of about 55 to about 90 mole % in the cycloolefin polymer of the present disclosure. The most preferred concentration of Structure II in the cycloolefin polymer is from about 60 to about 85 mole %

If Structure III is used in the cycloolefin polymer, then the composition of the cycloolefin polymer typical includes from about 5 to about 50 mole % of Structure I, from about 20 to about 60 mole % of Structure II and from about 20 to about 70 mole % of Structure III. Preferably the composition of the cycloolefin polymer includes from about 10 to about 45 mole % of Structure I, from about 20 to about 55 mole % of Structure II and from about 25 to about 65 mole % of Structure III when Structure III is incorporated into the cycloolefin polymer. A more preferred composition for the cycloolefin polymer that employs Structure III is about 10 to about 40 mole % Structure I, about 25 to about 55 mole % Structure II and about 30 to about 60 mole % Structure III. The most preferred composition of the cycloolefin polymer employing Structure III is about 15 mole % to about 35 mole % Structure I, about 30 to about 50 mole % Structure II and about 30 to about 55 mole % Structure III.

The cycloolefin polymers employed in the present disclosure have a weight average molecular weight (Mw) in terms of polystyrene from about 400 to about 25,000. The cycloolefin polymers with Mw in terms of polystyrene from about 400 to about 10,000 are preferred. More preferred are the cycloolefin polymers with Mw in terms of polystyrene from about 800 to about 8,000. The cycloolefin polymers with Mw of more than about 25000 become insoluble in commonly used resist solvents. The value of Mw can be determined by such standard methods as gel permeation chromatography as described, for example, in Jan Rabek, Experimental Methods in Polymer Chemistry, John Wiley&Sons, New York, 1983. The polydispersity (PDI) of the cycloolefin polymer may range from 1 to about 6. A preferred polydispersity of the cycloolefin polymer is from about 1 to about 4. A more preferred PDI range for the cycloolefin polymer is from about 1 to about 3

The cycloolefin polymers of the present disclosure are prepared by addition polymerization using a single component or multi-components catalyst system with Group VIII transition metals. Suitable Group VIII metal catalysts and synthetic procedures are disclosed in U.S. Pat. Nos. 6,232, 417, 6,265,506 and 6,455,650.

The polymerization can be performed by mixing a suitable molar ratio of monomers generating repeating units (I), (II) and optionally (III). Suitable solvents which can be used for the polymerization include, but are not limited to, hydrocarbons, such as pentane, hexane, heptane, cyclohexane, halogenated hydrocarbons, such as dichloromethane, 1,2-dichloroethane, aromatic hydrocarbons, such as toluene and xylenes, halogenated aromatic hydrocarbons, such as, chlorobenzene and o-dichlorobenzene and the like. The temperature for the polymerization with Group VIII transition metal catalysts ranges from about −10° C. to about 80° C. depending upon the nature of the catalyst.

In the next step, the cycloolefin polymer can be isolated by precipitation into a suitable non-solvent or the cycloolefin polymer solution can be diluted with a suitable alcohol solvent. Polymerization catalysts and co-catalysts are removed from the cycloolefin polymer either before or after alcoholysis using a functional resin depending on the catalyst or catalysts employed in the polymerization. Examples of alcohol solvents include, but not are limited to, methanol, ethanol, propanol, butanol, 2-methoxy propanol and the like. The cycloolefin polymer is then subjected to transesterification conditions to remove protective groups (e.g. acetoxy) from the cycloolefin polymer in a solvent mixture containing the alcohol solvent in the presence of a catalytic amount of a transesterification catalyst. The catalyst selected will not substantially react with other functional groups in the cycloolefin polymer. The catalyst is selected from the group consisting of ammonia, lithium methoxide, lithium ethoxide, lithium isopropoxide, sodium methoxide, sodium ethoxide, sodium isopropoxide, potassium methoxide, potassium ethoxide, potassium isopropoxide, cesium methoxide, cesium ethoxide, cesium isopropoxide, and combinations thereof, wherein the alkoxide anion is similar to the alcohol solvent. It is also understood that the catalyst can be an alkali metal hydroxide such as lithium hydroxide, sodium hydroxide, potassium hydroxide, cesium hydroxide and combinations thereof.

The amount of catalyst employed is from about 0.1 to about 20 mole % of acetoxy groups in the composition of the cycloolefin polymer. Preferably, the catalyst is added in a second step as a solution in the alcohol solvent. The temperature in this second step is such that the transesterified by-product ester formed can be continually removed from the reaction mixture. Such temperatures can be from about 50° C. to about 150° C. The transesterification reaction can be carried out at the reflux temperature of the alcohol solvent. The procedure of alcoholysis may be similar to those procedures disclosed in U.S. Pat. No. 6,759,483, and PCT publications WO 9957163 and WO 03089482.

In a third step, additional purification of the cycloolefin polymer can be done by treatment of the cold alcoholyzed the cycloolefin polymer solution with a preferably strongly acidic cation exchange resin such as a sulfonated styrene/divinylbenzene cation exchange resin in hydrogen ion form. The procedure used in the ion exchange resin treatment may be similar to those procedures disclosed in U.S. Pat. Nos. 5,284,930 and 5,288,850. In conjunction with the polymerization, precipitation/purification, transesterification and resin treatment steps, it is critical that all steps be conducted on an anhydrous basis, i.e. where the water level is less than about 5000 parts per million (ppm), in order to avoid possible side reactions and to provide a convenient and direct route to an Underlayer composition without having to isolate the cycloolefin polymer again. If necessary, however, the cycloolefin polymer may be isolated by precipitation from the reaction medium by addition of the reaction medium to a non-solvent for the cycloolefin polymer such as water, hexane, heptane, octane, petroleum ether, and combinations thereof.

The Underlayer composition further comprises one or more amino or phenolic cross-linking agents.

Any suitable amino or phenolic cross-linking agent may be used in the present application such as methylolated and/or methylolated and etherified guanamines, methylolated and/or methylolated and etherified melamines and the like. Examples of suitable melamine cross-linking agents are methoxyalkylmelamines such as hexamethoxymethylmelamine, trimethoxymethylmelamine, hexamethoxyethylmelamine, tetramethoxyethylmelamine, hexamethoxypropylmelamine, pentamethoxypropylmelamine, and the like. The preferred melamine cross-linking agent is hexamethoxymethylmelamine. Preferred aminocrosslinking agents are MW100LM melamine crosslinker from Sanwa Chemical Co. Ltd., Kanaxawa-ken, Japan, Cymel 303, Cymel 1171, and Powderlink 1174 from Cytec Industries, West Patterson, N.J. Examples of suitable phenolic cross-linking agents are disclosed in U.S. Pat. Nos. 5,488,182 and 6,777,161 and US Patent application 2005/0238997. 4,4'-[1,4-phenylenebis(methylidene)]bis(3,5-dihydroxymethyl phenol), 4,4'-[1,4-phenylenebis(1-ethylidene)]bis(3,5-dihydroxymethyl phenol), 4,4'-[1,4-phenylenebis(1-propylidene)]bis(3,5-dihydroxymethyl phenol), 4,4'-[1,4-phenylenebis(1-butylidene)]bis(3,5-dihydroxymethyl phenol), 4,4'-[1,4-phenylenebis(1-pentylidene)]bis(3,5-dihydroxymethyl phenol), 4,4'-[1,4-phenylenebis(1-methyl ethylidene)]bis(3,5-dihydroxymethyl phenol), 4,4'-[1,4-phenylenebis(1-ethyl propylidene)]bis(3,5-dihydroxymethyl phenol), 4,4'-[1,4-phenylenebis(1-propyl butylidene)]bis(3,5-dihydroxymethyl phenol), 4,4'-[1,4-phenylenebis(1-butyl pentylidene)]bis(3,5-dihydroxymethyl phenol), 4,4'-[1,3-phenylenebis(methylidene)]bis(3,5-dihydroxymethyl phenol), 4,4'-[1,3-phenylenebis(1-methyl ethylidene)]his (3,5-dihydroxymethyl phenol), 4,4'-[1,3-phenylenebis(1-ethyl propylidene)]bis(3,5-dihydroxymethyl phenol), 4,4'-[1,3-phenylenebis(1-propyl butylidene)]bis(3,5-dihydroxymethyl phenol) and 4,4'-[1,3-phenylenebis(1-butyl pentylidene)]bis(3,5-dihydroxymethyl phenol) are given as specific examples of hydroxymethyl-substituted polyfunctional phenols as crosslinker precursor. Crosslinkers employed in this disclosure can be purchased commercially, or prepared by hydroxymethylation or alkoxymethylation of the corresponding phenols using standard techniques known to those skilled in the art. The preferred phenol crosslinker is 4-[1-[4-[1,1-bis [4-hydroxy-3,5-bis(methoxymethyl)phenyl]ethyl]phenyl]-1-methylethyl]-2,6-bis(methoxymethyl)phenol available under the commercial name of CLR-19-MF from Honshu Chemical Industries Co. Ltd., Tokyo, Japan.

The Underlayer composition of the present disclosure further comprises one or more thermal acid generators (TAGs). TAGs useful in this disclosure are latent acid catalyst(s), which may be classified as either ionic or nonionic TAGs. For example the sulfonic esters of organic acids belong to the class of nonionic TAGs. Examples of nonionic sulfonate derivatives useful as TAGs include, but are not limited to, cyclohexyltosylate, 2-nitrobenzyl tosylate, 2-nitrobenzyl methylsulfonate, 2,6-dinitro benzyl p-toluenesulfonate, 4-dinitrobenzyl-p-toluenesulfonate, 1,2,3-tris(methane sulfonyloxy)benzene, 1,2,3-tris(methanesulfonyloxy)benzene, 1,2,3-tris(ethanesulfonyloxy)benzene, 1,2,3-tris(propanesulfonyloxy)benzene, 1,2,3-tris(trifluoromethane sulfonyloxy)benzene, 1,2,3-tris(p-toluene sulfonyloxy)benzene, 4-nitrobenzyl 9,10-dimethoxyanthracene-2-sulfonate and the like.

Suitable latent acid catalyst TAGs classified as ionic TAGs include organic acid salts represented by Structure IVa:

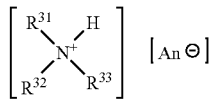

Structure IVa wherein $R^{31}$, $R^{32}$ and $R^{33}$ are independently a hydrogen atom, substituted or unsubstituted alkyl, substituted or unsubstituted cycloalkyl, substituted or unsubstituted alicyclic, partially or completely halogen substituted alkyl, substituted or unsubstituted aryl, substituted or unsubstituted alkoxy groups, or any two of $R^{31}$, $R^{32}$ and $R^{33}$ or all of $R^{31}$, $R^{32}$ and $R^{33}$ are part of a cyclic or polycyclic group which may contain an oxygen, sulfur or nitrogen hetero atom; $An^-$ is selected from the group consisting of sulfonates of substituted or unsubstituted $C_1$-$C_{12}$ alkyl, partially or completely halogen substituted $C_1$-$C_{12}$ alkyl, $C_4$-$C_{15}$ cycloalkyl, partially or completely halogen substituted $C_4$-$C_{15}$ cycloalkyl, $C_7$-$C_{20}$ alicyclic or $C_6$-$C_{20}$ aromatic groups; disulfonates of substituted or unsubstituted $C_1$-$C_{12}$ alkylene, partially or completely halogen substituted $C_1$-$C_{12}$ alkylene, $C_4$-$C_{15}$ cycloalkylene, partially or completely halogen substituted $C_4$-$C_{15}$ cycloalkylene, $C_7$-$C_{20}$ alicyclic or $C_6$-$C_{20}$ aromatic groups; sulfonamides of Structure Va

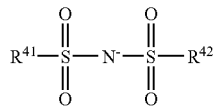

Structure Va wherein $R^{41}$ and $R^{42}$ are independently substituted or unsubstituted alkyl, substituted or unsubstituted cycloalkyl, substituted or unsubstituted alicyclic, partially or completely halogen substituted alkyl, or substituted or unsubstituted aryl groups; and methides of Structure Vb

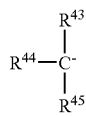

Structure Vb wherein $R^{43}$, $R^{44}$ and $R^{45}$ are independently $C_1$-$C_{10}$ perfluoroalkylsulfonyl groups.

Suitable examples of amines which can be used to generate the ammonium ion include but are not limited to tributylamine, triisobutylamine, dicyclohexylamine, N-ethyldicyclohexylamine, 1-methylpyrrolidine, 1-butylpyrrolidine, piperidine, 1-methylpiperidine, hexamethyleneimine, heptamethyleneimine, tropane, quinuclidine, 4-methyl-1-oxa-3-aza-cyclopentane, 4,4-dimethyl-1-oxa-3-aza-cyclopentane, 4,4-diethyl-1-oxa-3-aza-cyclopentane, 4,4-diisopropyl-1-oxa-3-aza-cyclopentane, 4,4-ditert-butyl-1-oxa-3-aza-cyclopentane, 4,4-dimethyl-1-oxa-3-aza-cyclohexane, 1-aza-3,7-dioxa-5-ethylbicyclo[3.3.0]octane, 1-aza-3,7-dioxa-5-methylbicyclo[3.3.0]octane, 1-aza-3,7-dioxa-5-tertbutylbicyclo[3.3.0]octane and the like. Examples of suitable TAGs of this type can be found in U.S. Pat. Nos. 3,474,054, 4,200,729, 4,251,665, and 5,187,019 herein incorporated by reference.

Another suitable type of latent acid catalyst classified as an ionic Tag are benzylammonium salts of acids represented by Structure IVb and IVc.

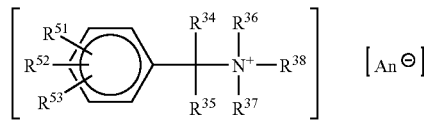

Structure IVb

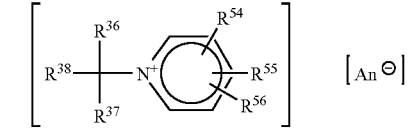

Structure IVc wherein $R^{34}$ and $R^{35}$ are independently hydrogen, alkyl or halogen group; $R^{36}$ and $R^{37}$ are independently $C_1$-$C_{10}$ alkyl or alkoxy group; $R^{38}$ is phenyl group; $R^{51}$, $R^{52}$, $R^{53}$, $R^{54}$, $R^{55}$ and $R^{56}$ are independently hydrogen, alkyl or halogen group and $An^-$ has the same meaning defined above.

Suitable examples of benzylic amines which can be used to generate the ammonium ion include, but are not limited, N-(4-methoxybenzyl)-N,N-dimethylaniline, N-(benzyl)-N,N-dimethylaniline, N-(benzyl)-N,N-dimethyltoluidine, N-(4-methylbenzyl)-N,N-dimethylaniline, N-(4-methoxybenzyl)-N,N-dimethylaniline, N-(4-chlorobenzyl)-N,N-dimethylaniline, N-(t-butylbenzyl)-dimethylpyridine and the like. The ammonium salts may also be quaternary and synthesized by other methods. Examples of this class of ionic TAG may be found in U.S. Pat. Nos. 5,132,377, 5,066,722, 6,773,474 and U.S. publication 2005/0215713, herein incorporated by reference.

The TAGS useful for this disclosure are those compounds capable of generation of free acid at the bake temperature of the films formed from the Underlayer composition. Typically these temperatures range from about 90° C. to about 250° C. Preferably the TAG will have a very low volatility at temperatures between 170-220° C. TAGs employed in this disclosure can be purchased commercially (e.g. from King Industries, Norwalk, Conn. 06852, USA), prepared by published synthetic procedures or synthetic procedures known to those skilled in the art.

The thermal acid generators described above should not be considered photoacid generators. Any sensitivity that the thermal acid generators may have to UV light should be very poor and they cannot practically be used in photolithography as a photoacid generators.

Suitable solvents for the Underlayer composition include alcohols, ketones, ethers and esters, such as 1-pentanol, 3-methoxy-1-butanol, propyleneglycol monomethyl ether (PGME), 2-heptanone, cyclopentanone, cyclohexanone, γ-butyrolactone, ethylene glycol monomethyl ether, ethylene glycol monoethyl ether, 2-methoxyethyl acetate, ethylene glycol monoethyl ether acetate (PGMEA), propylene glycol monoethyl, propylene glycol methyl ether acetate, methyl lactate, ethyl lactate, methyl 3-methoxypropionate, ethyl ethoxypropionate, methyl pyruvate, ethyl pyruvate, propyl pyruvate, N-methyl-2-pyrrolidone, ethylene glycol monoisopropyl ether, diethylene glycol monoethyl ether, diethylene glycol dimethyl ether and the like. The more preferred solvents for the Underlayer composition are 2-heptanone, propylene glycol monomethyl alcohol, propylene glycol methyl ether acetate, ethyl lactate and mixtures thereof.

The thermally curable Underlayer compositions contain on a total solids basis about 65 to about 95 wt %, preferably about 70 to about 95 wt %, and more preferably about 72 to about 95 wt % of the cycloolefin polymer. The amount of the cross-linking agent in the thermally curable Underlayer compositions on a total solids basis is from about 3 to about 30 wt %, preferably from about 3 to about 27 wt % and more preferably from about 3 to about 25 wt %. The amount of the thermal acid generator in the thermally curable Underlayer compositions is on a total solids basis from about 0.1 to about 5 wt %, preferably from about 0.2 to about 4 wt % and more preferably from about 0.2 to about 3 wt %. The amount of solid in the thermally curable Underlayer compositions is from about 2 to about 40 wt %, preferably from about 3 to about 20 wt % and more preferably from about 4 to about 15 wt %.

It should be noted that formulation and process optimization is necessary to get optimum results. For example the amount of crosslinking agent needed may vary depending on the cycloolefin polymer composition used and the Underlayer film curing temperature of the coating process. In general lower crosslinking agent concentrations may be needed with higher Underlayer film curing temperatures. The selection of the solvent system is also critical. The solvent or solvent blend needs to be compatible with the cycloolefin polymer used and also with the substrate to prevent coating defects.

Optionally the Underlayer composition may contain a surfactant or a blend of one or more surfactants. Suitable types of surfactants include, but are not limited to, nonionic surfactants, fluorine, silicon or fluorine and silicon containing surfactants.

Examples of the surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988.

Examples of non-ionic surfactants include, but are not limited to, polyoxyethylene alkyl ethers such as polyoxyethylene lauryl ether, polyoxyethylene stearyl ether, polyoxyethylene cetyl ether and polyoxyethylene oleyl ether, polyoxyethylene alkyl allyl ethers such as polyoxyethylene octyl phenol ether and polyoxyethylene nonyl phenol ether, polyoxyethylene-polyoxypropylene block copolymers, sorbitol fatty acid esters such as sorbitol monolaurate, sorbitol monopalmitate, sorbitol monostearate, sorbitol monooleate, sorbitol trioleate and sorbitol tristearate, and polyoxyethylene sorbitol fatty acid esters such as polyoxyethylene sorbitol monolaurate, polyoxyethylene sorbitol monopalmitate, polyoxyethylene sorbitol monostearate, polyoxyethylene sorbitol trioleate and polyoxyethylene sorbitol tristearate.

Commercially available fluorine containing or silicon containing surfactants include, but are not limited to, Eftop EF301, EF303 (produced by Shin-Akita Kasei K.K.), Megafac F171, F173, F176, F189, R08 (produced by Dainippon Ink & Chemicals Inc.), Surflon S-382, SC101, 102, 103, 104, 105, 106 (produced by Asahi Glass Co., Ltd.) and Troysol S-366 (produced by Troy Chemical K.K.). Polysiloxane polymer KP-341 (produced by Shin-Etsu Chemical Co., Ltd.) can also be used as the silicon-containing surfactant.

If a surfactant is employed it is added from about 0.001 to about 2 wt % and preferably from about 0.01 to about 1 wt % based on the solid content of the Underlayer composition.

The index of refraction n at the exposing wavelength of the thermally cured Underlayer film is preferably more than or equal to 1.55 and less than or equal to 1.80. More preferably n is in the range of about 1.60 to about 1.70. The most preferred n of the Underlayer film is about the same as the n of the imaging layer employed. The extinction coefficient k of the Underlayer film at the exposing wavelength is more than or equal to 0.05 and less than or equal to 0.50. A preferred k is from 0.05 to 0.39. More preferably, k is in the range from 0.1 to 0.33. A k of 0.15 to 0.29 is most preferred to provide a satisfactory antireflection effect at a film thickness of 150 nm or greater.

The thermally curable cycloolefin polymer composition of the present disclosure should not undergo significant cross-linking until it reaches a temperature of about 50° C. Significant cross-linking below 50° C. may lead to gel formation at room temperature, which will reduce its shelf life. Gel formation results in non-uniform coatings and if used in lithography, will result in poor line width control in the imaged features.

The present disclosure also relates to a photolithographic bilayer coated substrate comprising: a substrate, a film of the thermally cured Underlayer composition as described above coated on the substrate and a radiation-sensitive chemically amplified resist coated over the thermally cured Underlayer composition.

The substrate may be, for example, semiconductor materials such as a silicon wafer, compound semiconductor (III-V) or (II-VI) wafer, a ceramic, glass or quartz substrate. Said substrates may also contain films or structures used for electronic circuit fabrication such as organic or inorganic dielectrics, copper or other wiring metals.

The resist may be any suitable radiation-sensitive resist. It is typically a chemically amplified resist sensitive to radiation in the deep UV region such as those discussed in U.S. Pat. Nos. 5,492,793 and 5,747,622, which are incorporated herein by reference. Preferably, for a bilayer resist system, the radiation-sensitive resist will contain silicon to protect it from oxygen plasma etching. Examples of suitable chemically amplified resists contain an alkali solubilizing group blocked by an acid sensitive group. Examples of suitable alkali solubilizing groups include, but are not limited to, carboxylic acids, phenols, hydroxyimides, hydroxymethylimides, fluorinated alcohols and silanols. Examples of suitable blocking groups include, but are not limited to, alkyl groups containing tertiary carbons, and alpha alkoxy alkyls, and arylisopropyl groups. Examples of suitable blocked alkali solubilizing groups include, but are not limited to, t-butyl esters, alpha alkoxy esters, alpha alkoxyalkyl aromatic ethers, t-butoxyphenyl, t-butoxyimido, and t-butoxymethylimido. Examples of blocked alkali solubilizing groups can be found in U.S. Pat. Nos. 5,468,589, 4,491,628, 5,679,495, 6,379,861, 6,329,125, and 5,206,317, which are incorporated herein by reference.

Suitable polymers for the resist for the imaging layer are those which contain both silicon and blocked alkali solubilizing groups. Suitable polymers are those with silicon content of about 5 to about 30% silicon by weight. Preferred polymers are those with silicon content from about 8 to about 25% silicon by weight. Examples of suitable resist polymers can be found in U.S. Pat. Nos. 6,146,793, 6,165,682, 6,340,734, 6,028,154, 6,042,989, 5,882,844, 5,691,396, 5,731,126, 5,985,524, 6,916,543 and 6,929,897, which are incorporated herein by reference. Other suitable polymers are disclosed in U.S. Pat. Nos. 6,531,260 and 6,590,010, which are incorporated herein by reference. The silicon content may be contained in the polymer before coating as in the above references or the polymer may be silylated after coating as in U.S. Pat. Nos. 6,306,990 and 6,110,637, which are incorporated herein by reference.

The radiation-sensitive resist will also contain a photoacid generating (PAG) compound. Typically, the PAG will be present in an amount of about 1 to 10% based on the weight of the polymer.

Any suitable photoacid generator compounds may be used in the radiation sensitive resist. The photoacid generator compounds are well known and include, for example, onium salts such as diazonium, sulfonium, sulfoxonium and iodonium salts, nitrobenzylsulfonate esters, oximesulfonates, imidosulfonates and disulfones. Suitable photoacid generator compounds are disclosed, for example, in U.S. Pat. Nos. 5,558,978, 5,468,589, 5,554,664 and 6,261,738, which are incorporated herein by reference. U.S. Pat. No. 6,261,738 discloses examples of suitable oximesulfonate PAGs. Other suitable photoacid generators are perfluoroalkyl sulfonyl methides and perfluoroalkyl sulfonyl imides as disclosed in U.S. Pat. No. 5,554,664.

Suitable examples of photoacid generators are phenacyl p-methylbenzenesulfonate, benzoin p-toluenesulfonate, α-(p-toluene-sulfonyloxy)methylbenzoin, 3-(p-toluene-sulfonyloxy)-2-hydroxy-2-phenyl-1-phenylpropyl ether, N-(p-dodecylbenzenesulfonyloxy)-1,8-naphthalimide and N-(phenyl-sulfonyloxy)-1,8-napthalimide.

Examples of suitable onium salts included but are not limited to, triphenyl sulfonium bromide, triphenyl sulfonium chloride, triphenyl sulfonium iodide, triphenyl sulfonium methane sulfonate, triphenyl sulfonium trifluoromethanesulfonate, triphenyl sulfonium hexafluoropropanesulfonate, triphenyl sulfonium nonafluorobutanesulfonate, triphenyl sulfonium perfluorooctanesulfonate, triphenyl sulfonium phenyl sulfonate, triphenyl sulfonium 4-methyl phenyl sulfonate, triphenyl sulfonium 4-methoxyphenyl sulfonate, triphenyl sulfonium 4-chlorophenyl sulfonate, triphenyl sulfonium camphorsulfonate, 4-methylphenyl-diphenyl sulfonium trifluoromethanesulfonate, bis(4-methylphenyl)-phenyl sulfonium trifluoromethanesulfonate, tris-4-methylphenyl sulfonium trifluoromethanesulfonate, 4-tert-butylphenyl-diphenyl sulfonium trifluoromethanesulfonate, 4-methoxyphenyldiphenyl sulfonium trifluoromethanesulfonate, mesityl-diphenyl sulfonium trifluoromethanesulfonate, 4-chlorophenyl-diphenyl sulfonium trifluoromethanesulfonate, bis(4-chlorophenyl)-phenyl sulfonium trifluoromethanesulfonate, tris(4-chlorophenyl) sulfonium trifluoromethanesulfonate, 4-methylphenyl-diphenyl sulfonium hexafluoropropanesulfonate, bis(4-methylphenyl)-phenyl sulfonium hexafluoropropanesulfonate, tris-4-methylphenyl sulfonium hexafluoropropanesulfonate, 4-tert-butylphenyl-diphenyl sulfonium hexafluoropropane sulfonate, 4-methoxyphenyl-diphenyl sulfonium hexafluoropropane sulfonate, mesityl-diphenyl sulfonium hexafluoropropane sulfonate, 4-chlorophenyl-diphenyl sulfonium hexafluoropropane sulfonate, bis(4-chlorophenyl)-phenyl sulfonium hexafluoropropane sulfonate, tris(4-chlorophenyl) sulfonium hexafluoropropane sulfonate, 4-methylphenyl-diphenyl sulfonium perfluorooctanesulfonate, bis(4-methylphenyl)-phenyl sulfonium perfluorooctanesulfonate, tris-4-methylphenyl sulfonium perfluoroocatanesulfonate, 4-tert-butylphenyl-diphenyl sulfonium perfluorooctane sulfonate, 4-methoxyphenyl-diphenyl sulfonium perfluorooctane sulfonate, mesityl-diphenyl sulfonium perfluorooctane sulfonate, 4-chlorophenyl-diphenyl sulfonium perfluorooctane sulfonate, bis(4-chlorophenyl)-phenyl sulfonium perfluorooctane sulfonate, tris(4-chlorophenyl) sulfonium perfluorooctane sulfonate, diphenyl iodonium hexafluoropropane sulfonate, diphenyl iodonium 4-methylphenyl sulfonate, bis(4-tert-butylphenyl)iodonium trifluoromethane sulfonate, bis(4-tert-butylphenyl)iodonium hexafluoromethane sulfonate, and bis(4-cyclohexylphenyl)iodonium trifluoromethane sulfonate.

Further examples of suitable photoacid generators for use in this disclosure are bis(p-toluenesulfonyl)diazomethane, methylsulfonyl p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, 2,4-dinitrobenzyl p-trifluoromethylbenzenesulfonate.

The photoacid generator compound is typically employed in the amounts of about 0.0001 to 20% by weight of polymer solids and more preferably about 1% to 10% by weight of polymer solids.

Suitable solvents for the radiation sensitive resists for the imaging layer include ketones, ethers and esters, such as methyl ethyl ketone, methyl isobutyl ketone, 2-heptanone, cyclopentanone, cyclohexanone, 2-methoxy-1-propylene acetate, 2-methoxyethanol, 2-ethoxyethanol, 2-ethoxyethyl acetate, 1-methoxy-2-propyl acetate, 1,2-dimethoxy ethane ethyl acetate, cellosolve acetate, propylene glycol monoethyl ether acetate, propylene glycol methyl ether acetate, methyl lactate, ethyl lactate, methyl pyruvate, ethyl pyruvate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like. The solvents employed in the radiation sensitive resists for the imaging layer will be chosen with a view toward compatibility with the cycloolefin polymer in the Underlayer composition and the radiation sensitive resists for the imaging layer. For example, the choice of solvent for the radiation sensitive resist and the concentration thereof depends principally on the type of functionalities incorporated in the acid labile polymer, the photoacid generator, and the coating method. The solvent should be inert, should dissolve all the components in the resist, should not undergo any chemical reaction with the components and should be removable on drying after coating.

Additionally, base additives may be added to the radiation sensitive resist. The purpose of the base additive is to scavenge protons present in the resist prior to being irradiated by the actinic radiation. The base prevents attack and cleavage of the acid labile groups by the undesirable acids, thereby increasing the performance and stability of the resist. In addition, the base can act as a diffusion control agent to prevent the acid from migrating too far and lower resolution. The percentage of base in the composition should be significantly lower than the photoacid generator or otherwise the photosensitivity becomes too low. The preferred range of the base compounds, when present, is about 3% to 50% by weight of the photoacid generator compound. Nitrogenous bases are preferred. Suitable examples of base additives are cyclopropylamine, cyclobutylamine, cyclopentylamine, dicyclopentylamine, dicyclopentylmethylamine, dicyclopentylethylamine, cyclohexylamine, dimethylcyclohexylamine, dicyclohexylamine, dicyclohexylmethylamine, dicyclohexylethylamine, dicyclohexylbutylamine, cyclohexyl-t-butylamine, cycloheptylamine, cyclooctylamine, 1-adamantanamine, 1-dimethylaminoadamantane, 1-diethylaminoadamantane, 2-adamantanamine, 2-dimethylaminoadamantane, 2-aminonorbornene, and 3-noradamantanamine, 2-methylimidazole, tetramethyl ammonium hydroxide, tetrabutylammonium hydroxide, triisopropylamine, 4-dimethylaminopryidine, 4,4'-diaminodiphenyl ether, 2,4,5-triphenylimidazole, and 1,5-diazabicyclo[4.3.0]non-5-ene, and 1,8-diazabicyclo[5.4.0]undec-7-ene, guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, trimethylimidazole, triphenylimidazole, and methyldiphenylimidazole. However, the basic compounds should not be construed as being limited to these examples.

Dyes may be added to the resist to increase the absorption of the composition to the actinic radiation wavelength. The dye must not poison the composition and must be capable of withstanding the process conditions including any thermal treatments. Examples of suitable dyes are fluorenone derivatives, anthracene derivatives or pyrene derivatives. Other specific dyes that are suitable for radiation sensitive resists are described in U.S. Pat. No. 5,593,812.

The radiation sensitive resist may further comprise conventional additives such as adhesion promoters and surfactants. A person skilled in the art will be able to choose the appropriate desired additive and its concentration.

The Underlayer film in the bilayer stack is present at a thickness necessary to enable the lithographic patterning of the imaging layer and to provide enough protection to the substrate for its subsequent treatment (i.e. etching). Preferably the Underlayer film thickness is from about 120 nm to about 1200 nm. A more preferred Underlayer film thickness range is from about 150 nm to about 500 nm. The preferred Underlayer film thickness is from 160 nm to 300 nm.

The imaging layer thickness in the bilayer stack is optimized for lithographic performance and the need to provide oxygen plasma etch resistance for the image transfer into the Underlayer film. Preferably the imaging layer has a thickness from about 80 nm to about 500 nm. A more preferred imaging layer thickness range is from about 100 nm to about 250 nm. The preferred imaging layer thickness is from 110 nm to 170 nm.

Any suitable method to apply the Underlayer composition over the substrate and the resist for the imaging layer over the Underlayer film may be used. Coating methods include, but are not limited to, spray coating, spin coating, offset printing and the like. Coatings are then dried and/or cured in a baking step employing hot plates or various types of ovens known to those skilled in the art. More detailed coating and drying methods are described in the paragraphs below discussing the a novel process employing the bilayer stack.

This disclosure further relates to a process for forming a pattern on a substrate which comprises the following process steps:
(a) providing a substrate;
(b) coating in a first coating step said substrate with a thermally curable Underlayer composition of this disclosure;
(c) curing said Underlayer composition to provide an Underlayer film;
(d) coating in a second coating step a radiation sensitive resist over the Underlayer film;
(e) baking the radiation sensitive resist in a second baking step;
(f) exposing the bilayer resist stack to radiation;
(g) developing a portion of the radiation sensitive resist of the bilayer resist stack and uncovering a portion of the underlying Underlayer film;
(h) rinsing the bilayer resist stack; and
(i) etching the uncovered Underlayer film in oxidizing plasma to produce a bilayer relief image.

For this process, the substrates and resist are as described previously for the bilayer stack.

In the first coating step (b), the Underlayer composition may be applied uniformly to a suitable substrate by known coating methods. Coating methods include, but are not limited to spray coating, spin coating, offset printing, roller coating, screen printing, extrusion coating, meniscus coating, curtain coating, dip coating, and immersion coating.

After the first coating step, the tacky film of Underlayer composition is baked in a first bake step (c). The baking may take place at one temperature or multiple temperatures in one or more steps. Baking may take place on a hot plate or in various types of ovens known to those skilled in the art. Suitable ovens include ovens with thermal heating, vacuum ovens with thermal heating, and infrared ovens or infrared track modules. Typical times employed for baking will depend on the chosen baking means and the desired time and temperature and will be known to those skilled in the art. A preferred method of baking is on a hot plate. When baking on a hot plate employing a two step process, typical times range from about 0.5 minute to about 5 minutes at temperatures typically between about 80° C. to 130° C., followed by a cure step for about 0.5 minutes to about 5 minutes typically between about 170° C. to about 250° C. In a one step process, the Underlayer film is cured for about 0.5 minutes to about 5 minutes typically between about 170° C. to about 250° C. The Underlayer film coated substrate is then allowed to cool. Preferably, the thermally curable cycloolefin polymer composition is cured at temperatures between about 150° C. to about 250° C. and more preferably between temperatures of 180° C. to 220° C. The preferable cure times are from about 30 to 180 seconds and more preferably from about 60 to about 120 seconds. Typical film thickness may range from about 200 nm to about 1000 nm.

In a second coating step (d), the Underlayer film-coated substrate is then coated with a resist and, in a second baking step (e), baked. Coating and baking equipment described above for the Underlayer film may be employed. Typical times employed for baking will depend on the chosen baking means, the particular resist, the desired time and the desired temperature and will be known to those skilled in the art. A preferred method of baking is on a hot plate. When baking on a hot plate, typical times range from about 0.5 minute to about 5 minutes at temperatures typically between about 80° C. to about 140° C. Optimum bake parameters may vary depending on the resist and solvent employed. Typical film thickness may range from about 100 nm to about 500 nm.

For the production of relief structures, the radiation-sensitive resist is imagewise exposed to actinic radiation (f). The term 'imagewise' exposure includes both exposure through a photomask containing a predetermined pattern, exposure by means of any suitable source of actinic radiation, such as for example, a computer controlled laser beam which is moved over the surface of the coated substrate, exposure by means of computer-controlled electron beams, and exposure by means of X-rays or UV rays, through a corresponding mask. The imagewise exposure generates acid in the exposed regions of the resist which catalyzes the cleavage of the acid labile groups resulting in a polymer which is aqueous soluble.

The process described above for the production of relief structures preferably includes, as a further process measure, heating of the coating between exposure and treatment with the developer. With the aid of this heat treatment, known as "post-exposure bake", virtually complete reaction of the acid labile groups in the polymer with the acid generated by the exposure is achieved. The duration and temperature of this post-exposure bake can vary within broad limits and depend essentially on the functionalities of the polymer, the type of acid generator and on the concentration of these two components. The exposed resist is typically subjected to temperatures of about 50° C. to 150° C. for a few seconds to a few minutes. The preferred post exposure bake is from about 80° C. to 130° C. for about 5 seconds to 180 seconds. Any suitable heating means may be employed. The preferred heating means is a hot plate.

After imagewise exposure and any heat treatment of the material, the exposed areas of the resist are removed by dissolution in an aqueous base developer to generate a relief Structure (g). Examples of suitable bases include, but are not limited to, inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer.

Development can be carried out by means of immersion, spray, puddling, or other similar developing methods known to those skilled in the art at temperatures from about 10° C. to 40° C. for about 30 seconds to about 5 minutes with or without agitation. After development, the relief pattern may be optionally rinsed with a rinse comprising de-ionized water or comprising de-ionized water containing one or more surfactants and dried by spinning, baking on a hot plate, in an oven, or other suitable means.

The radiation-sensitive resist used for the imaging layer of the bilayer process described above will typically contain silicon or have silicon incorporated into the resist after development. After images are formed in the imaging layer, the imaged substrate will be placed in a plasma-etching environment comprising oxygen so that the Underlayer film will be removed in the area uncovered by the removal of resist. This operation is carried out by gas plasma etching using the pattern of the above-mentioned imaging layer as a mask, thereby forming a micro pattern. Etch gas mixtures for plasma etching organic ARC materials or Underlayer films are disclosed in U.S. Pat. Nos. 5,773,199; 5,910,453; 6,039,888; 6,080,678; and 6,090,722. Of these, the '199 patent discloses a gas mixture of $CHF_3+CF_4+O_2+Ar$; the '453 patent discloses gas mixtures of $N_2+He+O_2$ or $N_2+O_2$ or $N_2+He$; the '888 discloses a gas mixture of $O_2+CO$; the '678 patent discloses a gas mixture of $O_2+SO_2$; and the '722 patent discloses a gas mixture of $C_2F_6+Ar$. The silicon incorporated in the radiation-sensitive resist forms silicon dioxide when exposed to oxygen plasma and protects the resist from being etched so that relief structures can be formed in the Underlayer film.

After the oxygen plasma step, the substrate carrying the bilayer relief structure is generally subjected to at least one further treatment step, which changes the substrate in areas not covered by the bilayer coating (i). Typically, this can be implantation of a dopant, deposition of another material on the substrate or etching of the substrate. This is usually followed by the removal of the resist coating from the substrate typically by a fluorine/oxygen plasma etch.

This disclosure is illustrated by, but not limited to, the following examples in which the parts and percentages are by weight unless otherwise specified.

General Analytical Methods for Analysis of Polymers

Molecular weight (Mw) and molecular weight distribution data were measured by Gel Permeation Chromatography (GPC) using a Waters Corp. liquid chromatograph equipped with Millennium GPC V software, refractive index detection, 4 GPC Columns and guard column from Phenomenex (Phenogel-10 $10^4$, 500, 100, & 50 Å (all 7.8 mm ID×300 mm) and Phenogel-10 guard column 7.8×50 mm), using tetrahydrofuran (THF) eluent and polystyrene calibration. Thermal decomposition measurements (TGA) were performed using a Perkin-Elmer TGA-7 thermal gravimetric analyzer at a heating rate of 10° C./minute. Glass transition temperatures (Tg) were determined using a Perkin-Elmer Pyris −1 differential scanning calorimeter at a heating rate of 10° C./minute. The Structure and composition data were determined with $^1H$ and $^{13}C$ NMR spectrometry using a Bruker Advance 400 MHz nuclear magnetic resonance spectrometer.

General Procedure for Complete Methanolysis of Acetoxy Group Containing Cycloolefin Polymers Solid cycloolefin polymer was received from a commercial supplier following custom synthesis using a Group VIII transition metal catalyst as described in U.S. Pat. Nos. 6,232,417, 6,265,596 and 6,455,650. The solid cycloolefin polymer was dissolved (25 wt %) in a 3/1 THF/methanol mixture (w/w) in a 3 necked round bottom flask outfitted with a Dean-Stark trap and temperature probe. Then, 19 g of sodium methoxide in methanol (25 wt %) per 100 g of solid cycloolefin polymer were added to the flask containing the cycloolefin polymer solution. The reaction mixture was refluxed for 7.5 hours, the solvent was removed continuously by azeotropic distillation using a Dean-Stark trap and the same volume of methanol was added to the flask. The completion of the reaction was confirmed by IR (disappearance of peak at >1720 $cm^{-1}$) and $^{13}C$ NMR (disappearance of peak at ~120-122 ppm and presence of peak ~115-116 ppm, meta C to OH). The solution was then cooled to room temperature and the solution was transferred to a bottle.

Then, methanol washed and dried Amberlyst 15 resin (1 g per gram of solid cycloolefin polymer) was added to the cycloolefin polymer solution. The mixture was rolled for 12 hours. The solution was filtered through a plastic Buckner funnel with Ashless Grade 41 filter paper into a reduced trace metals clean bottle. The solution was then precipitated into distilled water (20 ml of water per gram of solid cycloolefin polymer) containing hydrochloric acid (4 ml of concentrated electronic grade HCl per 100 g of solid cycloolefin polymer) by slow addition using a pump. Subsequently the solid was collected by filtering the slurry with Ashless Grade 41 filter paper in a plastic Buckner funnel and washed with 4 ml deionized water per gram of solid. The wet cake was transferred to a round bottom flask using a large funnel. The funnel was washed with 10 ml of propylene glycol monomethyl ether (PGME) per gram of solid cycloolefin polymer. The cycloolefin polymer was dissolved at 50-60° C. and the solution was distilled under vacuum (~400 mbar) for 3 hours to remove most of the water azeotropically. The solution was cooled to room temperature and then more PGME was added to the flask (~30 ml per gram of solid cycloolefin polymer used) and distilled under vacuum (~200 mbar) for 3 hours and then cooled to room temperature and transferred to a bottle. The final cycloolefin polymer solution was adjusted to about 20 wt % cycloolefin polymer by adding additional PGME. The water content was analyzed by Karl Fisher titrator (target <0.5 wt %). The typical recovery was about 72% based on solid cycloolefin polymer used.

General Procedure for Partial Methanolysis of Acetoxy Group Containing Cycloolefin Polymers (Phenolic Acetoxy Group)

Solid cycloolefin polymer was received from a commercial supplier following custom synthesis using a Group VII transition metal catalyst as described in U.S. Pat. Nos. 6,232,417, 6,265,596 and 6,455,650. The solid cycloolefin polymer was dissolved (25 wt %) in a 3/1 THF/methanol mixture (w/w) in a 3 necked round bottom flask outfitted with a Dean-Stark trap and temperature probe. Then, a molar amount of sodium methoxide in methanol (25 wt %) equivalent to 5% of the moles of acetoxy groups present in the cycloolefin polymer per 100 grams of solid cycloolefin polymer were added to the flask containing the cycloolefin polymer solution. The reaction mixture was refluxed for 5 hours, the solvent was removed continuously by azeotropic distillation using a Dean-Stark trap and the same volume of methanol was added to the flask. The completion of reaction was confirmed by $^{13}$C NMR (disappearance of peak at ~120-122 ppm and presence of peak ~115-116 ppm, meta C to OH). The solution was then cooled to room temperature and the solution was transferred to a bottle.

The remaining work-up process was followed as described above for the complete methanolysis of cycloolefin polymers.

General Procedure for Measurement of Optical Constants n and k

The n&k 1200 analyzer from n&k Technologies was used to determine the optical film constants n and k of the thermally curable Underlayer film. A 4 inch silicon wafer was spin coated with a thermally curable Underlayer composition and post apply baked at 205° C. to 250° C. for 90 seconds giving a 1600 Å film thickness. A clean 4 inch bare silicon wafer was used for baseline reflectance measurement. Then, the reflectance spectrum (R) of the cured film was measured in the range of 190-900 nm on the n&k Analyzer 1200 tool using a DUV, Visible and NIR sources. n and k values of the film at 193 nm were calculated from the reflectance spectrum by software provided by the tool maker with a very high goodness fit. The software utilizes the Forouhi-Bloomer formulation model described in U.S. Pat. No. 4,905,170 for determining the optical constants n(λ) and k(λ).

General Procedure for Formulation Example

In an amber bottle, a cycloolefin polymer solution prepared by the General Procedure for Methanolysis of Polymers and Trace Metal Reduction (diluted with PGME to a 10 wt % polymer content), 16.26 wt % Crosslinker solution in PGMEA, 25.4 wt % TAG solution in PGME and solvent to adjust the solid content of the formulation were mixed. The mixture was then rolled overnight, and the Underlayer composition was filtered through a 0.20 μm Teflon filter.

General Process for Lithographic Evaluations

To lithographically evaluate the formulation, silicon wafers were spin coated with a thermally curable Underlayer composition and post apply baked (dried and cured) at 205° C. to 250° C. for 90 seconds resulting in a 1600 Å film thickness.

A silicon containing radiation sensitive resist was prepared by mixing 27.67 g of a polymer (20 wt % solution of poly{maleic anhydride-allyltrimethylsilane-tert-butylacrylate-3-(3,5,7,9,11,13,15-heptaethylpentacyclo[9.5.1.1$^{3,9}$.1$^{5,15}$.1$^{7,13}$]octasiloxan-1-yl)propyl methacrylate} copolymer in propylene glycol methyl ether acetate or PGMEA), 25.2 g of PAG 1 (15 wt % solution of triphenylsulfonium tris(trifluoromethylsulfonyl)methide in PGMEA), 0.33 g PAG 2 (15 wt % solution of diphenyl(2,4,6-trimethylphenyl)sulfonium perfluorooctanesulfonate in PGMEA), 7.58 g of a base (0.5 wt % solution of 1,8-diazabicyclo[5.4.0]undec-7-ene (DBU) in PGMEA), 14.9 g PGMEA and 47.0 g 2-heptanone. The resulting mixture was filtered through 0.1 μm Teflon filter. The polymer and its synthesis procedure is described in U.S. Pat. No. 6,916,543 in Polymer Example 16. The synthesis procedure for PAG 1 is described in U.S. Pat. No. 5,554,664.

The silicon containing radiation sensitive resist formulation from the preceding paragraph was coated over the Underlayer film, softbaked at 125° C. for 90 seconds resulting in film thickness of 1300 Å. The coated wafers were then exposed through a 6% attenuated phase-shift reticle using an ASML/1100 scanner with a numerical aperture of 0.75 and 0.92/0.72 C-Quad Illumination to print dense trenches. The exposed wafers were post exposure baked at 105° C. for 90 seconds and wafers were puddle developed with a 2.38% aqueous tetramethylammonium hydroxide(TMAH) solution for 30 seconds and rinsed with de-ionized water. Pattern fidelity of the 80 nm trenches at 1:1 pitch was then examined with a Hitachi cross sectional SEM for profile. The wafers were examined top-down with the CD SEM KLA eCD2 for depth of focus (DOF) and exposure latitude (EL).

Synthesis Example 1-15

Cycloolefin polymers P-1 to P-15, P-19 and P-20 were prepared according to the general procedure for complete methanolysis of cycloolefin polymers. The composition of the cycloolefin polymers and analytical data are presented in Table 1.

Synthesis Example 16-18

Cycloolefin polymers P-16 to P-18 were prepared according to the general procedure for partial methanolysis of cycloolefin polymers. The composition of the cycloolefin polymers and analytical data are presented in Table 1.

TABLE 1

Composition and Analyticals of Cycloolefin polymer

| Cycloolefin polymer | Composition | Mole Ratio M | Unprotected Cycloolefin polymer W | PDI | TGA (5% Wt loss) | Tg (° C.) |
|---|---|---|---|---|---|---|
| P-1 | NBPhOH-NBMeOH | 53/47 | 10200 | 2.84 | 350 | ND |
| P-2 | NBPhOH-NBMeOH | 27/73 | 8010 | 2.19 | — | — |
| P-3 | NBPhOH-NBMeOH | 32/68 | 5920 | 2.17 | — | — |
| P-4 | NBPhOH-TDOH | 30/70 | 3340 | 2.32 | — | — |
| P-5 | NBPhOH-NBMeOH-HEANB | 30/28/42 | 9480 | 2.15 | — | — |
| P-6 | NBPhOH-NBMeOH-HEENB | 34/29/37 | 9700 | 2.23 | — | — |
| P-7 | NBPhOH-TDOH | 26/74 | 9150 | 1.43 | 350 | — |
| P-8 | NBPhOH-TDOH | 26/74 | 15000 | 1.48 | — | — |
| P-9 | NBPhOH-NBMeOH | 47/53 | 9320 | 2.64 | — | — |
| P-10 | NBPhOH-NBMeOH | 46/54 | 2060 | 1.96 | | 180 |
| P-11 | NBPhOH-TDOH | 26/74 | 8600 | 1.49 | | |
| P-12 | NBPhOH-TDOH | 14/86 | 8530 | 1.47 | — | — |
| P-13 | NBPhOH/TDOH/TD | 25/15/60 | 10860 | 2.0 | | |
| P-14 | NBPhOH/TDOH/TD | 25/35/40 | 7130 | 1.6 | | |
| P-15 | NBPhOH/TDOH/TD | 25/55/20 | 7250 | 1.6 | | |
| P-16 | NBPhOH-NBMeOAc | 27/73 | 8010 | 2.19 | — | — |
| P-17 | NBPhOH-NBMeOAc | 32/68 | 5920 | 2.17 | — | — |
| P-18 | NBPhOH-TDOAc | 30/70 | 3340 | 2.32 | — | — |
| P-19 | NBPhOH-TDOH | 25/75 | 6740 | 1.41 | | |
| P-20 | NBPhOH-NBMeOH | 46/54 | 1680 | 1.81 | | |

NBMeOH: 5-norbornene-2-methanol,
NBMeOAc: 5-norbornene-2-methyl acetate,
TD: tetracyclo[4.4.0.1$^{2,5}$.1$^{7,10}$]dodec-8ene;
TDOH: tetracyclo[4.4.0.1$^{2,5}$.1$^{7,10}$]dodec-3-en-8-ol;
TDOAc: tetracyclo[4.4.0.1$^{2,5}$.1$^{7,10}$]dodec-3-en-8-yl acetate;
HEANB: 2'-hydroxyethyl 5-norbornene-2-carboxylate;
HEENB: 2'-(5-norbornene-2-methoxy)ethanol;
NBPhOH: 4'-bicyclo[2.2.1]hept-5-en-2-ylphenol.

Synthesis Example 21-28

The general synthetic approach described in U.S. Pat. No. 6,232,417 (Example 1) is followed to prepare the base polymer before methanolysis. The reaction is allowed to run for 16 hours. The general methanolysis procedure is followed to remove the acetate groups. This yields polymers P-21 to P-28 (composition see Table 2)

TABLE 2

Composition of Polymers P-21 to P28

| Cycloolefine Polymer | Structure I Type | Structure II Type | Mole Ratio |
|---|---|---|---|
| P-21 | 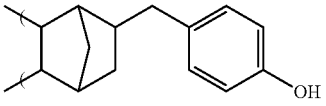 | | 30/70 |
| P-22 | | | 30/70 |
| P-23 | | | 30/70 |
| P-24 | | | 30/70 |

TABLE 2-continued

Composition of Polymers P-21 to P28

| Cycloolefine Polymer | Compositions Structure I Type | Structure II Type | Mole Ratio |
|---|---|---|---|
| P-25 | (bicyclic structure with CH2-phenyl-OH) | (tricyclic structure with OH) | 30/70 |
| P-26 | | | 30/70 |
| P-27 | | | 30/70 |
| P-28 | | | 30/70 |

Formulation Examples 1-36

Formulations were prepared according to the General Procedure for Formulation Examples. The cycloolefin polymer used in Formulation Example 26 was a 10% solution in PGMEA and the cycloolefin polymers used in Formulation Examples 22 and 23 were a 10% solution in cyclohexanone (CyHex) instead of PGME. Compositions are listed in Table 3.

Formulation Examples 37-44

Formulations are prepared according to the General Procedure for Formulation Examples. Compositions are listed in Table 3.

TABLE 3

Formulation Examples Compositions

| Form. Ex. | Cycloolefin polymer (solution, g) | Crosslinker (solution, g) | TAG (solution, g) | Solvent 1 (g) | Solvent 2 (g) | Cycloolefin polymer/XL/TAG (wt % of solids) |
|---|---|---|---|---|---|---|
| 1 | P-1 (9.48) | CLR-19-MF (1.48) | 2168E (0.05) | PGME (8.35) | PGMEA (0.64) | 79/20/1 |
| 2 | P-1 (8.39) | CLR-19-MF (2.21) | 2474 (0.005) | PGME (9.37) | PGMEA (0.03) | 69.9/30/0.1 |
| 3 | P-1 (6.99) | CLR-19-MF (1.85) | 2168E (0.004) | PGME (10.81) | PGMEA (0.35) | 69.9/20/0.1 |
| 4 | P-1 (5.99) | CLR-19-MF (2.46) | 2168E (0.01) | PGME (11.70) | PGMEA (0.16) | 59.8/40/0.2 |
| 5 | P-16 (19.75) | CLR-19-MF (3.08) | 2168E (0.10) | PGME (24.90) | PGMEA (2.17) | 79/20/1 |
| 6 | P-3 (19.75) | CLR-19-MF (3.08) | 2168E (0.10) | PGME (24.90) | PGMEA (2.17) | 79/20/1 |
| 7 | P-4 (19.75) | CLR-19-MF (3.08) | 2168E (0.10) | PGME (24.90) | PGMEA (2.17) | 79/20/1 |
| 8 | P-5 (19.75) | CLR-19-MF (3.08) | 2168E (0.10) | PGME (24.90) | PGMEA (2.17) | 79/20/1 |
| 9 | P-6 (19.75) | CLR-19-MF (3.08) | 2168E (0.10) | PGME (24.90) | PGMEA (2.17) | 79/20/1 |
| 10 | P-7 (5.93) | CLR-19-MF (0.92) | 2168E (0.03) | PGME (7.47) | PGMEA (0.65) | 79/20/1 |
| 11 | P-7 (6.68) | CLR-19-MF (0.46) | 2168E (0.03) | PGME (6.80) | PGMEA (1.04) | 89/10/1 |
| 12 | P-8 (6.43) | CLR-19-MF (0.62) | 2168E (0.03) | PGME (7.02) | PGMEA (0.90) | 85.7/13.4/0.9 |
| 13 | P-8 (17.04) | CLR-19-MF (1.00) | 2168E (0.07) | PGME (18.57) | PGMEA (2.97) | 90.6/8.5/0.9 |
| 14 | P-9 (43.45) | CLR-19-MF (6.77) | 2168E (0.22) | PGME (54.78) | PGMEA (4.78) | 79/20/1 |
| 15 | P-9 (8.90) | CLR-19-MF (0.62) | 2168E (0.04) | PGME (9.06) | PGMEA (1.38) | 89/10/1 |
| 16 | P-9 (9.40) | CLR-19-MF (0.31) | 2168E (0.04) | PGME (8.61) | PGMEA (1.64) | 94/5/1 |
| 17 | P-9 (9.60) | CLR-19-MF (0.18) | 2168E (0.04) | PGME (8.43) | PGMEA (1.75) | 96/3/1 |
| 18 | P-9 (9.60) | PL (0.18) | 2168E (0.04) | PGME (8.43) | PGMEA (1.75) | 96/3/1 |
| 19 | P-9 (9.60) | CYMEL1171 (0.18) | 2168E (0.04) | PGME (8.43) | PGMEA (1.75) | 96/3/1 |

TABLE 3-continued

Formulation Examples Compositions

| Form. Ex. | Cycloolefin polymer (solution, g) | Crosslinker (solution, g) | TAG (solution, g) | Solvent 1 (g) | Solvent 2 (g) | Cycloolefin polymer/XL/ TAG (wt % of solids) |
|---|---|---|---|---|---|---|
| 20 | P-10 (5.93) | CLR-19-MF (0.92) | 2168E (0.03) | PGME (7.47) | PGMEA (0.65) | 79/20/1 |
| 21 | P-11 (148.13) | CLR-19-MF (23.06) | 2168E (0.74) | PGME (74.26) | PGMEA (3.81) | 79/20/1 |
| 22 | P-13 (29.63) | CLR-19-MF (4.61) | 2168E (0.15) | CyHex (14.85) | PGMEA (0.76) | 79/20/1 |
| 23 | P-14 (12.64) | CLR-19-MF (1.97) | 2168E (0.06) | CyHex (5.14) | PGMEA (0.19) | 79/20/1 |
| 24 | P-15 (11.06) | CLR-19-MF (1.72) | 2168E (0.06) | PGME (6.74) | PGMEA (0.42) | 79/20/1 |
| 25 | P-12 (11.85) | CLR-19-MF (1.85) | 2168E (0.06) | PGME (5.94) | PGMEA (0.30) | 79/20/1 |
| 26 | P-17 (23.70) | CLR-19-MF (3.69) | 2168E (0.12) | — | PGMEA (22.49) | 79/20/1 |
| 27 | P-18 (19.75) | CLR-19-MF (3.08) | 2168E (0.10) | PGME (24.90) | PGMEA (2.17) | 79/20/1 |
| 28 | P-20 (0.198) | CLR-19-MF (0.50) | 2181 (0.003) | PGME (4.75) | — | 79/20/1 |
| 29 | P-20 (0.198) | CLR-19-MF (0.50) | CXC1614 (0.003) | PGME (4.75) | — | 79/20/1 |
| 30 | P-20 (0.223) | CLR-19-MF (0.025) | 2168E (0.003) | PGME (4.75) | — | 89/10/1 |
| 31 | P-20 (0.223) | PL-Pr-Me (0.025) | 2168E (0.003) | PGME (4.75) | — | 89/10/1 |
| 32 | P-20 (0.223) | PL-Ph-Me (0.025) | 2168E (0.003) | PGME (4.75) | — | 89/10/1 |
| 33 | P-20 (0.198) | CLR-19-MF (0.50) | 2168E (0.003) | n-Pentanol (4.75) | — | 79/20/1 |
| 34 | P-19 (0.198) | CLR-19-MF (0.50) | 2168E (0.003) | n-Pentanol (4.75) | — | 79/20/1 |
| 35 | P-20 (0.198) | CLR-19-MF (0.50) | 2168E (0.003) | 3-Methoxy-1-butanol (4.75) | — | 79/20/1 |
| 36 | P-19 (0.198) | CLR-19-MF (0.50) | 2168E (0.003) | 3-Methoxy-1-butanol (4.75) | — | 79/20/1 |
| 37 | P-21 (19.75) | CLR-19-MF (3.08) | 2168E (0.10) | PGME (24.90) | PGMEA (2.17) | 79/20/1 |
| 38 | P-22 (19.75) | CLR-19-MF (3.08) | 2168E (0.10) | PGME (24.90) | PGMEA (2.17) | 79/20/1 |
| 39 | P-23 (19.75) | CLR-19-MF (3.08) | 2168E (0.10) | PGME (24.90) | PGMEA (2.17) | 79/20/1 |
| 40 | P-24 (19.75) | CLR-19-MF (3.08) | 2168E (0.10) | PGME (24.90) | PGMEA (2.17) | 79/20/1 |
| 41 | P-25 (19.75) | CLR-19-MF (3.08) | 2168E (0.10) | PGME (24.90) | PGMEA (2.17) | 79/20/1 |
| 42 | P-26 (19.75) | CLR-19-MF (3.08) | 2168E (0.10) | PGME (24.90) | PGMEA (2.17) | 79/20/1 |
| 43 | P-27 (19.75) | CLR-19-MF (3.08) | 2168E (0.10) | — | — | 79/20/1 |
| 44 | P-28 (19.75) | CLR-19-MF (3.08) | 2168E (0.10) | — | — | 79/20/1 |

CLR-19-MF is an alkoxymethylphenyl derivative crosslinker from Honshu Chemical Industries Co. Ltd, Japan; Cymel 1171 a methylated-ethylated glycoluril and Powderlink 1174 (PL) a methoxymethyl glycoluril, both are crosslinkers from Cytec Industries Inc, USA;
PL-Pr-Me is 7-Methyl-8-propyl-1,3,4,6-tertrakis(methoxymethyl) glycoluril and PL-Ph-Me is 7-Methyl-8-phenyl-1,3,4,6-tertrakis(methoxymethyl) glycoluril, both crosslinkers obtained from Daychem Industries, USA;
TAG 2168E, a dodecylbenzene sulfonic acid salt, TAG 2474, a dinonylnaphthalene disulfonic acid salt, TAG 2181, a covalent polymeric material and CXC-1614 a quaternary ammonium triflate are commercial thermal acid generators from King Industries Inc, USA.

Comparative Formulation Example 1

For 50 g of Underlayer composition in a 60 ml amber bottle, 1.975 g of polymer (NISSO PHS VP 9000), 3.08 g (16.26% solution in PGMEA) of CLR-19-MF cross linker, 0.10 g of TAG 2168E (25.4% solution in PGME), 44.85 g of PGMEA were mixed. The mixture was then rolled overnight, and the Underlayer composition was filtered through a 0.20 μm filter.

Comparative Formulation Example 2

For 50 g of Underlayer composition in a 60 ml amber bottle, 5.64 g of polymer solution (35.19 wt % solid, STD 6500 NOVOLAK: copolymer of m-cresol and p-cresol), 3.08 g (16.26% solution in PGMEA) of CLR-19-MF cross linker, 0.10 g of TAG 2168E (25.4% solution in PGME), 41.17 g of PGMEA were mixed. The mixture was then rolled overnight, and the Underlayer composition was filtered through a 0.20 μm filter.

Examples 1-25

193 nm Lithographic Evaluation

Formulation Examples 1-25 were processed according to the General Process for Lithographic Evaluations and formulations 1-10, 14 and 18-25 were processed according to General Procedure for Measurement of Optical Constants n and k. Results are listed in Table 3 below. Underlayer films in Examples 1-11, 24 and 25 were post apply baked at 205° C., Examples 12-16 at 250° C. and Examples 17-23 at 230° C. The photospeed (dose to size a 80 nm lines and spaces (L/S) at 1:1 pitch) were between 30 and 39 mJ/cm$^2$ for those examples that were lithographically evaluated.

TABLE 4

Summary of Results for Lithographic Examples 1-25

| Litho. Example | Form. Ex. | Refractive Index at 193 nm n | k | DOF (μm) | EL CD) (%) | Comment |
|---|---|---|---|---|---|---|
| 1 | 1 | 1.561 | 0.474 | 0.6 | 18.8 | Vertical, clean profiles |
| 2 | 2 | 1.557 | 0.481 | 0.6-0.65 | 17.5 | Vertical, clean profiles |
| 3 | 3 | 1.729 | 0.317 | 0.6 | 17.3 | Vertical, clean profiles |
| 4 | 4 | 1.745 | 0.319 | 0.5-0.6 | 17.3 | Vertical, clean profiles |
| 5 | 5 | 1.66 | 0.33 | 0.55-0.6 | 18.5 | Vertical, clean profiles |
| 6 | 6 | 1.663 | 0.338 | 0.6 | 15.5 | Vertical, clean profiles |
| 7 | 7 | 1.68 | 0.33 | 0.65 | 20.8 | Vertical, clean profiles |
| 8 | 8 | 1.68 | 0.31 | 0.5 | 17.2 | Vertical, clean profiles |
| 9 | 9 | 1.66 | 0.3 | 0.7 | 18.1 | Vertical profiles, Slight scum in trenches |
| 10 | 10 | 1.684 | 0.305 | 0.7 | — | Vertical, clean profiles |
| 11 | 11 | — | — | 0.6 | — | Vertical profiles, Slight scum in trenches |
| 12 | 14 | — | — | 0.65 | — | Vertical, clean profiles |
| 13 | 15 | — | — | 0.55 | — | Vertical, clean profiles |
| 14 | 16 | 1.49 | 0.494 | 0.65 | — | Vertical, clean profiles |
| 15 | 17 | — | — | 0.5 | — | Vertical, clean profiles |
| 16 | 18 | — | — | 0.5 | — | Vertical profiles, Slight scum in trenches |
| 17 | 19 | — | — | 0.45 | — | Vertical profiles, Slight scum in trenches |
| 18 | 20 | 1.637 | 0.428 | 0.6-0.65 | — | Vertical profiles, Slight scum in trenches |
| 19 | 21 | 1.657 | 0.291 | 0.65-0.7 | — | Clean, sloped profiles |
| 20 | 22 | 1.733 | 0.225 | 0.4 | — | Vertical, clean profiles, some coating defects |
| 21 | 23 | 1.669 | 0.287 | 0.5 | — | Vertical, clean profiles, some coating defects |
| 22 | 24 | 1.654 | 0.269 | 0.4 | — | Vertical, clean profiles |
| 23 | 25 | 1.65 | 0.249 | 0.6 | — | Vertical, clean profiles |
| 24 | 26 | 1.598 | 0.241 | — | — | |
| 25 | 27 | 1.68 | 0.33 | — | — | |

DOF and EL were measured for +/−10% of target CD

As seen from Table 4, the Underlayer compositions of the present disclosure have a tunable k to provide a satisfactory antireflection effect for the underlayer film at a film thickness of 160 nm.

Example 26

193 nm Lithographic Evaluation

Formulation Example 12 is processed according to the General Process for Lithographic Evaluations. The Underlayer film is post apply baked at 230° C. 80 nm L/S are printed with clean vertical profiles.

Example 27

193 nm Lithographic Evaluation

Formulation Example 13 is processed according to the General Process for Lithographic Evaluations. The Underlayer film is post apply baked at 230° C. 80 nm L/S are printed with clean vertical profiles.

Example 28

193 nm Lithographic Evaluation

Formulation Example 26 is processed according to the General Process for Lithographic Evaluations. The Underlayer film is post apply baked at 230° C. 80 nm L/S are printed with clean vertical profiles.

Example 29

Lithographic Evaluation

Formulation Example 27 is processed according to the General Process for Lithographic Evaluations. The Underlayer film is post apply baked at 230° C. 80 nm L/S are printed with clean vertical profiles.

Example 30-44

193 nm Lithographic Evaluation

Formulation Examples 28-42 are processed according to the General Process for Lithographic Evaluations. The Underlayer films are post apply baked at 205° C. 80 nm L/S are printed with clean vertical profiles.

Examples 45-46

248 nm Lithographic Evaluation

Formulation Examples 43 and 44 are coated onto silicon wafers and post apply baked at 205° C. for 90 seconds resulting in 500 nm thick Underlayer films. The silicon containing resist (TIS 2000, a chemically amplified resist available from FUJIFILM Electronic Materials U.S.A., Inc.) is then spin coated over the Underlayer films and baked at 135° C. for 60 seconds to yield 250 nm thick films. The bilayer coated wafers are then patternwise exposed using a Cannon EX6 Stepper (0.65 NA, 5/8 annular with a binary reticle). The wafers are post exposure baked at 125 C.° for 60 seconds and puddle developed for 60 seconds in 0.262 N aqueous TMAH. The wafers are rinsed with DI water and spun dry. The resulting resist patterns are then analyzed by scanning electron microscopy (SEM).

The patterned resist films show good resolution. The sidewalls of 140 nm 1:1 trenches are vertical. No footing or t-topping is observed.

Example 47-55

Photoresist Solvent Resistance Test

Cured Underlayer films were prepared by spin coating 4 inch silicon wafers with Underlayer compositions from Formulation Examples 28-36 at a spin speed of 1000 rpm, drying and curing (cross-linking) the coatings by baking the Underlayer coated wafers on a hotplate for 90 seconds at 205° C.

The thus cross-linked coatings were dipped into propylene glycol monomethyl ether acetate (PGMEA) for 30 seconds and air-dried. On visual inspection, it was confirmed that the resulting coatings were insoluble in PGMEA.

Example 56 and Comparative Example 1-2

W Etch Resistance

The Underlayer composition was coated on a 6-inch silicon wafer utilizing a spin coater, post apply baked 90 seconds on a hotplate to obtain an Underlayer film. The Underlayer film was etched using a W etcher (SF6/N2) by LAM with a Chamber pressure of 5 mTorr, RF Power of 500 W, bias voltage of 50 V, SF6 flow of 70 sccm and N2 flow of 30 sccm. Etch time was 30 seconds. Before and after etch Underlayer film thickness measurements were done using the n&k analyzer. Bulk etch rates were calculated as follows:

$$\frac{UnderlayerThicknessBeforeEtch \text{ [nm]} - UnderlayerThicknessAfterEtch \text{ [nm]}}{Time \text{ [min]}} = EtchRate \left[\frac{nm}{min}\right]$$

Optical parameters were measured as described in General Procedure for Measurement of Optical Constants n and k. Table 5 lists W etch rates and optical parameters for Underlayer film Compositions.

TABLE 5

W Etch rates and n&k Constants

| | Formulation Example | Apply bake Temperature (° C.) | Etch rate (nm/min) | n | K |
|---|---|---|---|---|---|
| Example 56 | 21 | 230 | 165.7 | 1.657 | 0.291 |
| Comparative Example 1 | Comparative 1 | 205 | 165.9 | 1.567 | 0.946 |
| Comparative Example 2 | Comparative 2 | 205 | 154.8 | 1.57 | 0.77 |

Example 56 shows that the Underlayer film prepared from the Underlayer composition of the present disclosure has an excellent etch rate and more optimum optical constants than the comparative examples at k @ 193 nm.

While this disclosure has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:

1. An etch resistant thermally curable Underlayer composition for use in a multiplayer liyhographic process to produce a photolithographic bilayer coated substrate, the composition comprising:
   (a) at least one cycloolefin polymer comprising at least one repeating unit of Structure (I), and at least one repeating unit of Structure (II), and optionally at least one repeating unit of Structure (III) with the proviso that neither Structure (I) nor Structure (II) nor Structure (III) contains acid sensitive groups

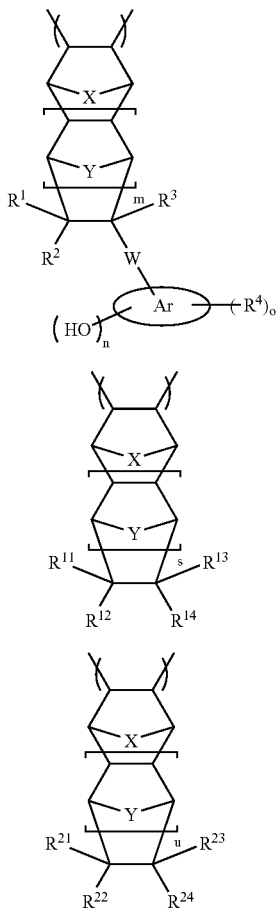

Structure (I)

Structure (II)

Structure (III)

wherein $R^1$, $R^2$ and $R^3$ independently selected from the group consisting of a hydrogen atom, a $C_1$-$C_{10}$ linear, branched or cyclic alkyl group, $C_1$-$C_{10}$ partially or completely halogenated linear, branched or cyclic alkyl group, a $C_6$-$C_{10}$ aryl group, a halogen atom and a polar group; W is selected from the group consisting of a single bond, —O—, —S—, substituted or unsubstituted $C_1$-$C_{10}$ linear or branched alkylene group, substituted or unsubstituted $C_4$-$C_{12}$ cycloalkylene or alicyclic residue, —$(CH_2)_pO$—, —$(CH_2)_pO(CH_2)_q$—, —$(CH_2)_pO(R^5O)_r$—, —$(CH_2)_pC(=O)O$—, —$(CH_2)_pC(=O)O(CH_2)_q$—, —$(CH_2)_pC(=O)O(R^5O)_r$—, —$(CH_2)_pOC(=O)O(CH_2)_p$—, and —$(CH_2)_pNR^6C(=O)$—, wherein $R^5$ is selected from the group consisting of a $C_2$-$C_6$ linear, branched or cyclic alkylene group and are $C_2$-$C_6$ partially or completely halogenated linear, branched or cyclic alkylene group; $R^6$ is selected from the group consisting of a hydrogen atom, a $C_1$-$C_6$ linear, branched or cyclic alkyl group, and a $C_1$-$C_6$ partially or completely halogenated linear, branched or cyclic alkyl group; p is an integer from 0 to about 4; q and r are independently an integer from about 1 to about 4; Ar is selected from the group consisting of a $C_6$-$C_{20}$ arylene group and a B-L-E group, wherein B is a $C_6$-$C_{14}$ arylene group, E is a $C_6$-$C_{14}$ aryl group and L is selected from the group consisting of a single bond, a $C_1$-$C_4$ linear, branched or cyclic alkylene group, a $C_1$-$C_4$ partially or completely halogenated linear, branched or cyclic alkylene group, —S—, —O—, —C(=O)—, —C(=O)O—, —O—C(=O)—O—, —C($R^7R^8$)—, —C(=$CR^9R^{10}$)—, and —$CR^9$=$CR^{10}$—, wherein $R^7$, $R^8$, $R^9$ and $R^{10}$ are independently selected from the group consisting of a hydrogen atom, a halogen, a cyano group, a $C_1$-$C_{10}$ linear, branched or cyclic alkyl group, and a $C_1$-$C_{10}$ partially or completely halogenated linear, branched or cyclic alkyl group; $R^4$ groups are independently selected from the group consisting of $C_1$-$C_6$ linear, branched or cyclic alkyl groups, $C_1$-$C_6$ partially or completely halogenated linear, branched or cyclic alkyl groups, and halogen atoms; n is an integer from about 1 to about 5; o is an integer from 0 to about 6; X and Y are, independently selected from the group consisting of a —$CH_2$— group, —O— and —S—; m is an integer from 0 to about 3; $R^{11}$, $R^{12}$, $R^{13}$ and $R^{14}$ are independently selected from the group consisting of a hydrogen atom, a $C_1$-$C_{10}$ linear, branched or cyclic alkyl group, a $C_1$-$C_{10}$ partially or completely halogenated linear, branched or cyclic alkyl group, a halogen atom, and a polar group selected from the group consisting of —$OR^{15}$, —$R^{16}OR^{15}$, and —$(CH_2)_tOC(O)R^{17}$ with the proviso that at least one of $R^{11}$ to $R^{14}$ is a polar group selected from the group consisting of —$OR^{15}$, —$R^{16}OR^{15}$, and —$(CH_2)_tOC(O)R^{17}$; $R^{15}$ is selected from the group consisting of a hydrogen atom and a linear, branched or cyclic $C_1$-$C_6$ alkyl group, $R^{16}$ is selected from the group consisting of a substituted or unsubstituted $C_1$-$C_6$ linear, branched or cyclic alkylene group and a $C_1$-$C_6$ partially or completely halogenated linear, branched or cyclic alkylene group, $R^{17}$ is selected from the group consisting of a hydrogen atom, a linear, branched or cyclic $C_1$-$C_6$ alkyl group, and a $C_7$-$C_{15}$ alicyclic group; t is an integer from 0 to about 4; s is an integer from 0 to about 3; $R^{21}$, $R^{22}$, $R^{23}$ and $R^{24}$ are independently selected from the group consisting of a hydrogen atom, a $C_1$-$C_{10}$ linear, branched or cyclic alkyl group, a $C_1$-$C_{10}$ partially or completely halogenated linear, branched or cyclic alkyl group, a $C_6$-$C_{10}$ aryl group which does not contain a hydroxyl group, a halogen atom and a polar group selected from the group consisting of —$(CH_2)_vC(O)R^{25}$, —$(CH_2)_vC(O)OR^{25}$, —$(CH_2)_vC(O)(OR^{26})_xOR^{25}$ and —$O(R^{26}O)_xR^{25}$; wherein v is an integer from 0 to about 5; x is an integer from about 1 to about 5; $R^{25}$ is selected from the group consisting of a hydrogen atom, a substituted or unsubstituted $C_1$-$C_6$ linear, branched or cyclic alkyl group, and a $C_1$-$C_6$ partially or completely halogenated linear, branched or cyclic alkyl group; $R^{26}$ is selected from the group consisting of a substituted or unsubstituted $C_2$-$C_6$, linear, branched or cyclic alkylene group and a $C_2$-$C_6$ partially or completely halogenated linear, branched or cyclic alkylene group and u is an integer from 0 to about 3;

b) at least one cross-linking agent selected from the group consisting of an amino and a phenolic cross-linking agent;
c) a least one thermal acid generator (TAG);
d) at least one solvent; and
e) optionally, at least one surfactant.

2. An etch resistant thermally curable Underlayer composition according to claim 1 wherein $R^1$, $R^2$ and $R^3$ are independently selected from the group consisting of hydrogen atoms, halogen atoms and ethyl groups; W is selected from the group consisting of a single bond, and $C_1$-$C_4$ linear, branched or cyclic alkylene group, Ar is a $C_6$-$C_{10}$ arylene group; $R^4$ is independently selected from the group consisting of hydrogen atoms, methyl, tert-butyl and fluorinated $C_1$-$C_2$ alkyl groups; Ar is selected from the group consisting of phenyl and naphthyl wherein when Ar is phenyl n is an integer from 1 to 3, o is an integer from 0 to 4 with the proviso that the sum of n and o is no greater than 5 and when Ar is naphthyl n is an integer from 1 to 5, o is an integer from 0 to 6 with the proviso that the sum of n and o is no greater than 7; $R^{11}$, $R^{12}$, $R^{13}$ and $R^{14}$ are independently selected from the group consisting of a hydrogen atom, a $C_1$-$C_2$ linear, branched or cyclic alkyl group, a $C_1$-$C_2$ partially or completely halogenated linear, branched or cyclic alkyl group, a halogen atom, and a polar group selected from the group consisting of —$OR^{15}$, —$R^{16}OR^{15}$, and —$(CH_2)_tOC(O)R^{17}$ with the proviso that at least one of $R^{11}$ to $R^{14}$ is a polar group selected from the group consisting of —$OR^{15}$, —$R^{16}OR^{15}$, and —$(CH_2)_tOC(O)R^{17}$; $R^{15}$ is selected from the group consisting of a hydrogen atom, a methyl and an ethyl group; $R^{16}$ is selected from the group consisting of a substituted or unsubstituted $C_1$-$C_4$ linear, branched or cyclic alkylene group; $R^{17}$ is selected from the group consisting of a hydrogen atom, a linear, branched or cyclic $C_1$-$C_3$ alkyl group; t is an integer from 0 to about 2; s is an integer from 0 to about 3; $R^{21}$, $R^{22}$, $R^{23}$ and $R^{24}$ are independently selected from the group consisting of a hydrogen atom, a $C_1$-$C_2$ linear, branched or cyclic alkyl group, a $C_1$-$C_2$ halogenated linear, branched or cyclic alkyl group, a halogen atom and a polar group selected from the group consisting of —$(CH_2)_vC(O)R^{25}$, —$(CH_2)_vC(O)OR^{25}$, —$(CH_2)_vC(O)(OR^{26})_xOR^{25}$ and —$O(R^{26}O)_xR^{25}$; wherein v is an integer of 0 or 1; x is an integer of 1; $R^{25}$ is selected from the group consisting of a hydrogen atom, and a $C_1$-$C_4$ linear, branched or cyclic alkyl group; $R^{26}$ is selected from the group consisting of a substituted or unsubstituted $C_2$-$C_4$, linear, branched or cyclic alkylene group.

3. A photolithographic bilayer coated substrate comprising: a substrate, a thermally cured film of the Underlayer composition according to claim 2 coated on the substrate, and a radiation-sensitive chemically amplified resist coated over the thermally cured Underlayer composition.

4. A process for forming a pattern on a substrate which comprises the following process steps:
   (a) providing a substrate;
   (b) coating in a first coating step said substrate with a thermally curable Underlayer composition of claim 2;
   (c) thermally curing said Underlayer composition to provide an Underlayer film;
   (d) coating in a second coating step a radiation sensitive resist over the Underlayer film to produce a bilayer resist stack;
   (e) baking the radiation sensitive resist in a second baking step;
   (f) exposing the bilayer resist stack;
   (g) developing a portion of the radiation sensitive resist of the bilayer resist stack and uncovering a portion of the underlying Underlayer film;
   (h) rinsing the bilayer resist stack; and
   (i) etching the uncovered Underlayer film in oxidizing plasma to produce a bilayer relief image.

5. An etch resistant thermally curable Underlayer composition according to claim 1 wherein $R^1$, $R^2$ and $R^3$ are hydrogen atoms; W is selected from the group consisting of single bond and methylene; $R^4$ is hydrogen atoms; Ar is selected from the group consisting of phenyl and naphthyl wherein when Ar is phenyl n is an integer of 1, o is an integer of 0 and when Ar is naphthyl n is an integer of 1, o is an integer of 0; m is an integer of 0; $R^{11}$, $R^{12}$, $R^{13}$ and $R^{14}$ are independently selected from the group consisting of a hydrogen atom, a methyl group and a polar group selected from the group consisting of —$OR^{15}$, —$R^{16}OR^{15}$, and —$(CH_2)_tOC(O)R^{17}$ with the proviso that at least one of $R^{11}$ to $R^{14}$ is a polar group selected from the group consisting of —$OR^{15}$, —$R^{16}OR^{15}$, and —$(CH_2)_tOC(O)R^{17}$; wherein $R^{15}$ is a hydrogen atom; $R^{16}$ is selected from the group consisting of a methylene or ethylene group; $R^{17}$ is a methyl group; t is an integer of 0 or 1; $R^{21}$, $R^{22}$, $R^{23}$ and $R^{24}$ are independently selected from the group consisting of a hydrogen atom, a methyl group and a polar group selected from the group consisting of —$(CH_2)_vC(O)R^{25}$, —$(CH_2)_vC(O)OR^{25}$, —$(CH_2)_vC(O)(OR^{26})_xOR^{25}$ and —$O(R^{26}O)_xR^{25}$; wherein v is an integer of 0 or 1; x is an integer of 1; $R^{25}$ is a hydrogen atom; $R^{26}$ is selected from the group consisting of ethylene and isopropylene.

6. A photolithographic bilayer coated substrate comprising: a substrate, a thermally cured film of the Underlayer composition according to claim 5 coated on the substrate, and a radiation-sensitive chemically amplified resist coated over the thermally cured Underlayer composition.

7. A process for forming a pattern on a substrate which comprises the following process steps:
   (a) providing a substrate;
   (b) coating in a first coating step said substrate with a thermally curable Underlayer composition of claim 5;
   (c) thermally curing said Underlayer composition to provide an Underlayer film;
   (d) coating in a second coating step a radiation sensitive resist over the Underlayer film to produce a bilayer resist stack;
   (e) baking the radiation sensitive resist in a second baking step;
   (f) exposing the bilayer resist stack;
   (g) developing a portion of the radiation sensitive resist of the bilayer resist stack and uncovering a portion of the underlying Underlayer film;
   (h) rinsing the bilayer resist stack; and
   (i) etching the uncovered Underlayer film in oxidizing plasma to produce a bilayer relief image.

8. An etch resistant thermally curable Underlayer composition according to claim 1 wherein $Ar(OH)_n(R^4)_o$ is selected from the group consisting of:

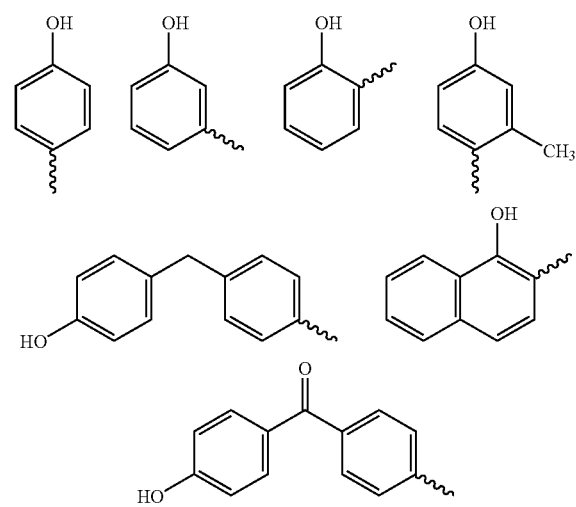

-continued

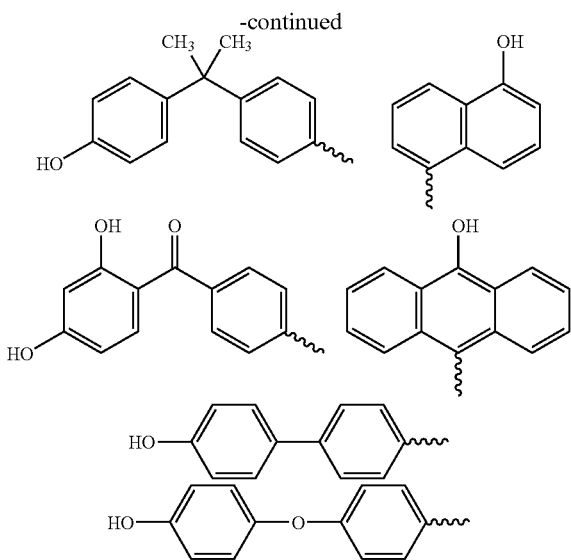

wherein ⌇⌇⌇ indicates the bond between $Ar(OH)_n(R^4)_o$ and W or the polymer backbone.

9. A photolithographic bilayer coated substrate comprising: a substrate, a thermally cured film of the Underlayer composition according to claim 8 coated on the substrate, and a radiation-sensitive chemically amplified resist coated over the thermally cured Underlayer composition.

10. A process for forming a pattern on a substrate which comprises the following process steps:
   (a) providing a substrate;
   (b) coating in a first coating step said substrate with a thermally curable Underlayer composition of claim 8;
   (c) thermally curing said Underlayer composition to provide an Underlayer film;
   (d) coating in a second coating step a radiation sensitive resist over the Underlayer film to produce a bilayer resist stack;
   (e) baking the radiation sensitive resist in a second baking step;
   (f) exposing the bilayer resist stack;
   (g) developing a portion of the radiation sensitive resist of the bilayer resist stack and uncovering a portion of the underlying Underlayer film;
   (h) rinsing the bilayer resist stack; and
   (i) etching the uncovered Underlayer film in oxidizing plasma to produce a bilayer relief image.

11. An etch resistant thermally curable Underlayer composition according to claim 1 wherein repeating unit of Structure (I) is a monomeric unit from 4'-bicyclo[2.2.1]hept-5-en-2-ylphenol; the repeating unit of Structure (II) is a monomeric unit selected from the group consisting of 5-norbornene-2-methanol, 5-norbornene-2-methyl acetate, tetracyclo[4.4.0.1$^{2,5}$.1$^{7,10}$]dodec-3-en-8-yl acetate, tetracyclo[4.4.0.1$^{2,5}$.1$^{7,10}$]dodec-3-en-8-ol; the repeating unit of Structure (III) is a monomeric unit selected from the group consisting of tetracyclo[4.4.0.1$^{2,5}$.1$^{7,10}$]dodec-8ene, 2'-hydroxyethyl 5-norbornene-2-carboxylate, and 2'-(5-norbornene-2-methoxy)ethanol.

12. A photolithographic bilayer coated substrate comprising: a substrate, a thermally cured film of the Underlayer composition according to claim 11 coated on the substrate, and a radiation-sensitive chemically amplified resist coated over the thermally cured Underlayer composition.

13. A process for forming a pattern on a substrate which comprises the following process steps:
   (a) providing a substrate;
   (b) coating in a first coating step said substrate with a thermally curable Underlayer composition of claim 11;
   (c) thermally curing said Underlayer composition to provide an Underlayer film;
   (d) coating in a second coating step a radiation sensitive resist over the Underlayer film to produce a bilayer resist stack;
   (e) baking the radiation sensitive resist in a second baking step;
   (f) exposing the bilayer resist stack;
   (g) developing a portion of the radiation sensitive resist of the bilayer resist stack and uncovering a portion of the underlying Underlayer film;
   (h) rinsing the bilayer resist stack; and
   (i) etching the uncovered Underlayer film in oxidizing plasma to produce a bilayer relief image.

14. An etch resistant thermally curable Underlayer composition according to claim 1 wherein the cycloolefin polymer is a polymer of repeating units from bicyclo[2.2.1]hept-5-en-2-ylphenol and, tetracyclo[4.4.0.1$^{2,5}$.1$^{7,10}$]dodec-3-en-8ol.

15. A photolithographic bilayer coated substrate comprising: a substrate, a thermally cured film of the Underlayer composition according to claim 14 coated on the substrate, and a radiation-sensitive chemically amplified resist coated over the thermally cured Underlayer composition.

16. A process for forming a pattern on a substrate which comprises the following process steps:
   (a) providing a substrate;
   (b) coating in a first coating step said substrate with a thermally curable Underlayer composition of claim 14;
   (c) thermally curing said Underlayer composition to provide an Underlayer film;
   (d) coating in a second coating step a radiation sensitive resist over the Underlayer film to produce a bilayer resist stack;
   (e) baking the radiation sensitive resist in a second baking step;
   (f) exposing the bilayer resist stack;
   (g) developing a portion of the radiation sensitive resist of the bilayer resist stack and uncovering a portion of the underlying Underlayer film;
   (h) rinsing the bilayer resist stack; and
   (i) etching the uncovered Underlayer film in oxidizing plasma to produce a bilayer relief image.

17. A photolithographic bilayer coated substrate comprising: a substrate, a thermally cured film of the Underlayer composition according to claim 1 coated on the substrate, and a radiation-sensitive chemically amplified resist coated over the thermally cured Underlayer composition.

18. A process for forming a pattern on a substrate which comprises the following process steps:
   (a) providing a substrate;
   (b) coating in a first coating step said substrate with a thermally curable Underlayer composition of claim 1;
   (c) thermally curing said Underlayer composition to provide an Underlayer film;
   (d) coating in a second coating step a radiation sensitive resist over the Underlayer film to produce a bilayer resist stack;
   (e) baking the radiation sensitive resist in a second baking step;
   (f) exposing the bilayer resist stack;

(g) developing a portion of the radiation sensitive resist of the bilayer resist stack and uncovering a portion of the underlying Underlayer film;

(h) rinsing the bilayer resist stack; and (i) etching the uncovered Underlayer film in oxidizing plasma to produce a bilayer relief image.

* * * * *